(12) United States Patent
Shinomiya et al.

(10) Patent No.: US 9,890,233 B2
(45) Date of Patent: Feb. 13, 2018

(54) RESIST COMPOSITION, METHOD OF FORMING RESIST PATTERN, AND POLYMERIC COMPOUND

(71) Applicant: Tokyo Ohka Kogyo Co., Ltd., Kawasaki-shi (JP)

(72) Inventors: Miki Shinomiya, Kawasaki (JP); Tomoyuki Hirano, Kawasaki (JP); Kotaro Endo, Kawasaki (JP); Yuta Iwasawa, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/596,532

(22) Filed: Jan. 14, 2015

(65) Prior Publication Data

US 2015/0198880 A1 Jul. 16, 2015

(30) Foreign Application Priority Data

Jan. 16, 2014 (JP) ................. 2014-006140

(51) Int. Cl.
| | | |
|---|---|---|
| *G03F 7/039* | (2006.01) | |
| *G03F 7/20* | (2006.01) | |
| *C08F 224/00* | (2006.01) | |
| *C08F 228/06* | (2006.01) | |

(52) U.S. Cl.
CPC .......... *C08F 224/00* (2013.01); *C08F 228/06* (2013.01); *G03F 7/0397* (2013.01); *G03F 7/2041* (2013.01)

(58) Field of Classification Search
None
See application file for complete search history.

(56) References Cited

U.S. PATENT DOCUMENTS

| | | | |
|---|---|---|---|
| 6,949,325 B2 | 9/2005 | Li et al. | |
| 8,182,976 B2* | 5/2012 | Dazai ................. | C08F 28/06 430/270.1 |
| 8,227,170 B2* | 7/2012 | Dazai ................. | C07D 327/04 430/270.1 |
| 8,232,041 B2* | 7/2012 | Dazai ................. | C08F 28/06 430/270.1 |
| 8,841,060 B2 | 9/2014 | Kataoka et al. | |
| 8,900,789 B2 | 12/2014 | Saegusa et al. | |
| 9,122,151 B2 | 9/2015 | Fujii et al. | |
| 2001/0049073 A1 | 12/2001 | Hada et al. | |
| 2004/0110085 A1 | 6/2004 | Iwai et al. | |
| 2006/0204890 A1 | 9/2006 | Kodama | |
| 2009/0197204 A1 | 8/2009 | Shiono et al. | |
| 2009/0317743 A1 | 12/2009 | Shiono et al. | |
| 2010/0015554 A1 | 1/2010 | Saegusa et al. | |
| 2010/0081086 A1* | 4/2010 | Hirano ................ | C08F 220/26 430/270.1 |
| 2010/0310985 A1 | 12/2010 | Mori et al. | |
| 2011/0117499 A1 | 5/2011 | Matsumiya et al. | |
| 2012/0135347 A1 | 5/2012 | Utsumi et al. | |
| 2012/0149916 A1 | 6/2012 | Utsumi et al. | |
| 2012/0219891 A1 | 8/2012 | Fujii et al. | |
| 2012/0237875 A1* | 9/2012 | Asano .................. | C08F 20/22 430/283.1 |
| 2012/0264052 A1* | 10/2012 | Irie ...................... | C08F 224/00 430/270.1 |
| 2013/0004740 A1 | 1/2013 | Kataoka et al. | |

FOREIGN PATENT DOCUMENTS

| | | |
|---|---|---|
| JP | A-2000-206694 | 7/2000 |
| JP | A-2003-241385 | 8/2003 |
| JP | A-2005-336452 | 12/2005 |
| JP | A-2006-259582 | 9/2006 |
| JP | A-2006-285228 | 10/2006 |
| JP | A-2006-317803 | 11/2006 |
| JP | A-2008-083370 | 4/2008 |
| JP | A-2009-025723 | 2/2009 |
| JP | A-2010-002870 | 1/2010 |

(Continued)

OTHER PUBLICATIONS

Office Action in Japanese Patent Application No. 2014-006140, dated Aug. 8, 2017.

*Primary Examiner* — Martin Angebranndt
(74) *Attorney, Agent, or Firm* — Knobbe Martens Olson & Bear LLP

(57) ABSTRACT

A polymeric compound including a structural unit (a0) represented by general formula (a0-1) shown below and a polycyclic group-containing structural unit (a2m) other than the structural unit (a0), the structural unit (a2m) containing a lactone-containing polycyclic group, a —SO₂-containing polycyclic group or a carbonate-containing polycyclic group, and a resist composition including the same:

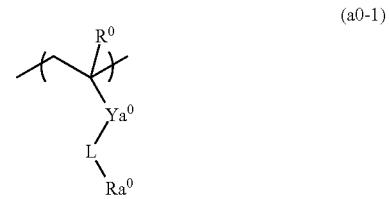

(a0-1)

wherein $R^0$ represents a hydrocarbon group of 1 to 6 carbon atoms which may have a substituent, or a hydrogen atom; $Ya^0$ represents a single bond or a divalent linking group; L represents an ester bond; and $Ra^0$ represents a polycyclic group having a bridged ring polycyclic skeleton or a condensed ring polycyclic skeleton, which has in its skeleton —C(=O)O— or —SO₂—, and at least one of an alkyl group, an alkoxy group, a halogen atom and a halogenated alkyl group.

5 Claims, No Drawings

(56) References Cited

FOREIGN PATENT DOCUMENTS

| | | | |
|---|---|---|---|
| JP | A-2010-032994 | | 2/2010 |
| JP | A-2010-044358 | | 2/2010 |
| JP | A-2010-277043 | | 12/2010 |
| JP | A-2011-013569 | | 1/2011 |
| JP | A-2011-128226 | | 6/2011 |
| JP | A-2012-118255 | | 6/2012 |
| JP | 2012-173418 | * | 9/2012 |
| JP | A-2012-181269 | | 9/2012 |
| JP | A-2013-015596 | | 1/2013 |
| JP | 2013-145255 | * | 7/2013 |

* cited by examiner

RESIST COMPOSITION, METHOD OF FORMING RESIST PATTERN, AND POLYMERIC COMPOUND

TECHNICAL FIELD

The present invention relates to a resist composition, a method of forming a resist pattern, and a polymeric compound.

Priority is claimed on Japanese Patent Application No. 2014-006140, filed Jan. 16, 2014, the content of which is incorporated herein by reference.

DESCRIPTION OF RELATED ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed using a lithography method or a nanoimprint method or the like. In lithography techniques, for example, a resist film composed of a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution. Alternatively, a solvent containing an organic solvent (organic developing solution) such as an aromatic organic solvent, an aliphatic hydrocarbon organic solvent, an ether organic solvent, a ketone organic solvent, an ester organic solvent, an amide organic solvent or an alcohol organic solvent is used as the developing solution.

In recent years, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, it is required to improve various lithography properties of the resist material, such as the sensitivity to the exposure light source and a resolution capable of reproducing patterns of minute dimensions. As resist materials which satisfy such requirements, chemically amplified resists are known.

As a chemically amplified composition, a composition including a base material component that exhibits a changed solubility in a developing solution under action of acid and an acid-generator component that generates acid upon exposure is generally used. For example, in the case where an alkali developing solution is used as a developing solution (alkali developing process), a base component which exhibits increased solubility in an alkali developing solution under action of acid is used.

Conventionally, a resin (base resin) is typically used as the base component of a chemically amplified resist composition. Resins that contain structural units derived from (meth) acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin for a chemically amplified resist composition contains a plurality of kinds of structural units for improving lithography properties and the like. For example, a structural unit having a lactone structure and a structural unit having a polar group such as a hydroxyl group are used, as well as a structural unit having an acid decomposable group which is decomposed by the action of an acid generated from the acid generator to form an alkali soluble group (for example, see Patent Document 1). When the base resin is an acrylic resin, as the acid decomposable group, in general, resins in which the carboxy group of (meth)acrylic acid or the like is protected with an acid dissociable group such as a tertiary alkyl group or an acetal group are used.

The positive tone process using a combination of a positive chemically amplified resist composition (i.e., a chemically amplified resist composition which exhibits increased solubility in an alkali developing solution upon exposure) and an alkali developing solution is advantageous over a negative tone development process in which a negative type, chemically amplified resist composition is used in combination with an alkali developing solution in that the structure of the photomask can be simplified, and the characteristics of the formed resist pattern are excellent. For these reasons, currently, positive-tone development process using a combination of a positive chemically amplified resist composition and an alkali developing solution is mainly employed in the formation of an extremely fine pattern.

In the case where a positive-tone development process is applied, when a resist film obtained by coating the positive chemically amplified resist composition on a substrate is selectively exposed, the acid decomposable groups in the base resin is decomposed by the action of acid generated from the acid generator and the like, such that the exposed portions change from an insoluble state to a soluble state in an alkali developing solution. On the other hand, the unexposed portions remain insoluble in an alkali developing solution. Therefore, by developing with an alkali developing solution, a dissolution contrast can be obtained between the exposed portions and the unexposed portions, and a positive resist pattern can be formed.

In the formation of an extremely fine pattern, a method in which regions where the optical strength becomes weak are selectively dissolved away to form a resist pattern (negative resist pattern) is useful. As a method of forming a negative resist pattern, a method is known in which a chemically amplified resist composition used in a positive-tone developing process (which is the mainstream) and a developing solution containing an organic solvent (organic developing solution) are used in combination.

Conventionally, for improving the lithography properties, for example, there has been proposed a chemically amplified resist composition using, as a base resin, a polymeric compound having a camphor lactone structure introduced at a side chain thereof (see Patent Document 2).

DOCUMENTS OF RELATED ART

Patent Literature

[Patent Document 1] Japanese Unexamined Patent Application, First Publication No. 2003-241385
[Patent Document 2] Japanese Unexamined Patent Application, First Publication No. 2012-118255

SUMMARY OF THE INVENTION

Due to further improvement in the performance and downsize of electronic devices, in the pattern formation in the production of semiconductor devices, further improvement in the lithography properties and the resist pattern shape are demanded. There was still room for improvement in the shape of a resist pattern formed by using a conventional resist composition, and there are demands for further improvement in resolution capable of reproducing patterns of more minute dimensions, lithography properties and the like.

The present invention takes the above circumstances into consideration, with an object of further improving the shape of a resist pattern.

For solving the above-mentioned problems, the present invention employs the following aspects.

Specifically, a first aspect of the present invention is a resist composition which generates acid upon exposure and exhibits changed solubility in a developing solution under action of acid, and which includes a base component (A) which exhibits changed solubility in a developing solution under action of acid, the base component (A) including a polymeric compound (A1) having a structural unit (a0) represented by general formula (a0-1) shown below and a polycyclic group-containing structural unit (a2m) other than the structural unit (a0), the structural unit (a2m) containing a lactone-containing polycyclic group, —SO$_2$-containing polycyclic group or a carbonate-containing polycyclic group.

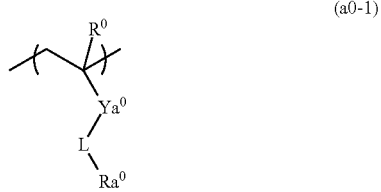

(a0-1)

wherein R$^0$ represents a hydrocarbon group of 1 to 6 carbon atoms which may have a substituent, or a hydrogen atom; Ya$^0$ represents a single bond or a divalent linking group; L represents an ester bond; and Ra$^0$ represents a polycyclic group having a bridged ring polycyclic skeleton or a condensed ring polycyclic skeleton, which has in its skeleton —C(=O)O— or —SO$_2$—, and at least one substituent selected from the group consisting of an alkyl group, an alkoxy group, a halogen atom and a halogenated alkyl group.

A second aspect of the present invention is a method of forming a resist pattern, including: forming a resist film on a substrate using a resist composition according to the first aspect, subjecting the resist film to exposure, and subjecting the resist film to developing to form a resist pattern.

A third aspect of the present invention is a polymeric compound, comprising a structural unit (a0) represented by general formula (a0-1) shown below and a polycyclic group-containing structural unit (a2m) other than the structural unit (a0), the structural unit (a2m) containing a lactone-containing polycyclic group, a —SO$_2$—containing polycyclic group or a carbonate-containing polycyclic group:

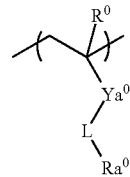

(a0-1)

wherein R$^0$ represents a hydrocarbon group of 1 to 6 carbon atoms which may have a substituent, or a hydrogen atom; Ya$^0$ represents a single bond or a divalent linking group; L represents an ester bond; and Ra$^0$ represents a polycyclic group having a bridged ring polycyclic skeleton or a condensed ring polycyclic skeleton, which has in its skeleton —C(=O)O— or —SO$_2$—, and at least one substituent selected from the group consisting of an alkyl group, an alkoxy group, a halogen atom and a halogenated alkyl group.

According to the resist composition and method of forming the resist pattern of the present invention, a resist pattern with an excellent shape can be formed.

The polymeric compound of the present invention is useful as a resin for the aforementioned resist composition capable of forming a resist pattern with an excellent shape.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

The expression "may have a substituent" means a case where a hydrogen atom (—H) is substituted with a monovalent group, or a case where a methylene (—$CH_2$—) group is substituted with a divalent group.

The term "exposure" is used as a general concept that includes irradiation with any form of radiation.

A "structural unit derived from an acrylate ester" refers to a structural unit that is formed by the cleavage of the ethylenic double bond of an acrylate ester. An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent ($R^{\alpha 0}$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, the acrylate ester also include an itaconic acid diester in which the substituent ($R^{\alpha 0}$) has been substituted with a substituent containing an ester bond, or an α-hydroxyalkyl acrylate ester in which the substituent ($R^{\alpha 0}$) has been substituted with a hydroxyalkyl group or a group in which the hydroxyl group within a hydroxyalkyl group has been modified. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylaminde" refers to a structural unit that is formed by the cleavage of the ethylenic double bond of acrylaminde.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

As the substituent which substitutes the hydrogen atom on the α-position of acrylamide, the same substituents as those described above for the substituent ($R^{\alpha 0}$) on the α-position of the aforementioned α-substituted acrylate ester can be mentioned.

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxyl group has been substituted with an organic group and may have the hydrogen atom on the α-position substituted with a substituent; and hydroxystyrene which has a substituent other than a hydroxyl group bonded to the benzene ring and may have the hydrogen atom on the α-position substituted with a substituent. Here, the α-position (carbon atom on the α-position) of hydroxystyrene refers to the carbon atom having the benzene ring bonded thereto, unless specified otherwise.

As the substituent which substitutes the hydrogen atom on the α-position of hydroxystyrene, the same substituents as those described above for the substituent ($R^{\alpha 0}$) on the α-position of the aforementioned α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxyl group and a carboxy group bonded to the benzene ring and may have the hydrogen atom on the α-position substituted with a substituent. Here, the α-position (carbon atom on the α-position) of vinylbenzoic acid refers to the carbon atom in the vinyl group to which the benzene ring is bonded, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as a substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group of as a substituent on the α-position" are substituted with a hydroxyl group. The number of hydroxyl groups within the hydroxyalkyl group is preferably 1 to 5, and most preferably 1.

<<Resist Composition>>

The resist composition according to a first aspect of the present invention is a resist composition which generates acid upon exposure and exhibits changed solubility in a developing solution under action of acid, and which includes a base component (A) which exhibits changed solubility in a developing solution under action of acid (hereafter, also referred to as "component (A)").

When a resist film is formed using the resist composition and the formed resist film is subjected to a selective exposure, acid is generated at exposed portions of the resist film, and the generated acid acts on the component (A) to change the solubility of the component (A) in a developing solution, whereas the solubility of the component (A) in a developing solution is not changed at unexposed portions of the resist film, thereby generating difference in solubility in a developing solution between exposed portions and unexposed portions. Therefore, by subjecting the resist film to development, the exposed portions are dissolved away to form a positive resist pattern in the case of a positive resist, whereas the unexposed portions are dissolved away to form a negative resist pattern in the case of a negative resist.

In the present specification, a resist composition which forms a positive resist pattern by dissolving away the exposed portions is called a positive resist composition, and a resist composition which forms a negative resist pattern by dissolving away the unexposed portions is called a negative resist composition.

The resist composition of the present invention may be either a positive resist composition or a negative resist composition.

Further, in the formation of a resist pattern, the resist composition of the present invention can be applied to an alkali developing process using an alkali developing solution in the developing treatment, or a solvent developing process using a developing solution containing an organic solvent (organic developing solution) in the developing treatment.

The resist composition of the present embodiment has a function of generating acid upon exposure, and in the resist composition, the component (A) may generate acid upon exposure, or an additive component other than the component (A) may generate acid upon exposure.

Specifically, the resist composition of the present embodiment may be (1) a resist composition (1) containing an acid generator component (B) which generates acid upon exposure (hereafter, referred to as "component (B)";
(2) a resist composition (2) in which the component (A) is a component which generates acid upon exposure; or
(3) a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used. In the present embodiment, it is particularly desirable that the resist composition is the aforementioned resist composition (1).

<Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" or a "polymeric compound" refers to a polymer having a molecular weight of 1,000 or more.

As the molecular weight of the polymer, the weight average molecular weight in terms of the polystyrene equivalent value determined by gel permeation chromatography (GPC) is used.

When the resist composition of the present invention is a "negative resist composition for alkali developing process" that forms a negative resist pattern in an alkali developing process (or a "positive resist composition for solvent developing process" that forms a positive resist pattern in a solvent developing process), as the component (A), a base component (A-2) that is soluble in an alkali developing solution (hereafter, this base component is sometimes referred to as "component (A-2)") is preferably used, and a cross-linking component is further added. In such a resist composition, when acid is generated from the component (B) upon exposure, the action of the acid causes cross-linking between the component (A-2) and the cross-linking component. As a result, the solubility of the resist composition in an alkali developing solution is decreased (the solubility of the resist composition in an organic developing solution is increased). Therefore, in the formation of a resist pattern, by conducting selective exposure of a resist film formed by applying the resist composition to a substrate, the exposed portions become insoluble in an alkali developing solution (soluble in an organic developing solution), whereas the unexposed portions remain soluble in an alkali developing solution (insoluble in an organic developing solution), and hence, a negative resist pattern is formed by conducting development using an alkali developing solution. Alternatively, in such a case, by developing using an organic developing solution, a positive resist pattern is formed.

As the component (A-2), it is preferred to use a resin that is soluble in an alkali developing solution (hereafter, referred to as "alkali-soluble resin") is used.

Examples of the alkali soluble resin include a resin having a structural unit derived from at least one of α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; an acrylic resin which has a sulfonamide group and may have the hydrogen atom bonded to the carbon atom on the α-position substituted with a substituent or polycycloolefin resin having a sulfone amide group, as disclosed in U.S. Pat. No. 6,949,325; an acrylic resin which may have the hydrogen atom bonded to the carbon atom on the α-position substituted with a substituent and having a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycyclolefin resin having a fluorinated alcohol, as disclosed in Japanese Unexamined Patent Application, First Publication No. 2006-259582. These resins are preferable in that a resist pattern can be formed with minimal swelling.

Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group, or a melamine-based cross-linking agent is preferable, as it enables formation of a resist pattern with minimal swelling. The amount of the cross-linking agent added is preferably within a range from 1 to 50 parts by weight, relative to 100 parts by weight of the alkali-soluble resin.

In the case where the resist composition of the present invention is a resist composition which forms a positive pattern in an alkali developing process (i.e, a positive resist composition for alkali developing process) or a resist composition which forms a negative pattern in a solvent developing process (i.e., a negative resist composition for solvent developing process), as a component (A), it is preferable to use a base component (A-1) (hereafter, referred to as "component (A-1)") which exhibits increased polarity by the action of acid. By using the component (A-1), since the polarity of the base component changes prior to and after exposure, an excellent development contrast can be obtained not only in an alkali developing process, but also in a solvent developing process.

More specifically, in the case of applying an alkali developing process, the component (A-1) is substantially insoluble in an alkali developing solution prior to exposure, but when acid is generated from the component (B) upon exposure, the action of this acid causes an increase in the polarity of the component (A-1), thereby increasing the solubility of the component (A-1) in an alkali developing solution. Therefore, in the formation of a resist pattern, by conducting selective exposure of a resist film formed by applying the resist composition to a substrate, the exposed portions change from an insoluble state to a soluble state in an alkali developing solution, whereas the unexposed portions remain insoluble in an alkali developing solution, and hence, a positive resist pattern can be formed by alkali developing.

On the other hand, in the case of a solvent developing process, the component (A-1) exhibits high solubility in an organic developing solution prior to exposure, and when acid is generated upon exposure, the polarity of the component (A-1) is increased by the action of the generated acid, thereby decreasing the solubility of the component (A-1) in an organic developing solution. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

The component (A) used in the resist composition of the present embodiment contains a polymeric compound (A1) (hereinafter, referred to as component (A1)) including a structural unit (a0) represented by general formula (a0-1) and a polycyclic group-containing structural unit (a2m) other than the structural unit (a0), the structural unit (a2m) containing a lactone-containing polycyclic group, —$SO_2$-containing polycyclic group or a carbonate-containing polycyclic group.

As the component (A), at least the component (A1) is used, and another polymeric compound and/or a low molecular weight compound may be used in combination with the component (A1).

In the resist composition of the present embodiment, the component (A) is preferably a component (A-1). That is, the resist composition of the present embodiment is preferably a resist composition which forms a positive pattern in an alkali developing process (i.e, a positive resist composition for alkali developing process) or a resist composition which forms a negative pattern in a solvent developing process (i.e., a negative resist composition for solvent developing process). When the component (A-1) is used as the component (A), the component (A-1) includes the component (A1).

[Component (A1)]

The component (A1) comprises a structural unit (a0) represented by general formula (a0-1) and a polycyclic group-containing structural unit (a2m) other than the structural unit (a0), the structural unit (a2m) containing a lactone-containing polycyclic group, —$SO_2$-containing polycyclic group or a carbonate-containing polycyclic group.

(Structural Unit (a0))

The structural unit (a0) is represented by general formula (a0-1) shown below.

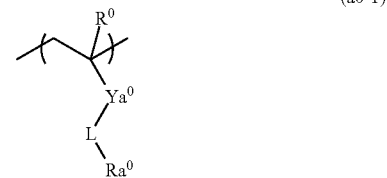

wherein $R^0$ represents a hydrocarbon group of 1 to 6 carbon atoms which may have a substituent, or a hydrogen atom; $Ya^0$ represents a single bond or a divalent linking group; L represents an ester bond; and $Ra^0$ represents a polycyclic group having a bridged ring polycyclic skeleton or a condensed ring polycyclic skeleton, which has in its skeleton —C(=O)O— or —$SO_2$—, and at least one substituent selected from the group consisting of an alkyl group, an alkoxy group, a halogen atom and a halogenated alkyl group.

In general formula (a0-1), $R^0$ represents a hydrocarbon group of 1 to 6 carbon atoms which may have a substituent, or a hydrogen atom.

The hydrocarbon group for $R^0$ may be either an aliphatic hydrocarbon group or an aromatic hydrocarbon group, and is preferably an aliphatic hydrocarbon group. The aliphatic hydrocarbon group for $R^0$ may be either a saturated aliphatic hydrocarbon group or an unsaturated aliphatic hydrocarbon group, and may be chain-like or cyclic. Of the various possibilities, the aliphatic hydrocarbon group for $R^0$ is preferably a saturated aliphatic hydrocarbon group (alkyl group).

As the hydrocarbon group of 1 to 6 carbon atoms for $R^0$, an alkyl group of 1 to 6 carbon atoms is preferable, of which a linear or branched alkyl group is more preferable. Specific examples thereof include a methyl group, an ethyl group, a propyl group, an isopropyl group, an n-butyl group, an isobutyl group, a tert-butyl group, a pentyl group, an isopentyl group, a neopentyl group, a heptyl group, and a n-heptyl group.

The hydrocarbon group of 1 to 6 carbon atoms for $R^0$ may have a substituent. Examples of the substituent include an alkoxy group and a halogen atom, and a halogen atom is particularly desirable. The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and more preferably a methoxy group or an ethoxy group. Examples of halogen atoms include fluorine atoms, chlorine atoms, bromine atoms and iodine atoms, and fluorine atoms are particularly desirable.

Among the above examples of $R^0$, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a0-1), $Ya^0$ represents a single bond or a divalent linking group.

The divalent linking group for $Ya^0$ is not particularly limited, and preferable examples thereof include a divalent hydrocarbon group which may have a substituent and a divalent linking group containing a hetero atom.

Divalent Hydrocarbon Group which may have a Substituent

The hydrocarbon group as a divalent linking group may be either an aliphatic hydrocarbon group or an aromatic hydrocarbon group.

The aliphatic hydrocarbon group as the divalent linking group for $Ya^0$ may be either saturated or unsaturated. In general, the aliphatic hydrocarbon group is preferably saturated. Examples of the aliphatic hydrocarbon group include a linear or branched aliphatic hydrocarbon group, and an aliphatic hydrocarbon group containing a ring in the structure thereof Regarding Linear or Branched Aliphatic Hydrocarbon Group The linear or branched aliphatic hydrocarbon group preferably has 1 to 10 carbon atoms, more preferably 1 to 6 carbon atoms, still more preferably 1 to 4 carbon atoms, and most preferably 1 to 3 carbon atoms. Here, the number of carbon atoms within a substituent(s) is not included in the number of carbon atoms of the aliphatic hydrocarbon group.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and a carbonyl group. The carbonyl group as the substituent is a group that substitutes a methylene group (—$CH_2$—) constituting the linear or branched aliphatic hydrocarbon group.

Regarding Aliphatic Hydrocarbon Group Containing a Ring in the Structure Thereof As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned linear or branched aliphatic hydrocarbon group, and a group in which the alicyclic group is interposed within the aforementioned linear or branched aliphatic hydrocarbon group, can be given. The linear or branched aliphatic hydrocarbon group is the same as defined for the aforementioned linear aliphatic hydrocarbon group or the aforementioned branched aliphatic hydrocarbon group.

The alicyclic hydrocarbon group preferably has 3 to 20 carbon atoms, and more preferably 3 to 12 carbon atoms. Here, the number of carbon atoms within a substituent(s) is not included in the number of carbon atoms of the alicyclic hydrocarbon group.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic aliphatic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The alicyclic hydrocarbon group in the aliphatic hydrocarbon group containing a ring in the structure thereof may or may not have a substituent.

Examples of the substituent include an alkyl group, an alkoxy group, a halogen atom, a halogenated alkyl group, a hydroxyl group and a carbonyl group. The carbonyl group as the substituent is a group that substitutes a methylene group (—$CH_2$—) constituting the alicyclic hydrocarbon group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups have been substituted with the aforementioned halogen atoms.

The alicyclic hydrocarbon group containing a ring in the structure thereof may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

The aromatic hydrocarbon group as the divalent linking group for $Ya^0$ is a hydrocarbon group having an aromatic ring.

The aromatic hydrocarbon group preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings have been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a group formed by removing one hydrogen atom from an aryl moiety of an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2 carbon atoms, and most preferably 1 carbon atom.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and more preferably a methyl group, an ethyl group, a propyl group, an n-butyl group or a tert-butyl group.

As the alkoxy group, the halogen atom and the halogenated alkyl group for the substituent, the same groups as the aforementioned substituent groups for substituting a hydrogen atom within the alicyclic hydrocarbon group can be used.

Divalent Linking Group Containing a Hetero Atom

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^0$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, a group represented by general formula —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m''}$—Y$^{22}$— or —Y$^{21}$—O—C(=O)—Y$^{22}$— [in the formulae, Y$^{21}$ and Y$^{22}$ each independently represents a divalent hydrocarbon group which may have a substituent, and O represents an oxygen atom; and m" represents an integer of 0 to 3.

The divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5. In formulae —Y$^{21}$—O—Y$^{22}$—, —Y$^{21}$—O—, —C(=O)—O—, —C(=O)—O—Y$^{21}$, —[Y$^{21}$—C(=O)—O]$_{m''}$—Y$^{22}$— and —Y$^{21}$—O—C(=O)—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a chain-like aliphatic hydrocarbon group is preferable, more preferably a linear aliphatic hydrocarbon group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m''}$—Y$^{22}$—, m" represents an integer of 0 to 3, preferably an integer of 0 to 2, more preferably 0 or 1, and most preferably 1. Namely, it is particularly desirable that the group represented by the formula —[Y$^{21}$—C(=O)—O]$_{m''}$—Y$^{22}$— is a group represented by the formula —Y$^{21}$—C(=O)—O—Y$^{22}$—. Among these, a group represented by the formula —(CH$_2$) a'-C(=O)—O—(CH$_2$) b'- is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As $Ya^0$, a single bond or a divalent hydrocarbon group which may have a substituent or a divalent linking group containing a hetero atom is preferable, and a divalent linking group containing a hetero atom is more preferable, —C(=O)—O—Y$^{21}$— is particularly desirable.

In general formula (a0-1), L represents an ester bond.

Specific examples of -Yd-L-$Ra^0$ in formula (a0-1) include -$Ya^0$-C(=O)—O—$Ra^0$, -$Ya^0$-O—C(=O)—$Ra^0$, -$Ya^0$-O—S(=O)$_2$—$Ra^0$, and -$Ya^0$-S(=O)$_2$—O—$Ra^0$.

Among these, -$Ya^0$-C(=O)—O—$Ra^0$ and -$Ya^0$-O—C(=O)—$Ra^0$ are preferable, and -$Ya^0$-O—C(=O)—$Ra^0$ is particularly desirable.

In the formula (a0-1), $Ra^0$ represents a polycyclic group having a bridged ring polycyclic skeleton or a condensed ring polycyclic skeleton, which has in its skeleton —C(=O)O— or —SO$_2$—, and at least one substituent selected from the group consisting of an alkyl group, an alkoxy group, a halogen atom and a halogenated alkyl group.

Specific examples include groups in which one or more hydrogen atoms have been removed from a polycycloalkane such as adamantane, norbornane, isobornane, tricyclodecane or tetracyclododecane.

As an example of the polycyclic group having a condensed ring, there can be mentioned a cyclic group having a steroid skeleton.

In the present specification, a "steroid skeleton" refers to a skeleton (st) represented by the chemical formula shown below which has three 6-membered rings and one 5-membered ring bonded.

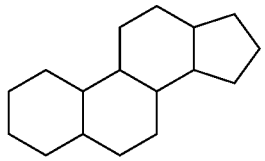

(st)

The alkyl group for the substituent in the polycyclic group for $Ra^0$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear or branched alkoxy group. Specific examples of the alkoxy groups include the alkyl groups having an oxygen atom (—O—) bonded thereto, which is mentioned above as the alkyl group as the substituent.

Examples of the halogen atom for the substituent include a fluorine atom, a chlorine atom, a bromine atom and an iodine atom, and a fluorine atom is preferable.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

As the substituent of the polycyclic group for $Ra^0$, at least one group selected from the group consisting of an alkyl group, an alkoxy group and a halogenated alkyl group is preferable, and an alkyl group is particularly desirable.

The number of the group as the substituent of the polycyclic group for $Ra^0$ which is selected from the group consisting of an alkyl group, an alkoxy group, a halogen atom and a halogenated alkyl group is preferably 1 or more, more preferably 1 to 4, and still more preferably 1 to 3.

More specific examples of $Ra^0$ include groups represented by general formulae (a0-r-1) to (a0-r-7) shown below.

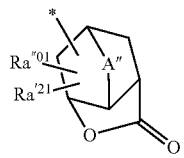
(a0-r-1)

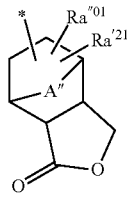
(a0-r-2)

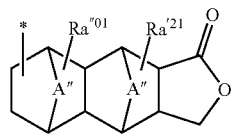
(a0-r-3)

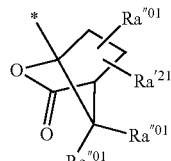
(a0-r-4)

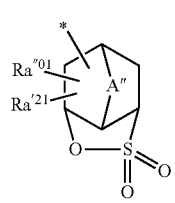
(a0-r-5)

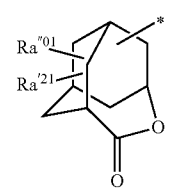
(a0-r-6)

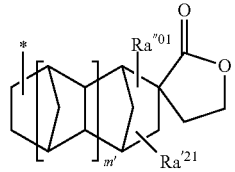
(a0-r-7)

wherein each $Ra''$ independently represents an alkyl group, an alkoxy group, a halogen atom and a halogenated alkyl group; each $Ra'^{21}$ independently represents a hydrogen atom, an alkyl group, an alkoxy group, a halogen atom, a halogenated alkyl group, a hydroxyl group, —COOR$_0$", —OC(=O)R$_0$", a hydroxyalkyl group or a cyano group; R$_0$" represents a hydrogen atom, an alkyl group, a lactone-containing cyclic group, a carbonate-containing cyclic group or a —SO$_2$-containing cyclic group; each A" independently represents an oxygen atom, a sulfur atom, or an alkylene group of 1 to 5 carbon atoms with or without an oxygen atom or a sulfur atom; m' represents 0 or 1; and * each represents a valence bond.

In formulae (a0-r-1) to (a0-r-7), each $Ra'''^{01}$ independently represents an alkyl group, an alkoxy group, a halogen atom and a halogenated alkyl group.

The alkyl group, the alkoxy group, the halogen atom and the halogenated alkyl group for $R'''^{01}$ are the same as defined for the alkyl group, the alkoxy group, the halogen atom and the halogenated alkyl group for $Ra^0$ in the aforementioned formula (a0-1).

The alkyl group for $R'''^{01}$ is preferably an alkyl group of 1 to 6 carbon atoms, more preferably a methyl group or ethyl group, and most preferably a methyl group.

In formulae (a0-r-1) to (a0-r-7), each $Ra'^{21}$ independently represents a hydrogen atom, an alkyl group, an alkoxy group, a halogen atom, a halogenated alkyl group, a hydroxyl group, —COOR$_1$", —OC(=O)R$^{0\prime\prime}$, a hydroxyalkyl group or a cyano group.

The alkyl group, the alkoxy group, the halogen atom and the halogenated alkyl group for $Ra'^{21}$ are the same as defined for the alkyl group, the alkoxy group, the halogen atom and the halogenated alkyl group for $Ra^0$ in the aforementioned formula (a0-1).

With respect to —COOR$_0$" and —OC(=O)R$_0$" for $Ra'^{21}$, $R_0$" represents a hydrogen atom, an alkyl group, a lactone-containing cyclic group, a carbonate-containing cyclic group or an —SO$_2$-containing cyclic group.

The alkyl group for $R_0$" may be linear, branched or cyclic, and preferably has 1 to 15 carbon atoms. When $R_0$" represents a linear or branched alkyl group, it is preferably an alkyl group of 1 to 10 carbon atoms, more preferably an alkyl group of 1 to 5 carbon atoms, and most preferably a methyl group or an ethyl group. When $R_0$" is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. More specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

Examples of the lactone-containing cyclic group for $R_0$" include groups represented by the aforementioned general formulae (a2-r-1) to (a2-r-7).

Examples of the carbonate-containing cyclic group for $R_0$" include the same groups as those represented by the below-mentioned general formulae (ax3-r-1) to (ax3-r-3).

Examples of the —SO$_2$-containing cyclic group for $R_0$" include groups represented by the aforementioned general formulae (a5-r-1) to (a5-r-4).

The hydroxyalkyl group for $Ra'^{21}$ preferably has 1 to 6 carbon atoms, and specific examples thereof include the alkyl groups for $Ra'^{21}$ in which at least one hydrogen atom has been substituted with a hydroxyl group.

In formulae (a0-r-1) to (a0-r-7), each A" independently represents an oxygen atom, a sulfur atom, or an alkylene group of 1 to 5 carbon atoms with or without an oxygen atom or a sulfur atom.

As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—.

As A", an alkylene group of 1 to 5 carbon atoms or —O— is preferable, more preferably an alkylene group of 1 to 5 carbon atoms, and most preferably a methylene group.

Specific examples of the groups represented by the aforementioned general formulae (a0-r-1) to (a0-r-7) are shown below.

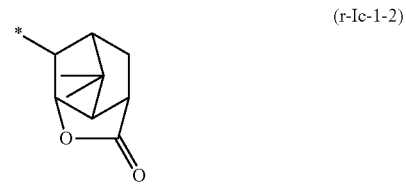

(r-Ic-1-2)

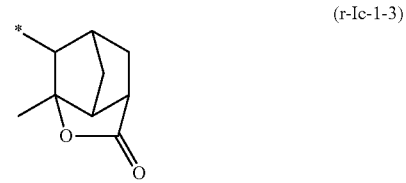

(r-Ic-1-3)

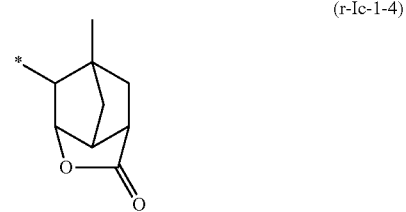

(r-Ic-1-4)

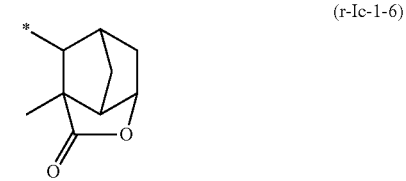

(r-Ic-1-6)

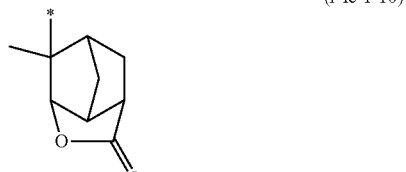

(r-Ic-1-10)

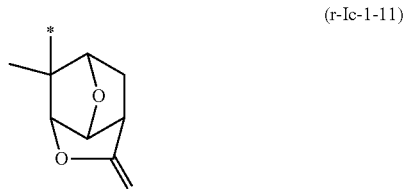

(r-Ic-1-11)

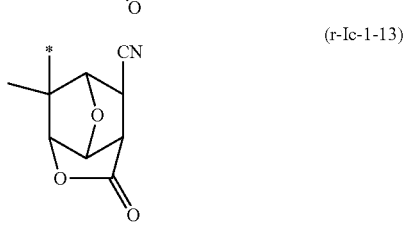

(r-Ic-1-13)

(r-Ic-2-2)
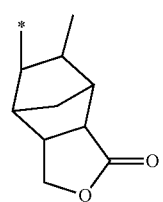
(r-Ic-2-3)
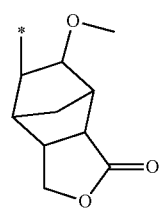
(r-Ic-2-4)
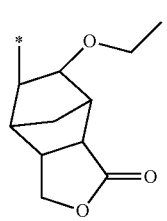
(r-Ic-3-9)
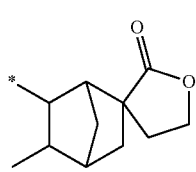
(r-Ic-4-3)
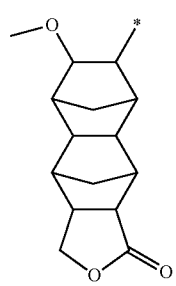
(r-Ic-4-4)
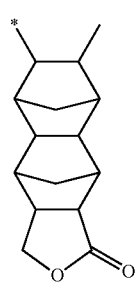
(r-Ic-6-1)
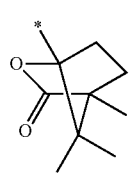
(r-sl-1-2)
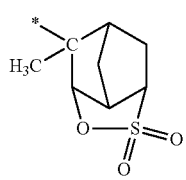
(r-sl-1-3)
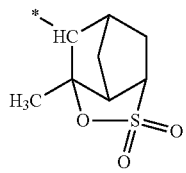
(r-sl-1-4)
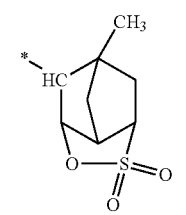
(r-sl-1-5)
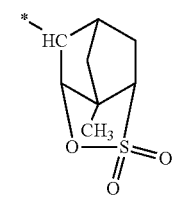
(r-sl-1-6)
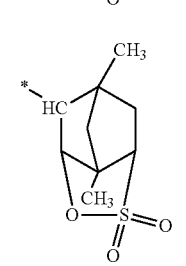
(r-sl-1-9)
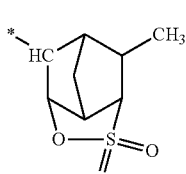
(r-sl-1-11)
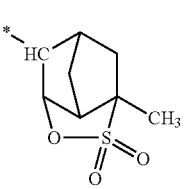
(r-sl-1-15)
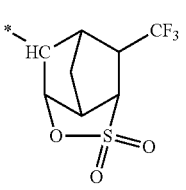

(r-sl-1-16) 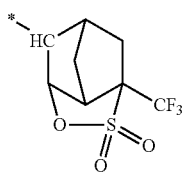

(r-sl-1-17) 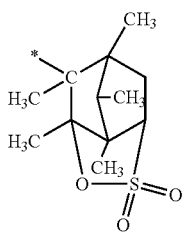

(r-sl-1-19) 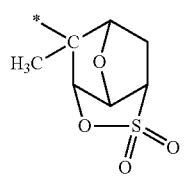

(r-sl-1-20) 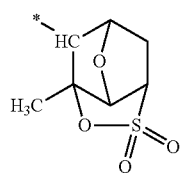

(r-sl-1-21) 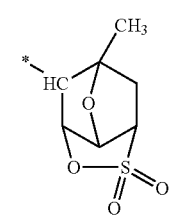

(r-sl-1-22) 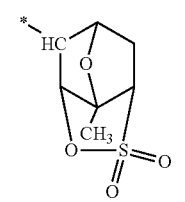

(r-sl-1-23) 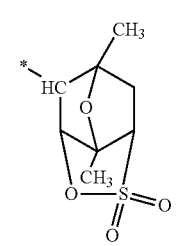

(r-sl-1-26) 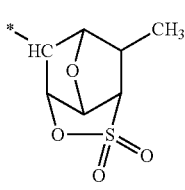

(r-sl-1-28) 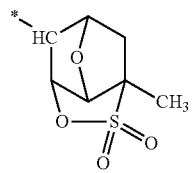

(r-sl-1-32) 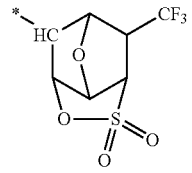

(r-sl-1-33) 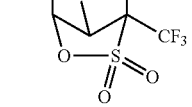

Among the above examples of $Ra^0$, it is preferable to use at least one polycyclic group selected from the group consisting of a polycyclic group represented by general formula (a0-r-1), a polycyclic group represented by general formula (a0-r-2), a polycyclic group represented by general formula (a0-r-3), a polycyclic group represented by general formula (a0-r-4), a polycyclic group represented by general formula (a0-r-5), a polycyclic group represented by general formula (a0-r-6), and a polycyclic group represented by general formula (a0-r-7), of which a polycyclic group represented by general formula (a0-r-4) is more preferred since the difference in solubility of the resist film to the developing solution between the exposed regions and the unexposed regions becomes remarkable, and hence, the lithography properties can be improved. Specific examples of preferable group for $Ra^0$ include a group represented by the aforementioned formula (r-1c-6-1).

Specific examples of structural unit represented by formula (a0-1) are shown below. In the formulas shown below, $R\alpha$ represents a hydrogen atom, a methyl group or a trifluoromethyl group.

As the structural unit (a0) contained in the component (A1), 1 type of structural unit may be used, or 2 or more types may be used.

In the component (A1), the amount of the structural unit (a0) based on the combined total of all structural units constituting the component (A1) is preferably 1 to 50 mol %, more preferably 5 to 40 mol %, and still more preferably 5 to 30 mol %.

When the amount of the structural unit (a0) is at least as large as the lower limit of the above-mentioned range, the dissolution contrast between the exposed portions and the unexposed portions of the resist film becomes large, and various lithography properties such as the level of the in-plane uniformity (CDU) of the holes formed in the resist film are improved. Meanwhile, when the amount of the structural unit (a0) is no more than the upper limit of the above-mentioned range, a good balance can be achieved with the other structural units, and various lithography properties and pattern shape can be improved.

(Structural Unit (a2m))

The structural unit (a2m) is a structural unit other than the structural unit (a0), and contains a lactone-containing polycyclic group, an —$SO_2$-containing polycyclic group or a carbonate-containing polycyclic group.

Preferable examples of the structural unit (a2m) include a structural unit derived from an acrylate ester which may have the hydrogen atom bonded to the carbon atom on the α-position substituted with a substituent and contains a lactone-containing polycyclic group, an —$SO_2$-containing polycyclic group or a carbonate-containing polycyclic group; and a structural unit having a cyclic main chain (hereafter, referred to as "cyclic-main chain structural unit").

A "cyclic-main chain structural unit" refers to a structural unit having a monocyclic or polycyclic ring structure, and at least one carbon atom within the ring structure, preferably two or more carbon atoms within the ring structure constitutes the main chain.

The term "lactone-containing polycyclic group" refers to a polycyclic group including a ring containing a —O—C(=O)— structure (lactone ring). Here, when counting a lactone ring a first ring structure, groups containing other ring structures are described as polycyclic groups regardless of the structure of the other rings.

The lactone-containing polycyclic group for the structural unit (a2m) is not particularly limited, and an arbitrary structural unit may be used. Specific examples include groups represented by general formulae (a2-r-1) to (a2-r-6) shown below.

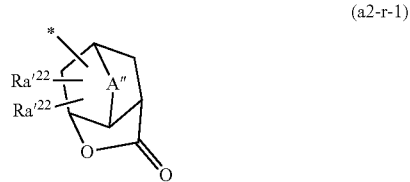

(a2-r-1)

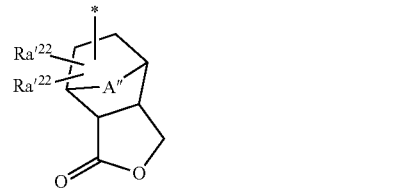

(a2-r-2)

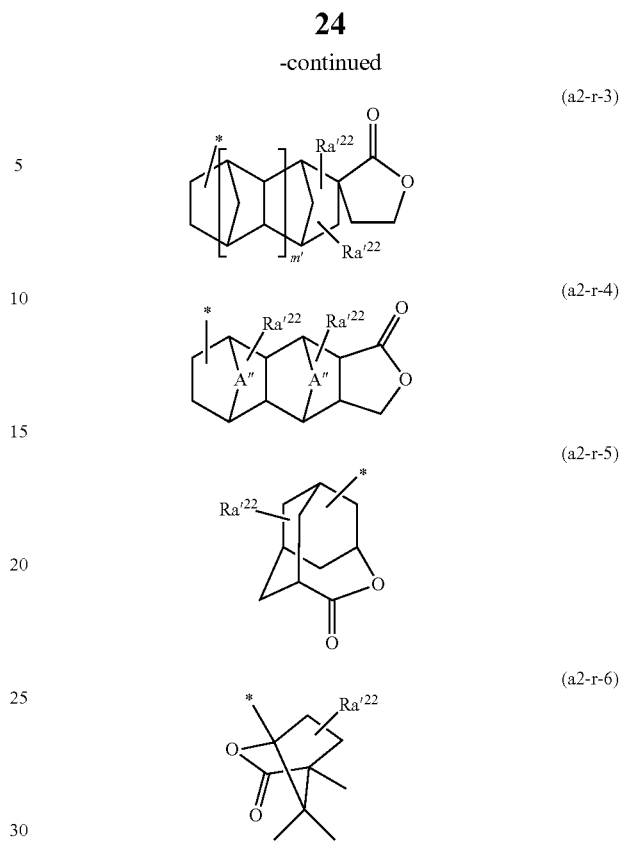

wherein each $Ra'^{22}$ independently represents a hydrogen atom, an alkyl group, an alkoxy group, a halogen atom, a halogenated alkyl group, a hydroxyl group, —$COOR_1$", —$OC(=O)R_1$", a hydroxyalkyl group or a cyano group; $R_1$" represents a hydrogen atom, an alkyl group, a lactone-containing cyclic group, a carbonate-containing cyclic group or a —$SO_2$-containing cyclic group; each A" independently represents an oxygen atom, a sulfur atom, or an alkylene group of 1 to 5 carbon atoms with or without an oxygen atom or a sulfur atom; and m' represents 0 or 1.

In the aforementioned formulae (a2-r-1) to (a2-r-6), the alkyl group, the alkoxy group, the halogen atom and the halogenated alkyl group for $Ra'^{22}$ are the same as defined for the alkyl group, the alkoxy group, the halogen atom and the halogenated alkyl group for $Ra^0$ in the aforementioned formula (a0-1). However, when the structural unit (a2m) is a structural unit derived from an acrylate ester which may have the hydrogen atom bonded to the carbon atom on the α-position substituted with a substituent, $Ra'^{22}$ in each formulae is not an alkyl group, an alkoxy group, a halogen atom nor a halogenated alkyl group.

In the formulae (a2-r-1) to (a2-r-6), $Ra'^{22}$ is the same as defined for $Ra'^{21}$ in the aforementioned formulae (a0-r-1) to (a0-r-7).

$R^1$ in —$COOR_1$" and —$OC(=O)R_1$" for $Ra'_{22}$ is the same as defined for the aforementioned $R_0$".

In the formulae (a2-r-1) to (a2-r-6), A" is the same as defined for A" in the aforementioned formulae (a0-r-1) to (a0-r-7).

Specific examples of the groups represented by the aforementioned general formulae (a2-r-1) to (a2-r-6) are shown below.

(r-Ic-1-1) 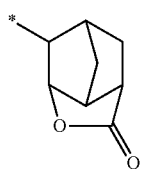
(r-Ic-1-2) 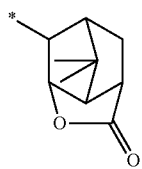
(r-Ic-1-3) 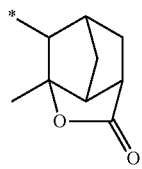
(r-Ic-1-4) 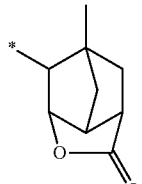
(r-Ic-1-5) 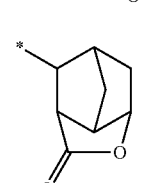
(r-Ic-1-6) 
(r-Ic-1-7) 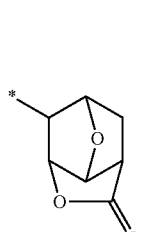
(r-Ic-1-8) 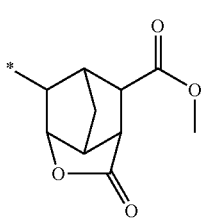
-continued
(r-Ic-1-9) 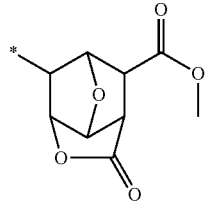
(r-Ic-1-10) 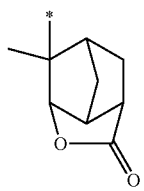
(r-Ic-1-11) 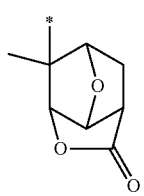
(r-Ic-1-12) 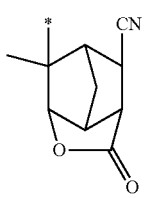
(r-Ic-1-13) 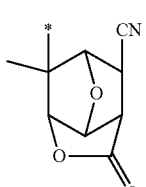
(r-Ic-1-14) 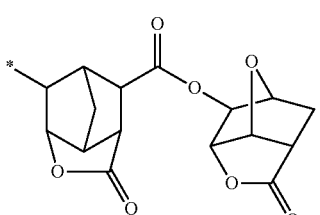
(r-Ic-1-15) 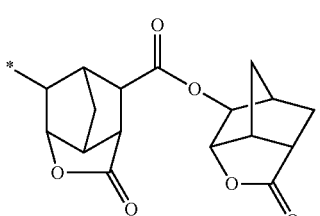

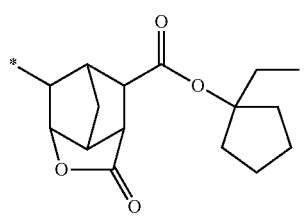
(r-Ic-1-16)
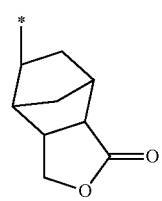
(r-Ic-2-1)
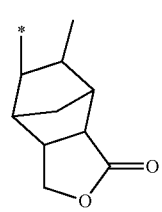
(r-Ic-2-2)
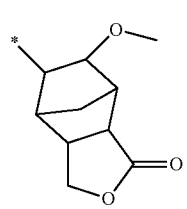
(r-Ic-2-3)
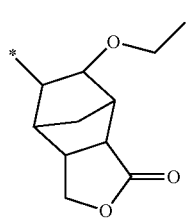
(r-Ic-2-4)
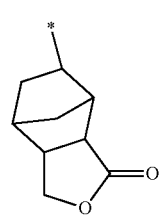
(r-Ic-2-5)
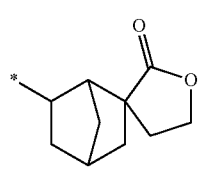
(r-Ic-3-1)
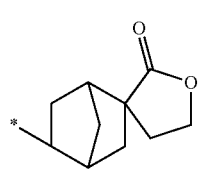
(r-Ic-3-2)
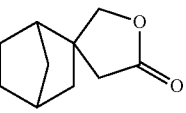
(r-Ic-3-3)
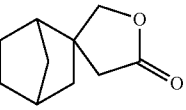
(r-Ic-3-4)
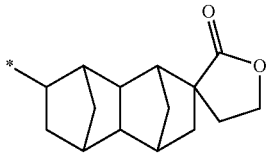
(r-Ic-3-5)
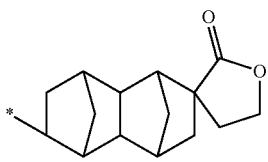
(r-Ic-3-6)
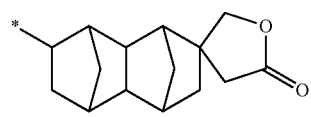
(r-Ic-3-7)
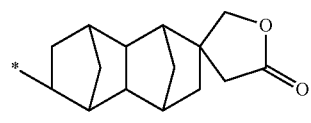
(r-Ic-3-8)
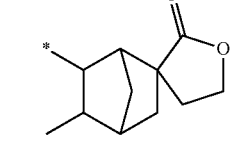
(r-Ic-3-9)
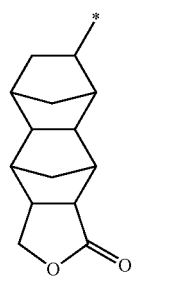
(r-Ic-4-1)
(r-Ic-4-2)

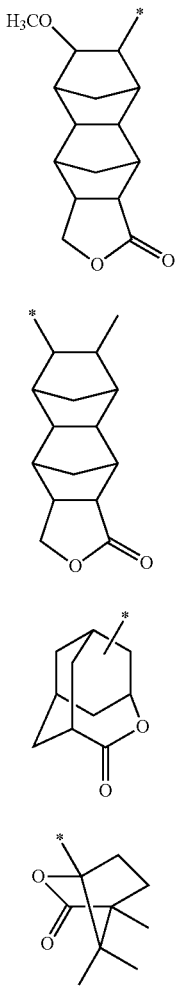

(r-Ic-4-3)

(r-Ic-4-4)

(r-Ic-5-1)

(r-Ic-6-1)

As the lactone-containing polycyclic group, a group represented by the aforementioned general formula (a2-r-1) and a group represented by the aforementioned general formula (a2-r-5) are preferable, and groups respectively represented by the aforementioned formulae (r-1c-1-1), (r-1c-1-7) and (r-1c-5-1) are more preferable.

An "—SO$_2$-containing polycyclic group" refers to a polycyclic group having a ring containing —SO$_2$— within the ring structure thereof, i.e., a polycyclic group in which the sulfur atom (S) within —SO$_2$— forms a part of the ring skeleton of the polycyclic group. When the ring containing —SO$_2$— within the ring skeleton thereof is counted as the first ring, a group containing other ring structures is described as a polycyclic group regardless of the structure of the other rings.

As the —SO$_2$-containing polycyclic group, a cyclic group containing —O—SO$_2$-within the ring skeleton thereof, i.e., a polycyclic group containing a sultone ring in which —O—S— within the —O—SO$_2$— group forms part of the ring skeleton thereof is particularly desirable. More specific examples of the —SO$_2$-containing polycyclic group include groups represented by general formulae (a5-r-1) and (a5-r-2) shown below.

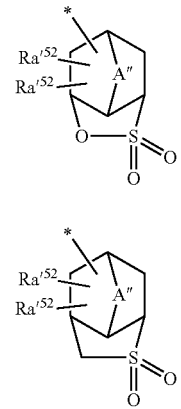

(a5-r-1)

(a5-r-2)

wherein each $Ra'^{52}$ independently represents a hydrogen atom, an alkyl group, an alkoxy group, a halogen atom, a halogenated alkyl group, a hydroxyl group, —COOR$_2$", —OC(=O)R$_2$", a hydroxyalkyl group or a cyano group; R$_2$" represents a hydrogen atom, an alkyl group, a lactone-containing cyclic group, a carbonate-containing cyclic group or a —SO$_2$-containing cyclic group; A" represents an oxygen atom, a sulfur atom, or an alkylene group of 1 to 5 carbon atoms with or without an oxygen atom or a sulfur atom.

In the aforementioned formulae (a5-r-1) and (a5-r-2), the alkyl group, the alkoxy group, the halogen atom and the halogenated alkyl group for $Ra'^{52}$ are the same as defined for the alkyl group, the alkoxy group, the halogen atom and the halogenated alkyl group for $Ra^0$ in the aforementioned formula (a0-1). However, when the structural unit (a2m) is a structural unit derived from an acrylate ester which may have the hydrogen atom bonded to the carbon atom on the α-position substituted with a substituent, $Ra'^{52}$ in each formulae is not an alkyl group, an alkoxy group, a halogen atom nor a halogenated alkyl group.

In formulae (a5-r-1) and (a5-r-2), $Ra'^{52}$ is the same as defined for $Ra'^{21}$ in the aforementioned formulae (a0-r-1) to (a0-r-7).

R$_2$ in —COOR$_2$" and —OC(=O)R$_2$" for $Ra'^{52}$ is the same as defined for the aforementioned R$_0$".

In the formulae (a5-r-1) and (a5-r-2), A" is the same as defined for A" in the aforementioned formulae (a0-r-1) to (a0-r-7).

Specific examples of the groups represented by the aforementioned general formulae (a5-r-1) and (a5-r-2) are shown below. In the formulae shown below, "Ac" represents an acetyl group.

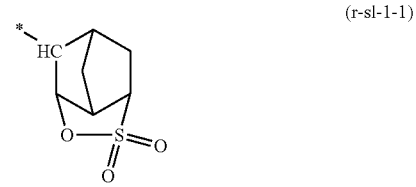

(r-sl-1-1)

-continued
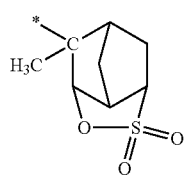
(r-sl-1-2)
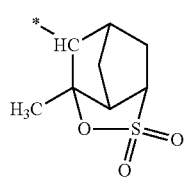
(r-sl-1-3)
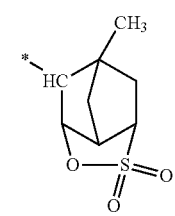
(r-sl-1-4)
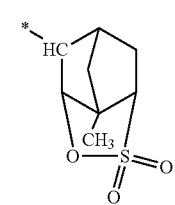
(r-sl-1-5)
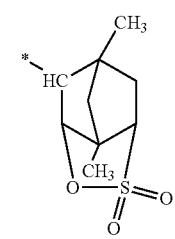
(r-sl-1-6)
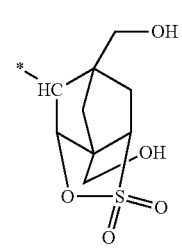
(r-sl-1-7)
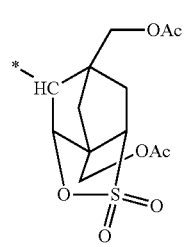
(r-sl-1-8)
-continued
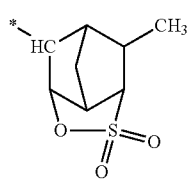
(r-sl-1-9)
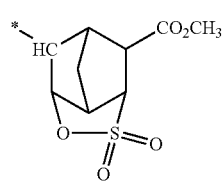
(r-sl-1-10)
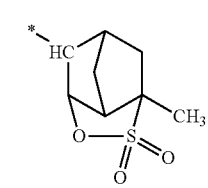
(r-sl-1-11)
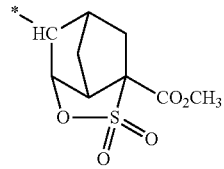
(r-sl-1-12)
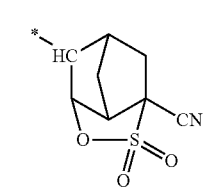
(r-sl-1-13)
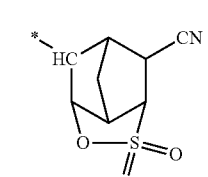
(r-sl-1-14)
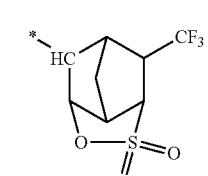
(r-sl-1-15)
(r-sl-1-16)

(r-sl-1-17)
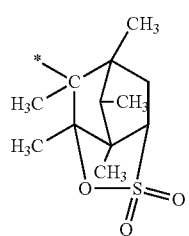
(r-sl-1-18)
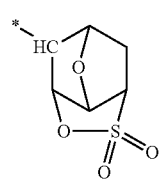
(r-sl-1-19)
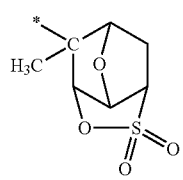
(r-sl-1-20)
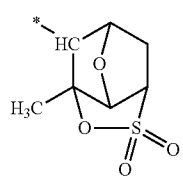
(r-sl-1-21)
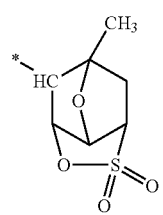
(r-sl-1-22)
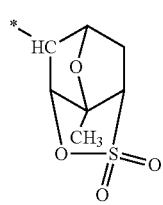
(r-sl-1-23)
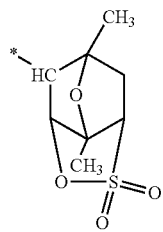
(r-sl-1-24)
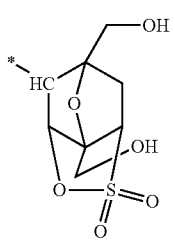
(r-sl-1-25)
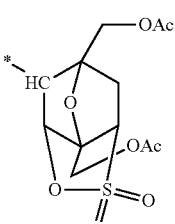
(r-sl-1-26)
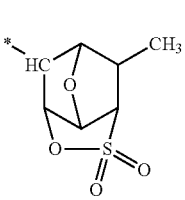
(r-sl-1-27)
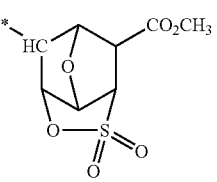
(r-sl-1-28)
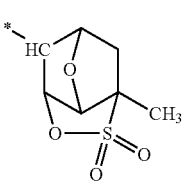
(r-sl-1-29)
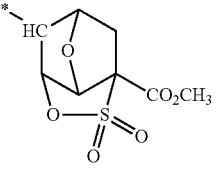
(r-sl-1-30)
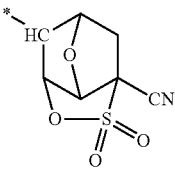
(r-sl-1-31)
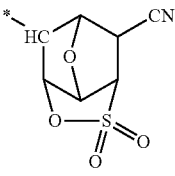

(r-sl-1-32)
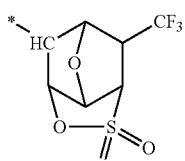

(r-sl-1-33)
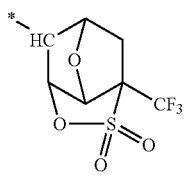

(r-sl-2-1)
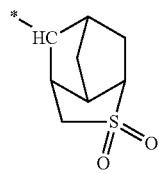

(r-sl-2-2)
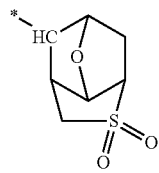

As the —SO$_2$-containing polycyclic group, a group represented by the aforementioned general formula (a5-r-1) is preferable, and groups respectively represented by the aforementioned formulae (r-s1-1-1) and (r-s1-1-18) are more preferable.

The term "carbonate-containing polycyclic group" refers to a polycyclic group including a ring containing a —O—C(=O)—O— structure (carbonate ring). Here, when counting a carbonate ring a first ring structure, groups containing other ring structures are described as polycyclic groups regardless of the structure of the other rings.

The carbonate-containing cyclic group is not particularly limited, and an arbitrary group may be used. Specific examples include groups represented by general formulae (ax3-r-2) and (ax3-r-3) shown below.

(ax3-r-2)
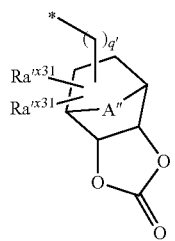

(ax3-r-3)
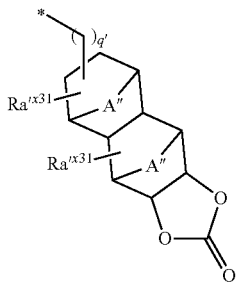

wherein each Ra$'^{x31}$ independently represents a hydrogen atom, an alkyl group, an alkoxy group, a halogen atom, a halogenated alkyl group, a hydroxyl group, —COOR$_3$''', —OC(=O)R$_3$''', a hydroxyalkyl group or a cyano group; R$_3$''' represents a hydrogen atom, an alkyl group, a lactone-containing cyclic group, a carbonate-containing cyclic group or a —SO$_2$-containing cyclic group; A'' represents an oxygen atom, a sulfur atom, or an alkylene group of 1 to 5 carbon atoms with or without an oxygen atom or a sulfur atom; and q' represents 0 or 1.

In the formulae (ax3-r-2) and (ax3-r-3), Ra$^{rx31}$ and A'' are respectively the same as defined for Ra$^{t21}$ and A'' in the aforementioned formulae (a0-r-1) to (a0-r-7).

R$^{3'''}$ in —COOR$_3$''' and —OC(=O)R$_3$''' for Ra$^{rx31}$ are the same as defined for the aforementioned R$_0$''

Specific examples of the groups represented by the aforementioned general formulae (ax3-r-2) and (ax3-r-3) are shown below. In the formulae shown below, "Ac" represents an acetyl group.

(r-cr-2-1)

(r-cr-2-2)
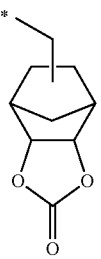

(r-cr-2-3)
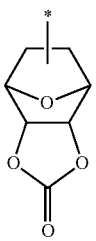

(r-cr-2-4)

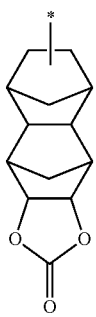
(r-cr-3-1)

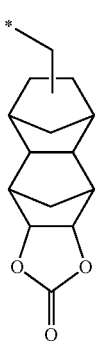
(r-cr-3-2)

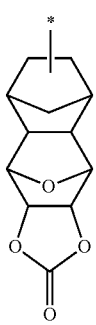
(r-cr-3-3)

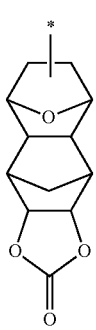
(r-cr-3-4)

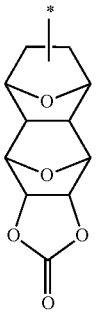
(r-cr-3-5)

As the carbonate-containing polycyclic group, groups respectively represented by the aforementioned general formulae (ax3-r-2) and (ax3-r-3) are preferable, and it is more preferable to use at least one group selected from the group consisting of the groups respectively represented by formulae (r-cr-2-1) to (r-cr-2-4), and (r-cr-3-1) to (r-cr-3-5).

As the structural unit (a2m), a structural unit derived from an acrylate ester which may have the hydrogen atom bonded to the carbon atom on the α-position substituted with a substituent is preferable.

The structural unit (a2m) is preferably a structural unit represented by general formula (a2-1) shown below.

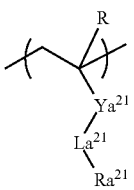
(a2-1)

wherein R represents a hydrogen atom, an alkyl group of 1 to 5 carbon atoms or a halogenated alkyl group of 1 to 5 carbon atoms; $Ya^{21}$ represents a single bond or a divalent linking group; $La^{21}$ represents —O—, —COO— or —OCO—, provided that, when $La^{21}$ represents —O—, $Ya^{21}$ does not represents —CO—; $Ra^{21}$ represents a lactone-containing polycyclic group, a carbonate-containing polycyclic group or an —$SO_2$-containing polycyclic group.

In the formula (a2-1), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

$Ya^{21}$ in the aforementioned formula (a2-1) represents a single bond or a divalent linking group;

The divalent linking group for $Ya^{21}$ is not particularly limited, and preferable examples thereof include a divalent hydrocarbon group which may have a substituent and a divalent linking group containing a hetero atom.

As examples of the divalent hydrocarbon group which may have a substituent and a divalent linking group containing a hetero atom for $Ya^{21}$, the same divalent hydrocarbon groups which may have a substituent and divalent linking groups containing a hetero atom as those described above for $Ya^0$ in the aforementioned formula (a0-1) can be given.

$Ya^{21}$ preferably represents an ester bond [—C(=O)—O—], an ether bond (—O—), a linear or branched alkylene group, a combination of these, or a single bond, and more preferably represents a combination of a linear or branched alkylene group and an ester bond [—C(=O)—O—].

In the formula (a2-1), $Ra^{21}$ represents the aforementioned lactone-containing polycyclic group, a —$SO_2$-containing polycyclic group or carbonate-containing polycyclic group, preferably the lactone-containing polycyclic group or the —$SO_2$-containing polycyclic group, and still more preferably the lactone-containing polycyclic group.

Preferable examples of the lactone-containing polycyclic group for $Ra^{21}$ include the groups respectively represented by the formulae (a2-r-1) to (a2-r-6), exclusive of those in which $Ra'^{22}$ in the formulae is an alkyl group, an alkoxy group, a halogen atom or a halogenated alkyl group.

Preferable examples of the —$SO_2$-containing polycyclic group for $Ra^{21}$ include the groups respectively represented by the formulae (a5-r-1) and (a5-r-2), exclusive of those in which $Ra'^{52}$ in the formulae is an alkyl group, an alkoxy group, a halogen atom or a halogenated alkyl group.

Preferable examples of the carbonate-containing polycyclic group for $Ra^{21}$ include the groups respectively represented by the formulae (ax3-r-2) and (ax3-r-3).

Among these, preferred are the groups respectively represented by the formulae (a2-r-1), (a2-r-5) and (a5-r-1), more preferred are the groups respectively represented by the formulae (a2-r-1) and (a2-r-5), and particularly preferred is the group represented by the formula (a2-r-5), exclusive of those in which $Ra'^{22}$ or $Ra'^{52}$ in the formulae is an alkyl group, an alkoxy group, a halogen atom or a halogenated alkyl group.

Specific examples of the structural unit (a2m) are shown below. In the formulae shown below, $R\alpha$ represents a hydrogen atom, a methyl group or a trifluoromethyl group.

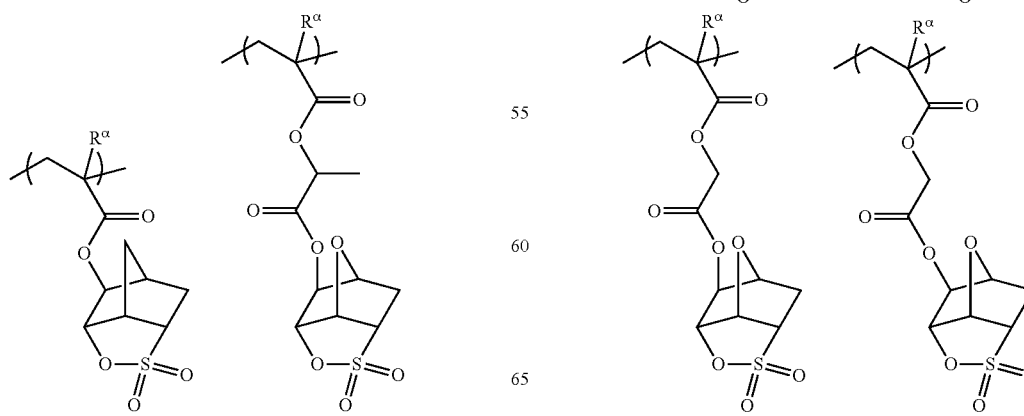

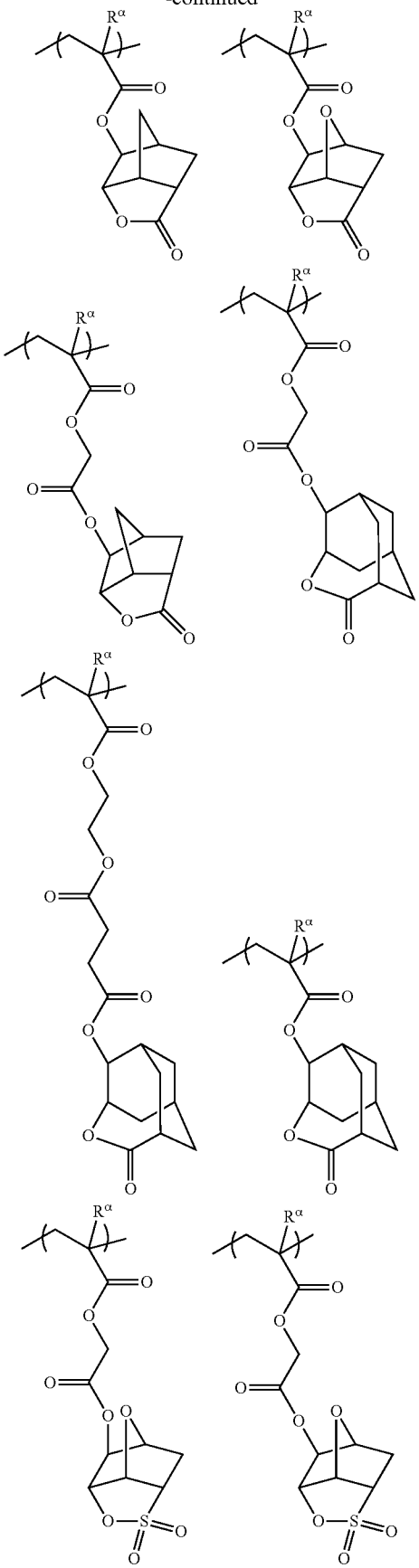

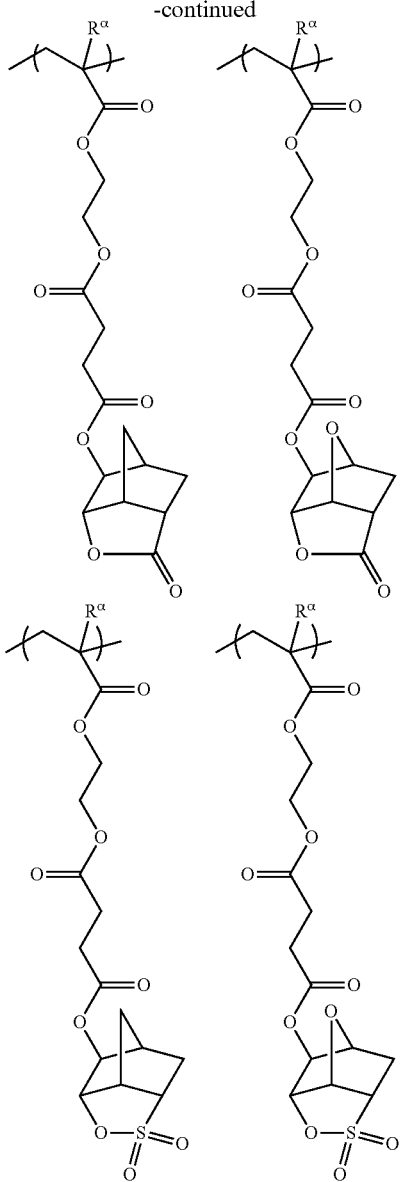

As the structural unit (a2m) contained in the component (A1), 1 type of structural unit may be used, or 2 or more types may be used.

In the component (A1), the amount of the structural unit (a2m) based on the combined total of all structural units constituting the component (A1) is preferably 1 to 80 mol %, more preferably 5 to 60 mol %, and still more preferably 5 to 40 mol %.

When the amount of the structural unit (a2m) is at least as large as the lower limit of the above-mentioned range, the resolution of the pattern is improved, thereby enabling the reproduction of patterns of more minute dimensions. On the other hand, when the amount of the structural unit (a2m) is no more than the upper limit of the above-mentioned range, a good balance can be achieved with the other structural units, and various lithography properties and pattern shape can be improved.

(Other Structural Units)

The component (A1) may be further include other structural unit, as well as the structural unit (a0) and the structural unit (a2m).

As the other structural unit, any other structural unit which cannot be classified as the aforementioned structural units (a0) and (a2m) can be used without any particular limitation, and any of the multitude of conventional structural units used within resist resins for ArF excimer lasers or KrF excimer lasers (and particularly for ArF excimer lasers) can be used. For example, a structural unit that generates acid upon exposure, structural units (a1), (a2s), (a3) and (4) shown below can be used.

Structural Unit (a1):

In the present invention, it is preferable that the component (A1) further include a structural unit (a1) containing an acid decomposable group which exhibits increased polarity by the action of acid, in addition to the aforementioned structural units (a0) and (a2m).

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxyl group, an amino group and a sulfo group (—SO$_3$H). Among these, a polar group containing —OH in the structure thereof (hereafter, referred to as "OH-containing polar group") is preferable, and a carboxy group or a hydroxyl group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

The "acid dissociable group" refers to both (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in a developing solution changes, and the solubility in an alkali developing solution is relatively increased, whereas the solubility in an organic developing solution is relatively decreased.

The acid dissociable group for the structural unit (a1) is not particularly limited, and any of the groups that have been conventionally proposed as acid dissociable groups for the base resins of chemically amplified resists can be used.

Examples of the acid dissociable group for protecting the carboxy group or hydroxyl group as a polar group include the acid dissociable group represented by general formula (a1-r-1) shown below (hereafter, for the sake of convenience, sometimes referred to as "acetal-type acid dissociable group").

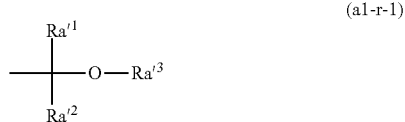

(a1-r-1)

wherein $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$ to form a ring.

In the aforementioned formula (a1-r-1), as the alkyl group for $R'^1$ and $R'^2$, an alkyl group of 1 to 5 carbon atoms is preferable, and a linear or branched alkyl group of 1 to 5 carbon atoms is more preferable, and specific examples thereof include a methyl group, an ethyl group, a propyl group, an isopropyl group, an n-butyl group, an isobutyl group, a tert-butyl group, a pentyl group, an isopentyl group and a neopentyl group, of which a methyl group or an ethyl group is preferred, and a methyl group is most preferred.

The hydrocarbon group for $Ra'^3$ is preferably an alkyl group of 1 to 20 carbon atoms, more preferably an alkyl group of 1 to 10 carbon atoms, and still more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

In the case where $Ra'^3$ represents a cyclic hydrocarbon group, the cyclic hydrocarbon group may be aliphatic or aromatic, and may be polycyclic or monocyclic. As the monocyclic aliphatic hydrocarbon group, a group in which 1 hydrogen atom has been removed from a monocycloalkane is preferable. The monocycloalkane preferably has 3 to 8 carbon atoms, and specific examples thereof include cyclopentane, cyclohexane and cyclooctane. As the polycyclic alicyclic group, a group in which 1 hydrogen atom has been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

In the case where $Ra'^3$ is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2 carbon atoms, and most preferably 1 carbon atom.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is sometimes referred to as "tertiary alkyl ester-type acid dissociable group").

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same hydrocarbon groups as those described above for $Ra'^3$ can be mentioned. $Ra'^4$ is preferably an alkyl group having from 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $R'^6$ are not mutually bonded and independently represent a hydrocarbon group, the group represented by general formula (a1-r2-2) shown below can be mentioned.

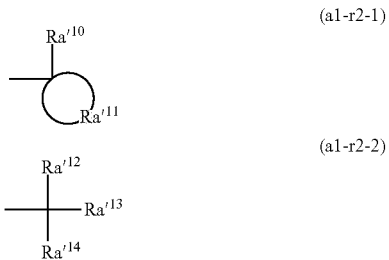

(a1-r2-1)

(a1-r2-2)

In the formulae, $Ra'^{10}$ represents an alkyl group of 1 to 10 carbon atoms; $Ra'^{11}$ is a group which forms an alicyclic group together with a carbon atom having $Ra'^{10}$ bonded thereto; $Ra'^{12}$ to $Ra'^{14}$ each independently represents a hydrocarbon group.

In the formula (a1-r2-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r2-1), as the aliphatic cyclic group which is formed by $Ra'^{11}$, the same groups as those described above for the aliphatic monocyclic group or aliphatic polycyclic group for $Ra'^3$ in the formula (a1-r-1) are preferable.

In the formula (a1-r2-2), it is preferable that $Ra'^{12}$ and $Ra'^{14}$ each independently represents an alkyl group of 1 to 10 carbon atoms, and it is more preferable that the alkyl group is the same group as the described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that $Ra^{l13}$ is the same group as described above for the linear or branched alkyl group or monocyclic or polycyclic alicylic hydrocarbon group for $Ra^{l3}$ in the formula (a1-r-1). Among these, the same monocyclic or polycyclic alicyclic hydrocarbon group as those describe above for $Ra^{l3}$ is more preferable.

Specific examples of the group represented by the aforementioned formula (a1-r2-1) are shown below. In the formulae shown below, "*" represents a valence bond.

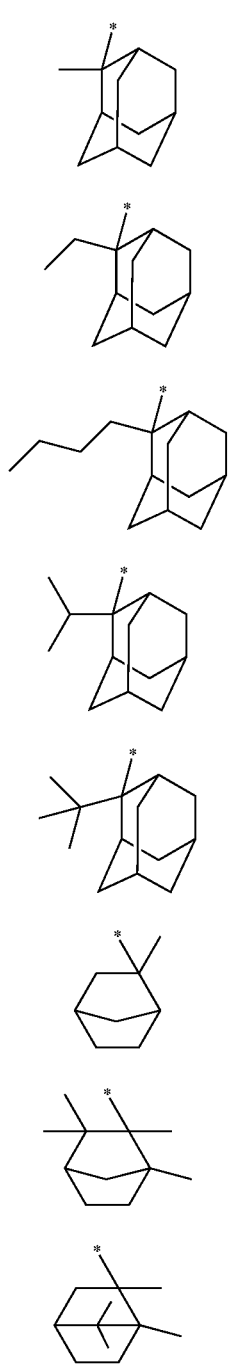

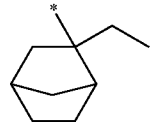
(r-pr-m9)

(r-pr-m10)

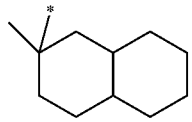
(r-pr-m11)

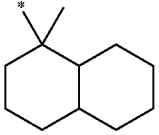
(r-pr-m12)

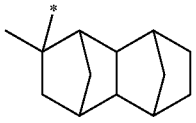
(r-pr-m13)

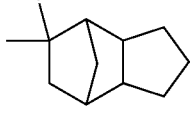
(r-pr-m14)

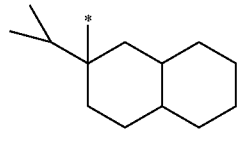
(r-pr-m15)

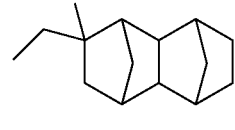
(r-pr-m16)

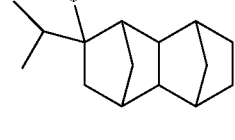
(r-pr-m17)

(r-pr-s1)

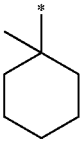
(r-pr-s2)

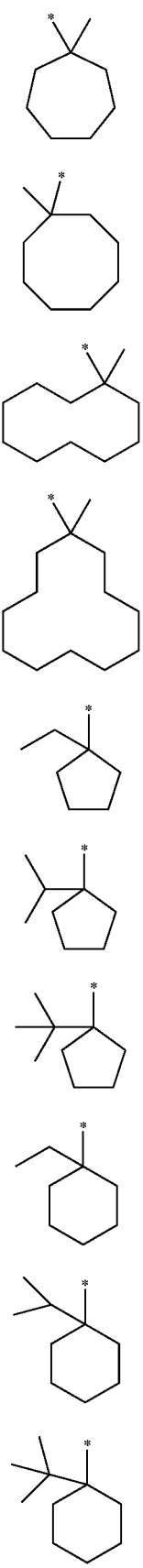
(r-pr-s3)
(r-pr-s4)
(r-pr-s5)
(r-pr-s6)
(r-pr-s7)
(r-pr-s8)
(r-pr-s9)
(r-pr-s10)
(r-pr-s11)
(r-pr-s12)
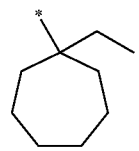
(r-pr-s13)
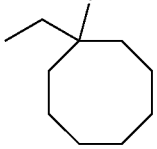
(r-pr-s14)
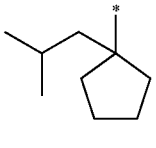
(r-pr-s15)
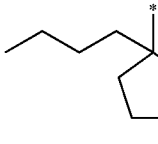
(r-pr-s16)
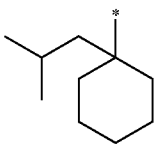
(r-pr-s17)
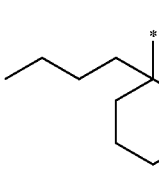
(r-pr-s18)
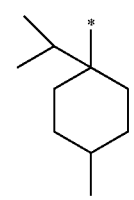
(r-pr-s19)
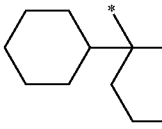
(r-pr-s20)
Specific examples of the group represented by the aforementioned formula (a1-r2-2) are shown below.
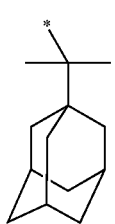
(r-pr-cm1)

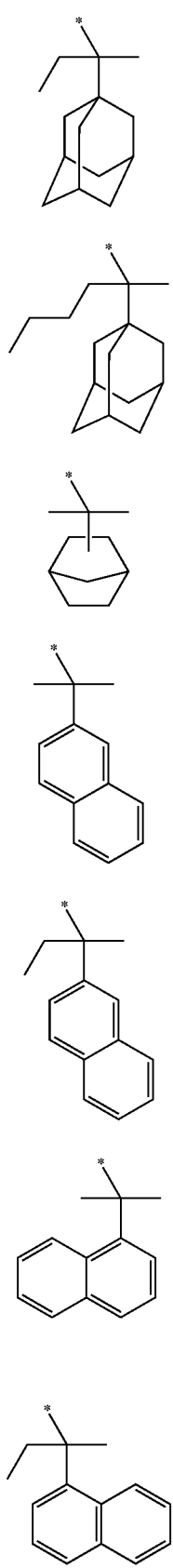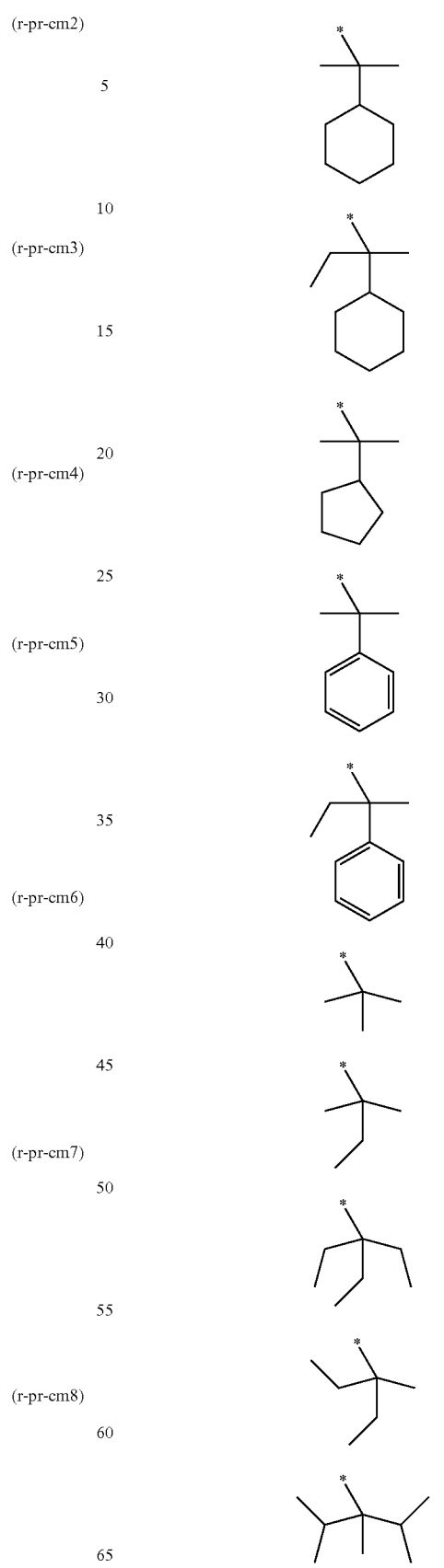

Examples of the acid dissociable group for protecting a hydroxyl group as a polar group include the acid dissociable group represented by general formula (a1-r-3) shown below (hereafter, sometimes referred to as "tertiary alkyloxycarbonyl-type acid dissociable group").

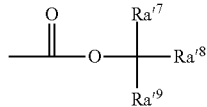

(a1-r-3)

In the formula, $Ra'^7$ to $Ra'^9$ each independently represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group for each of $Ra'^7$ to $Ra'^9$ is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxyl group is protected with a substituent containing the aforementioned acid decomposable group; and a structural unit derived from vinylbenzoic acid or a vinylbenzoic acid derivative in which at least a part of the hydrogen atom within —C(═O)—OH is protected with a substituent containing the aforementioned acid decomposable group.

As the structural unit (a1), a structural unit derived from an acrylate ester which may have the hydrogen atom bonded to the carbon atom on the α-position substituted with a substituent is preferable.

As the structural unit (a1), structural units represented by general formulae (a1-1) to (a1-3) shown below are preferable.

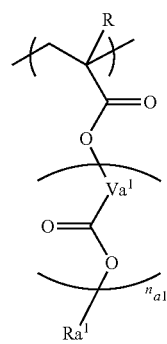

In the formulae, R represents a hydrogen atom, an alkyl group of 1 to 5 carbon atoms or a halogenated alkyl group of 1 to 5 carbon atoms; $Va^1$ represents a divalent hydrocarbon group which may contain an ether bond, an urethane bond or an amide bond; each $n_{a1}$ represents an integer of 0 to 2; $Ra^1$ represents an acid dissociable group represented by the aforementioned formula (a1-r-1) or (a1-r-2); $Wa^1$ represents a hydrocarbon group having a valency of $n_{a2}+1$; $n_{a2}$ represents an integer of 1 to 3; $Ra^2$ represents an acid dissociable group represented by the aforementioned formula (a1-r-1) or (a1-r-3); $Wa^2$ represents a hydrocarbon group having a valency of $n_{a3}+1$; $n_{a3}$ represents an integer of 1 to 3; $Va^2$ represents a divalent hydrocarbon group which may contain an ether bond, an urethane bond or an amide bond; $Ra^1$ represents an acid dissociable group represented by the aforementioned formula (a1-r-1) or (a1-r-2).

In the general formulae (a1-1) to (a1-3), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a1-1), $Va^1$ represents a divalent hydrocarbon group which may have an ether bond, an urethane bond or an amide bond.

The divalent hydrocarbon group for Va$^1$ may be either an aliphatic hydrocarbon group or an aromatic hydrocarbon group, and is the same as defined for the divalent linking group explained above in relation to Ya$^0$ in the aforementioned formula (a0-1).

Further, as the group for Va$^1$, a group in which the aforementioned divalent hydrocarbon group has been bonded via an ether bond, a urethane bond or an amide bond, or a group having such a bond within the hydrocarbon chain can be mentioned.

In the formula (a1-1), $n_{a1}$ represents an integer of 0 to 2, preferably 0 or 1, and more preferably 0.

In the aforementioned formula (a1-2), the hydrocarbon group for Wa$_1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for Va$^1$ in the aforementioned formula (a1-1) can be mentioned.

The valency of $n_{a2}+1$ is preferably divalent, trivalent or tetravalent, and divalent or trivalent is more preferable.

In the aforementioned formula (a1-3), the hydrocarbon group for Wa$^2$ having a valency of $n_{a3}+1$ may be either an aliphatic hydrocarbon group or an aromatic hydrocarbon group. The aliphatic hydrocarbon group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for Va$^1$ in the aforementioned formula (a1-1) can be mentioned.

The valency of $n_{a3}+1$ is preferably divalent, trivalent or tetravalent, and divalent or trivalent is more preferable.

In formula (a1-3), examples of Va$^2$ are the same as defined for the groups for Va$^1$ in formula (a1-1).

As the structural unit (a1-2), a structural unit represented by general formula (a1-2-01) shown below is particularly desirable.

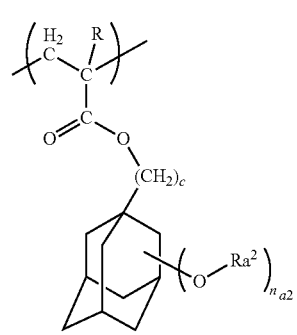

(a1-2-01)

In the formula (a1-2-01), Ra$_2$ represents an acid dissociable group represented by the aforementioned formula (a1-r-1) or (a1-r-3); $n_{a1}$ is an integer of 1 to 3, preferably 1 or 2, and more preferably 1; c is an integer of 0 to 3, preferably 0 or 1, and more preferably 1; R is the same as defined above.

Specific examples of structural units represented by general formulae (a1-1) and (a1-2) are shown below. In the formulae shown below, R$^\alpha$ represents a hydrogen atom, a methyl group or a trifluoromethyl group.

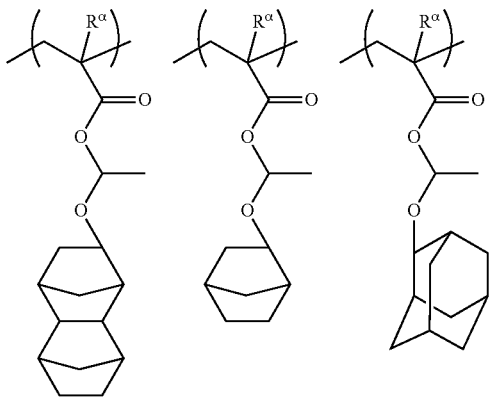

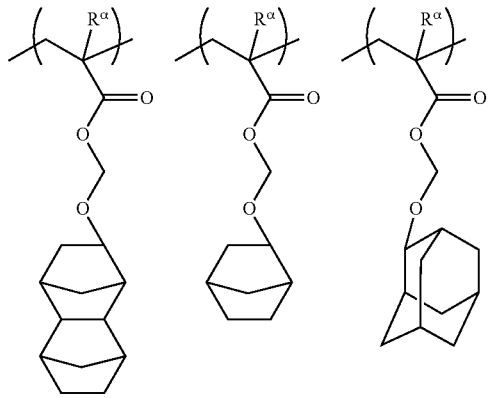

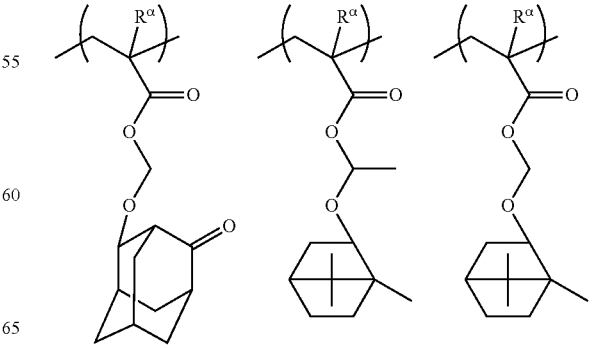

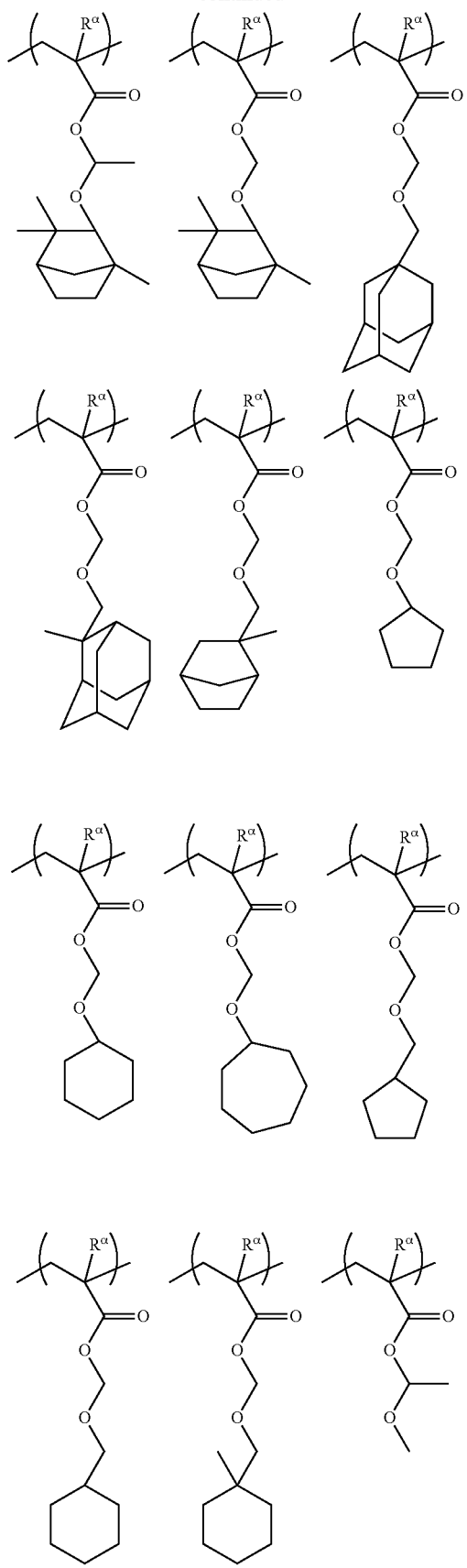
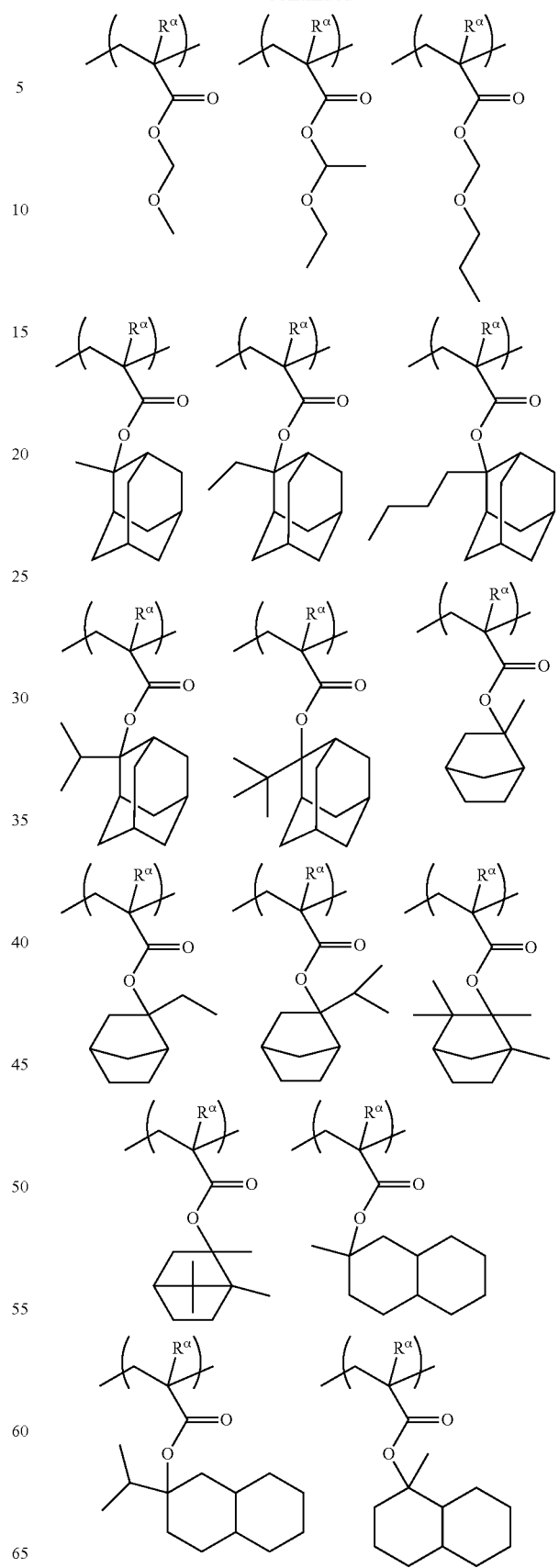

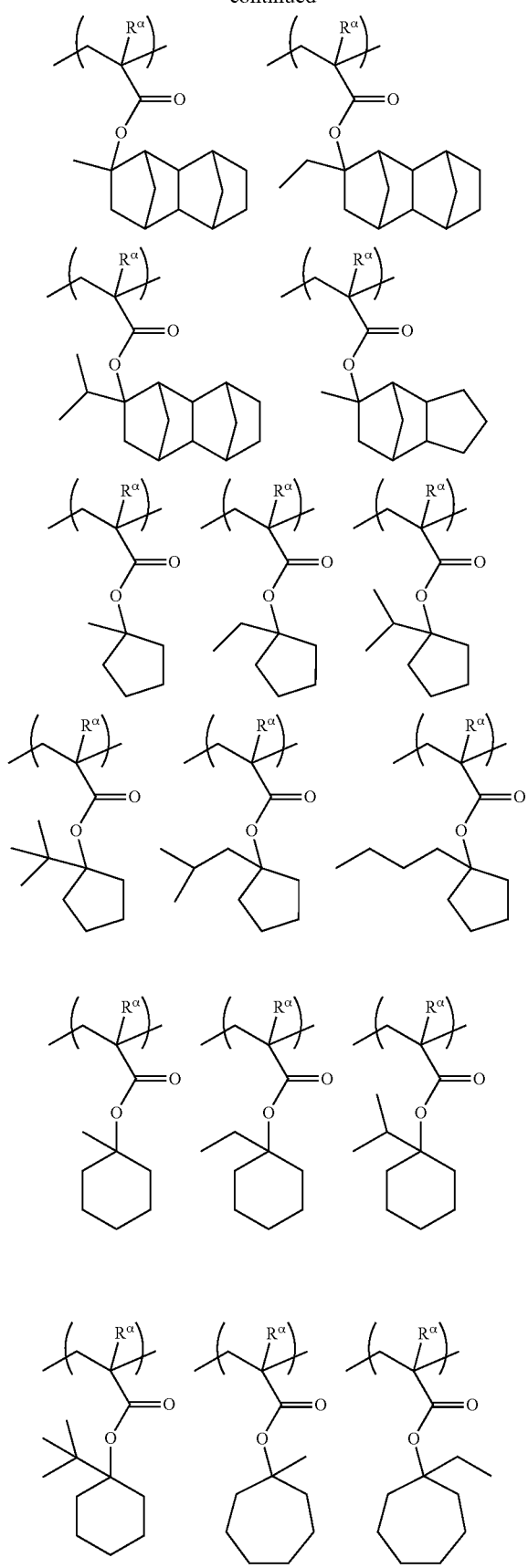
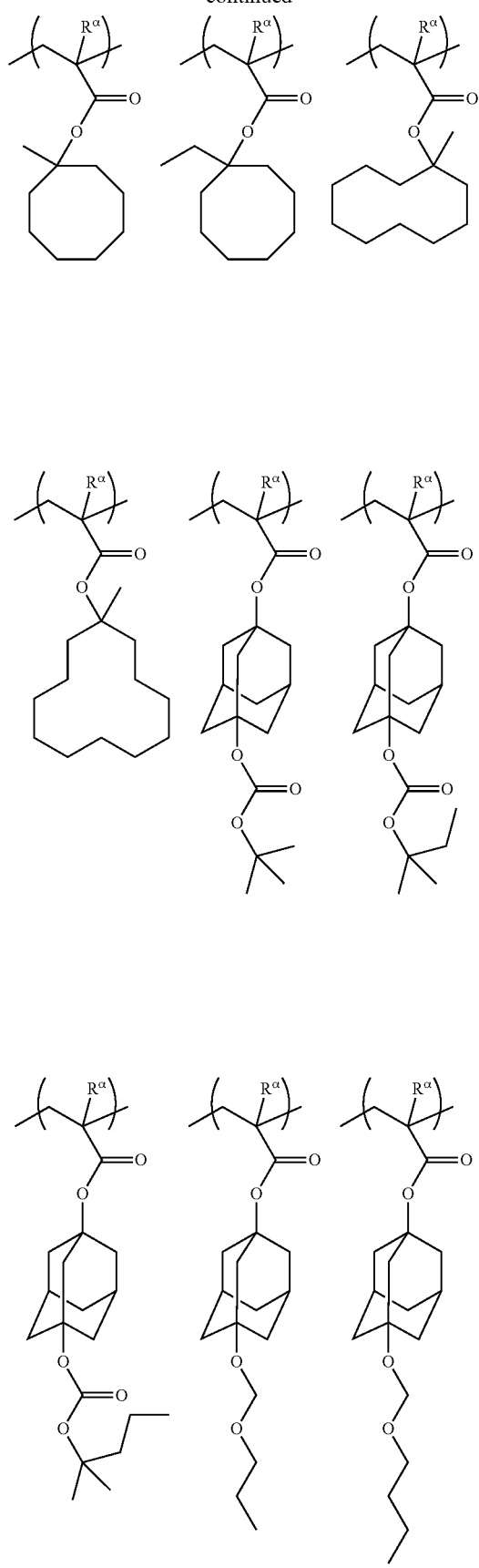

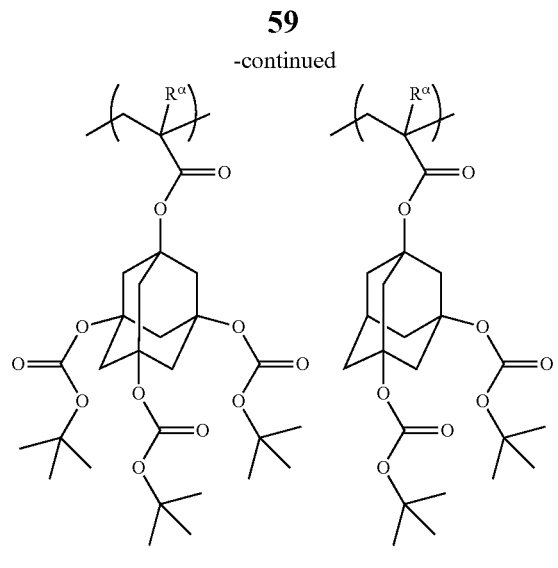
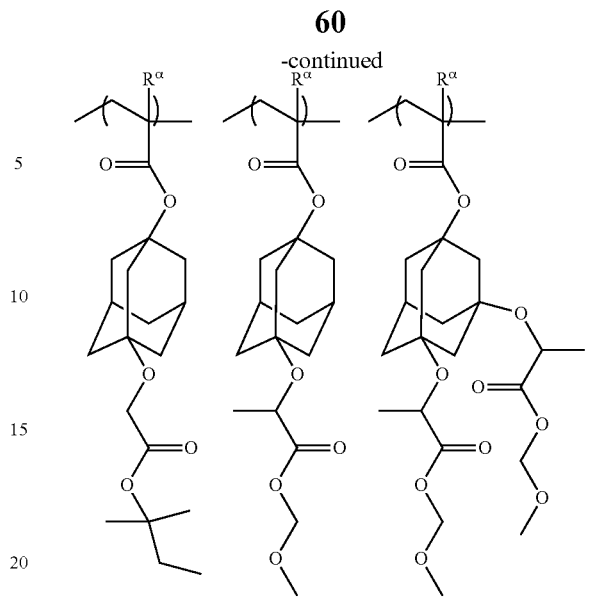
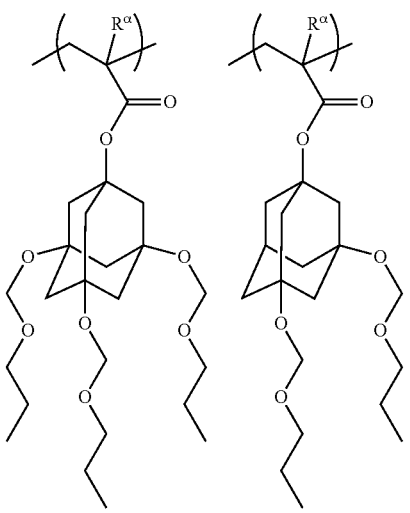
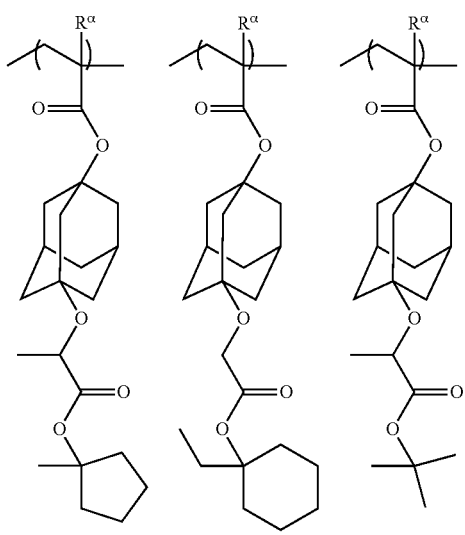

As the structural unit (a1) contained in the component (A1), 1 type of structural unit may be used, or 2 or more types may be used.

When the component (A1) contains the structural unit (a1), the amount of the structural unit (a1) based on the combined total of all structural units constituting the component (A1) is preferably 10 to 60 mol %, more preferably 20 to 60 mol %, and still more preferably 30 to 50 mol %.

When the amount of the structural unit (a1) is at least as large as the lower limit of the above-mentioned range, the formation of a resist pattern becomes easier. On the other hand, when the amount of the structural unit (a1) is no more than the upper limit of the above-mentioned range, a good balance can be reliably achieved with the other structural units.

Structural Unit (a2s):

The component (A1) may further include, in addition to the structural units (a0) and (a2m), a structural unit (a2s) containing a lactone-containing monocyclic group, a —SO$_2$-containing monocyclic group or a carbonate-containing monocyclic group.

When the component (A1) is used for forming a resist film, the lactone-containing monocyclic group, the —SO$_2$-containing monocyclic group or the carbonate-containing monocyclic group within the structural unit (a2s) is effective in improving the adhesion between the resist film and the substrate.

The term "lactone-containing monocyclic group" refers to a cyclic group comprised only of a ring containing a —O—C(=O)— structure (lactone ring).

The lactone-containing monocyclic group for the structural unit (a2) is not particularly limited, and an arbitrary structural unit may be used. Specific examples include groups represented by general formula (a2-r-7) shown below.

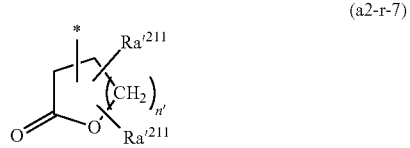

(a2-r-7)

In the formula, each $Ra'^{211}$ independently represents a hydrogen atom, an alkyl group, an alkoxy group, a halogen atom, a halogenated alkyl group, a hydroxyl group, —$COOR_4''$, —$OC(=O)R_4''$, a hydroxyalkyl group or a cyano group; $R_4''$ represents a hydrogen atom, an alkyl group, a lactone-containing cyclic group, a carbonate-containing cyclic group or a —$SO_2$-containing cyclic group; and n' represents an integer of 0 to 2.

In the aforementioned formula (a2-r-7), the alkyl group, the alkoxy group, the halogen atom and the halogenated alkyl group for $Ra'^{211}$ are the same as defined for the alkyl group, the alkoxy group, the halogen atom and the halogenated alkyl group for $Ra''^{01}$ in the aforementioned formulae (a0-r-1) to (a0-r-7).

In formula (a2-r-7), the hydroxyalkyl group for $Ra'^{211}$ is the same as defined for $Ra'^{21}$ in the aforementioned formulae (a0-r-1) to (a0-r-7).

$R^4$ in —$COOR_4''$ and —$OC(=O)R_4''$ for $Ra'_{211}$ is the same as defined for the aforementioned $R_0''$.

n' represents an integer of 0 to 2, preferably 0 or 1, and most preferably 1.

Specific examples of the group represented by the aforementioned formula (a2-r-7) are shown below.

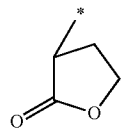
(r-lc-7-1)

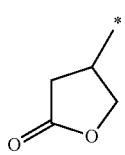
(r-lc-7-2)

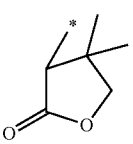
(r-lc-7-3)

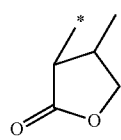
(r-lc-7-4)

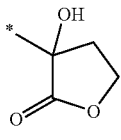
(r-lc-7--5)

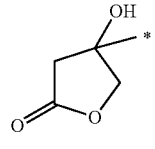
(r-lc-7-6)

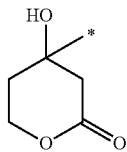
(r-lc-7-7)

An "—$SO_2$-containing monocyclic group" refers to a cyclic group having only a ring containing —$SO_2$— within the ring structure thereof, i.e., a cyclic group in which the sulfur atom (S) within —$SO_2$— forms part of the ring skeleton of the cyclic group.

As the —$SO_2$-containing monocyclic group, a cyclic group containing —O—$SO_2$—within the ring skeleton thereof, i.e., a cyclic group containing a sultone ring in which —O—S— within the —O—$SO_2$— group forms part of the ring skeleton thereof is particularly desirable.

More specific examples of the —$SO_2$-containing monocyclic group include groups represented by general formulae (a5-r-3) and (a5-r-4) shown below.

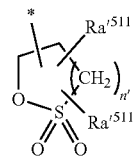
(a5-r-3)

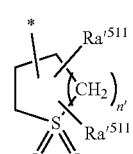
(a5-r-4)

In the formulae, each $Ra'^{511}$ independently represents a hydrogen atom, an alkyl group, an alkoxy group, a halogen atom, a halogenated alkyl group, a hydroxyl group, —$COOR_5''$, —$OC(=O)R_5''$, a hydroxyalkyl group or a cyano group; $R_5''$ is a hydrogen atom, an alkyl group, a lactone-containing cyclic group, a carbonate-containing cyclic group or a —$SO_2$-containing cyclic group; and n' represents an integer of 0 to 2.

In the aforementioned formulae (a5-r-3) and (a5-r-4), the alkyl group, the alkoxy group, the halogen atom and the halogenated alkyl group for $Ra'^{511}$ are the same as defined for the alkyl group, the alkoxy group, the halogen atom and the halogenated alkyl group for $Ra''^{01}$ in the aforementioned formulae (a0-r-1) to (a0-r-7).

In formulae (a5-r-3) and (a5-r-4), the hydroxyalkyl group for $Ra'^{511}$ is the same as defined for $Ra'^{21}$ in the aforementioned formulae (a0-r-1) to (a0-r-7).

$R^{5'''}$ in —$COOR_5''$ and —$OC(=O)R_5''$ for $Ra'^{511}$ is the same as defined for the aforementioned $R_0''$.

n' represents an integer of 0 to 2, preferably 0 or 1, and most preferably 1.

Specific examples of the groups represented by the aforementioned general formulae (a5-r-3) and (a5-r-4) are shown below. In the formulae shown below, "Ac" represents an acetyl group.

(r-sl-3-1)

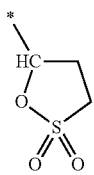

(r-sl-4-1)

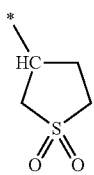

The term "carbonate-containing monocyclic group" refers to a cyclic group comprised only of a ring containing a —O—C(=O)— structure (carbonate ring).

The carbonate-containing monocyclic group is not particularly limited, and an arbitrary group may be used. Specific examples include groups represented by general formulas (ax3-r-1) shown below.

(ax3-r-1)

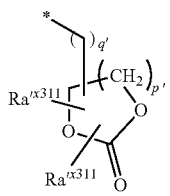

In the formula, each $Ra'^{311}$ independently represents a hydrogen atom, an alkyl group, an alkoxy group, a halogen atom, a halogenated alkyl group, a hydroxyl group, —$COOR_6''$, —$OC(=O)R_6''$, a hydroxyalkyl group or a cyano group; $R_6''$ represents a hydrogen atom, an alkyl group, a lactone-containing cyclic group, a carbonate-containing cyclic group or a —$SO_2$-containing cyclic group; p' represents an integer of 0 to 3, and q' represents an integer of 0 or 1.

In the aforementioned formula (ax3-r-1), the alkyl group, the alkoxy group, the halogen atom and the halogenated alkyl group for $Ra''^{x311}$ are the same as defined for the alkyl group, the alkoxy group, the halogen atom and the halogenated alkyl group for $Ra''^{01}$ in the aforementioned formulae (a0-r-1) to (a0-r-7).

In the formula (ax3-r-1), the hydroxyalkyl group for $Ra'^{x311}$ is the same as defined for $Ra'^{21}$ in the aforementioned formulae (a0-r-1) to (a0-r-7).

$R_6''$ in —$COOR_6''$ and —$OC(=O)R_6''$ for $Ra'^{x311}$ are the same as defined for the aforementioned $R_0''$.

p' represents an integer of 0 to 3, is preferably an integer of 1 to 3, is more preferably either 1 or 2.

Specific examples of the groups represented by the aforementioned general formulae (ax3-r-1) are shown below.

(r-cr-1-1)

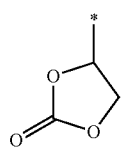

(r-cr-1-2)

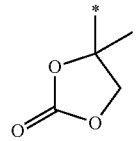

(r-cr-1-3)

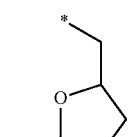

(r-cr-1-4)

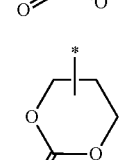

(r-cr-1-5)

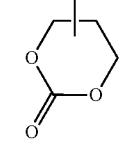

(r-cr-1-6)

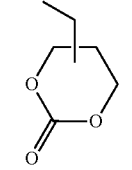

(r-cr-1-7)

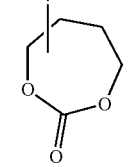

As the structural unit (a2s), a structural unit derived from an acrylate ester which may have the hydrogen atom bonded to the carbon atom on the α-position substituted with a substituent is preferable.

Specific examples of preferable structural units for the structural unit (a2s) include structural units represented by the aforementioned general formula (a2-1) wherein $Ra^{21}$ is a group represented by any of the aforementioned formulae (a2-r-7), (a5-r-3), (a5-r-4) and (ax3-r-1).

Particularly, with respect to the structural unit (a2s) represented by the aforementioned general formula (a2-1), $Ra^{21}$ in the formula is preferably any of the groups represented by the formulae (a2-r-7), (a5-r-3) and (a5-r-4), and is more preferably the group represented by the formula (a2-r-7).

As the structural unit (a2s) contained in the component (A1), 1 kind of structural unit may be used, or 2 or more kinds of structural units may be used.

When the component (A1) includes the structural unit (a2s), the amount of the structural unit (a2s) based on the combined total of all structural units constituting the component (A1) is preferably 1 to 70 mol %, more preferably 5 to 60 mol %, and still more preferably 5 to 40 mol %.

When the amount of the structural unit (a2) is at least as large as the lower limit of the above-mentioned range, various lithography properties and the pattern shape can be further improved in the formation of a resist pattern. Especially, the resolution is improved, thereby enabling the reproduction of patterns of more minute dimensions. On the other hand, when the amount of the structural unit (a2) is no more than the upper limit of the above-mentioned preferable range, a good balance can be reliably achieved with the other structural units.

Structural Unit (a3):

The component (A1) preferably includes a structural unit (a3) containing a polar group-containing aliphatic hydrocarbon group, as well as the structural units (a0) and (a2m), with the proviso that the structural unit (a3) is different from those mentioned above as the structural units (a0), (a2m), (a1) and (a2s).

When the component (A1) includes the structural unit (a3), the hydrophilicity of the component (A) is enhanced, thereby contributing to improvement in resolution.

Examples of the polar group include a hydroxyl group, a cyano group, a carboxyl group, or a hydroxyalkyl group in which part of the hydrogen atoms of the alkyl group have been substituted with fluorine atoms, of which a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups may be monocyclic or polycyclic, and can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

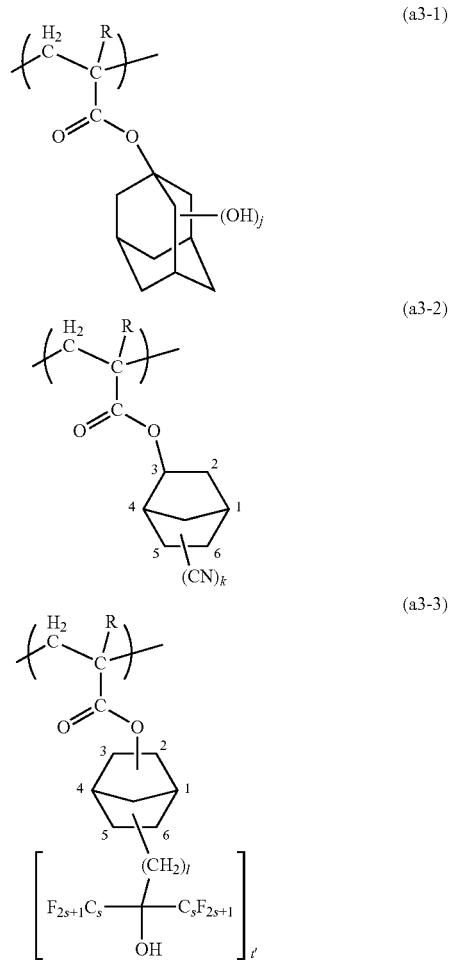

In the formulae, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In the formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 kind of structural unit may be used, or 2 or more kinds of structural units may be used.

When the component (A1) contains the structural unit (a3), the amount of the structural unit (a3) based on the combined total of all structural units constituting the component (A1) is preferably 1 to 50 mol %, more preferably 1 to 40 mol %, most preferably 3 to 30 mol %, and most preferably 10 to 20 mol %.

When the amount of the structural unit (a3) is at least as large as the lower limit of the above-mentioned preferable range, the resolution is improved in the formation of a resist pattern. On the other hand, when the amount of the structural unit (a3) is no more than the upper limit of the above-mentioned preferable range, a good balance can be readily achieved with the other structural units.

Structural Unit (a4):

The component (A1) may be further include, in addition to the structural units (a0) and (a2m), a structural unit (a4) containing an acid non-dissociable, alicyclic group.

When the component (A1) includes the structural unit (a4), dry etching resistance of the resist pattern to be formed is improved. Further, the hydrophobicity of the component (A) is further improved. Increase in the hydrophobicity contributes to improvement in terms of resolution, shape of the resist pattern and the like, particularly in a solvent developing process.

An "acid non-dissociable, aliphatic cyclic group" in the structural unit (a4) refers to a cyclic group which is not dissociated by the action of the acid (e.g., acid generated from the structural unit which generates acid upon exposure or the component (B)) generated upon exposure, and remains in the structural unit.

As the structural unit (a4), a structural unit which contains a non-acid-dissociable aliphatic cyclic group, and is also derived from an acrylate ester is preferable. As the cyclic group, any of the multitude of conventional cyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include structural units represented by general formulae (a4-1) to (a4-7) shown below.

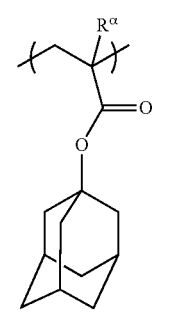
(a4-1)

(a4-2)

-continued

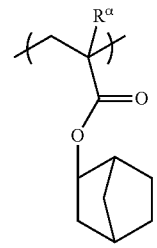
(a4-3)

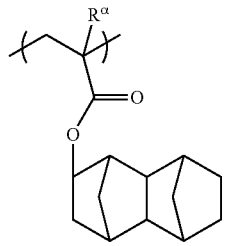
(a4-4)

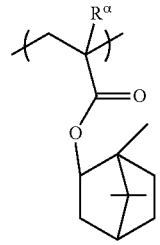
(a4-5)

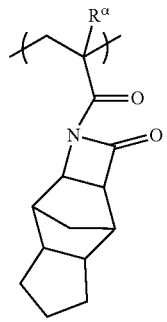
(a4-6)

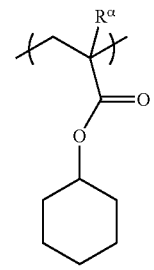
(a4-7)

In the formulae, $R^\alpha$ is the same as defined above.

As the structural unit (a4) contained in the component (A1), 1 type of structural unit may be used, or 2 or more types may be used.

When the component (A1) includes the structural unit (a4), the amount of the structural unit (a4) based on the combined total of all structural units constituting the component (A1) is preferably 1 to 40 mol %, and more preferably 5 to 20 mol %.

When the amount of the structural unit (a4) is at least as large as the lower limit of the above-mentioned preferable range, the effect of using the structural unit (a4) can be satisfactorily achieved. On the other hand, when the amount of the structural unit (a4) is no more than the upper limit of the above-mentioned preferable range, a good balance can be achieved with the other structural units.

In the resist composition of the present embodiment, the component (A) contains a polymeric compound (A1) having a structural unit (a0) and a structural unit (a2m).

Preferable examples of the component (A1) include a polymeric compound having the structural units (a0), (a2m) and (a1).

Specific examples of the component (A1) include a polymeric compound consisting of a repeating structure of the structural unit (a0), the structural unit (a2m) and the structural unit (a1); a polymeric compound consisting of a repeating structure of the structural unit (a0), the structural unit (a2m), the structural unit (a1) and the structural unit (a2s); a polymeric compound consisting of a repeating structure of the structural unit (a0), the structural unit (a2m), the structural unit (a1) and the structural unit (a3); and a polymeric compound consisting of a repeating structure of the structural unit (a0), the structural unit (a2m), the structural unit (a1), the structural unit (a2s) and the structural unit (a3).

Further, the component (A1) is preferably a combination of the structural unit (a0), the structural unit (a2m) and two or more kinds of the structural unit (a1) because various lithography properties such as the in-plane uniformity of the pattern dimensions (CDU) are improved.

Preferable examples of the combination of two or more kinds of the structural unit (a1) include a combination of a structural unit having the acid dissociable group represented by the aforementioned general formula (a1-r2-1) and a structural unit having the acid dissociable group represented by the aforementioned general formula (a1-r2-2); a combination of structural units each having the acid dissociable group represented by the aforementioned general formula (a1-r2-1); and a combination of structural units each having the acid dissociable group represented by the aforementioned general formula (a1-r2-2).

Further, as the component (A1), it is preferable to use the structural unit (a0) and the structural unit (a2m) in combination with the structural unit (a2s) because the resolution of the pattern is improved, thereby enabling the reproduction of patterns of more minute dimensions. Preferable examples of the combination of the structural unit (a2m) and the structural unit (a2s) include a combination of a structural unit (a2m) having the —$SO_2$-containing polycyclic group and a structural unit (a2s) having the lactone-containing polycyclic group; a combination of a structural unit (a2m) having the lactone-containing polycyclic group and a structural unit (a2s) having the lactone-containing polycyclic group; and a combination of a structural unit (a2m) having the —$SO_2$-containing polycyclic group, a structural unit (a2m) having the lactone-containing polycyclic group and a structural unit (a2s) having the lactone-containing polycyclic group.

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 25,000. When the Mw of the component (A1) is no more than the upper limit of the above-mentioned preferable range, the resist composition exhibits a satisfactory solubility in a resist solvent. On the other hand, when the Mw of the component (A1) is at least as large as the lower limit of the above-mentioned preferable range, dry etching resistance and the cross-sectional shape of the resist pattern becomes satisfactory.

The dispersity (Mw/Mn) of the component (A1) is not particularly limited, but is preferably 1.0 to 5.0, more preferably 1.0 to 4.0, and most preferably 1.0 to 3.0. Here, Mn is the number average molecular weight in terms of the polystyrene equivalent value determined by gel permeation chromatography (GPC).

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. In particular, when the amount of the component (A1) is 25% by weight or more, the resolution of the pattern is improved, and various lithography properties such as mask reproducibility and in-plane uniformity of the pattern dimensions (CDU) may be more reliably secured.

In the resist composition of the present embodiment, as the component (A), "a base component which exhibits changed solubility in a developing solution under action of acid" other than the component (A1) (hereafter, referred to as "component (A2)") may be used in combination.

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers, low-molecular weight compounds) may be used. As the component (A2), one kind of resin may be used, or two or more kinds of resins may be used in combination.

In the resist composition of the present embodiment, as the component (A), one kind of composition may be used, or two or more kinds of compositions may be used in combination.

In the resist composition of the present embodiment, the amount of the component (A) can be appropriately adjusted depending on the thickness of the resist film to be formed, and the like.

<Other Components>

The resist composition of the present embodiment may contain, in addition to the aforementioned component (A), any other components other than the component (A). Examples of the other components include the component (B), the component (D), the component (E), the component (F) and the component (S) described below.

[Component (B): Acid-Generator Component]

The resist composition of the present embodiment may include, in addition to the component (A), an acid-generator component (hereafter, sometimes referred to as "component (B)").

As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, it is preferable to use an onium salt acid generator.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be used.

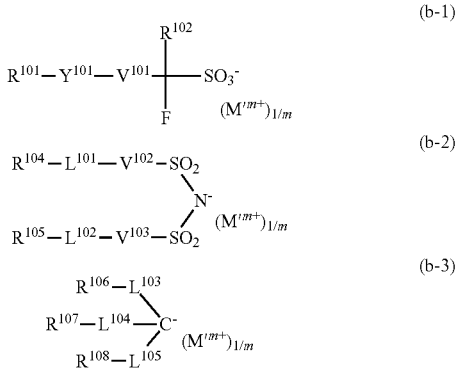

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; m represents an integer of 1 or more; and $M'^{m+}$ represents an m-valent onium cation.

{Anion Moiety}

Anion Moiety of Component (b-1)

In the formula (b-1), $R^{101}$ represents a cyclic group which may have a substituent, a chain-like alkyl group which may have a substituent or a chain-like alkenyl group which may have a substituent.

Cyclic Group which may have a Substituent:

The cyclic group is preferably a cyclic hydrocarbon group, and the cyclic hydrocarbon group may be either an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

The aromatic hydrocarbon group for $R^{101}$ is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group represented by $R^{101}$ include benzene, fluorene, naphthalene, anthracene, phenanthrene and biphenyl; and aromatic hetero rings in which part of the carbon atoms constituting the aforementioned aromatic rings has been substituted with a hetero atom. Examples of the hetero atom within the aromatic hetero rings include an oxygen atom, a sulfur atom and a nitrogen atom.

Specific examples of the aromatic hydrocarbon group represented by $R^{101}$ include a group in which one hydrogen atom has been removed from the aforementioned aromatic ring (i.e., an aryl group, such as a phenyl group or a naphthyl group), and a group in which one hydrogen of the aforementioned aromatic ring has been substituted with an alkylene group (e.g., an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2 carbon atoms, and most preferably 1 carbon atom.

Examples of the cyclic aliphatic hydrocarbon group for $R^{101}$ include aliphatic hydrocarbon groups containing a ring in the structure thereof.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned linear or branched aliphatic hydrocarbon group, and a group in which the alicyclic group is interposed within the aforementioned linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycycloalkane preferably has 7 to 30 carbon atoms. Among polycycloalkanes, a polycycloalkane having a bridged ring polycyclic skeleton, such as adamantane, norbornane, isobornane, tricyclodecane or tetracyclododecane, and a polycycloalkane having a condensed ring polycyclic skeleton, such as a cyclic group having a steroid skeleton are preferable.

Among these examples, as the cyclic aliphatic hydrocarbon group for $R^{101}$, a group in which one or more hydrogen atoms have been removed from a monocycloalkane or a polycycloalkane is preferable, a group in which one or more hydrogen atoms have been removed from a polycycloalkane is more preferable, an adamantyl group or a norbornyl group is still more preferable, and an adamantyl group is most preferable.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable, and specific examples include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, e.g., alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The cyclic hydrocarbon group for R$^{101}$ may contain a hetero atom such as a heterocycle. Specific examples include lactone-containing cyclic groups represented by the aforementioned general formulae (a2-r-1) to (a2-r-7), the —SO$_2$-containing cyclic group represented by the aforementioned formulae (a5-r-1) to (a5-r-4), the groups represented by the aforementioned general formulae (a0-r-1) to (a0-r-7), and other heterocyclic groups shown below.

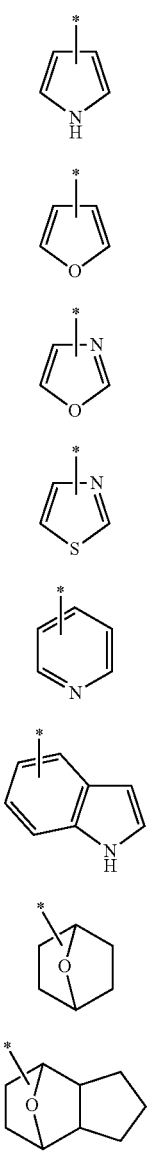

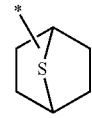
(r-hr-9)

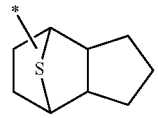
(r-hr-10)

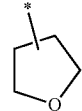
(r-hr-11)

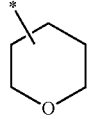
(r-hr-12)

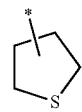
(r-hr-13)

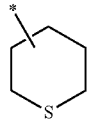
(r-hr-14)

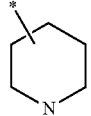
(r-hr-15)

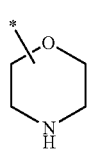
(r-hr-16)

As the substituent for the cyclic group for R$^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The carbonyl group as the substituent is a group that substitutes a methylene group (—CH$_2$—) constituting the cyclic hydrocarbon group.

Chain-like Alkyl Group which may have a Substituent:

The chain-like alkyl group for R$^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Chain-like Alkenyl Group which may have a Substituent:

The chain-like alkenyl group for R$^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these examples, as the chain-like alkenyl group, a linear alkenyl group is preferable, a vinyl group or a propenyl group is more preferable, and a vinyl group is most preferable.

As the substituent for the chain-like alkyl group or alkenyl group for R$^{101}$, an alkoxy group, a halogen atom, a halogenated alkyl group, a hydroxyl group, a carbonyl group, a nitro group, an amino group, the cyclic group for R$^{101}$ or the like can be used.

Among these examples, as R$^{101}$, a cyclic group which may have a substituent is preferable, and a cyclic hydrocarbon group which may have a substituent is more preferable. More specific examples thereof include a phenyl group; a naphthyl group; a group in which one or more hydrogen atoms have been removed from a polycycloalkane; a lactone-containing cyclic group represented by any one of the aforementioned formula (a2-r-1) to (a2-r-7); and an —SO$_2$-containing cyclic group represented by any one of the aforementioned formula (a5-r-1) to (a5-r-4); and a group represented by any one of the aforementioned formulae (a0-r-1) to (a0-r-7).

In the formula (b-1), Y$^{101}$ represents a single bond or a divalent linking group containing an oxygen atom.

In the case where Y$^{101}$ is a divalent linking group containing an oxygen atom, Y$^{101}$ may also contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, oxygen atom-containing linking groups with an alkylene group. Furthermore, the combinations may have a sulfonyl group (—SO$_2$—) bonded thereto. Examples of divalent linking groups containing an oxygen atom include linking groups represented by general formulae (y-a1-1) to (y-a1-7) shown below.

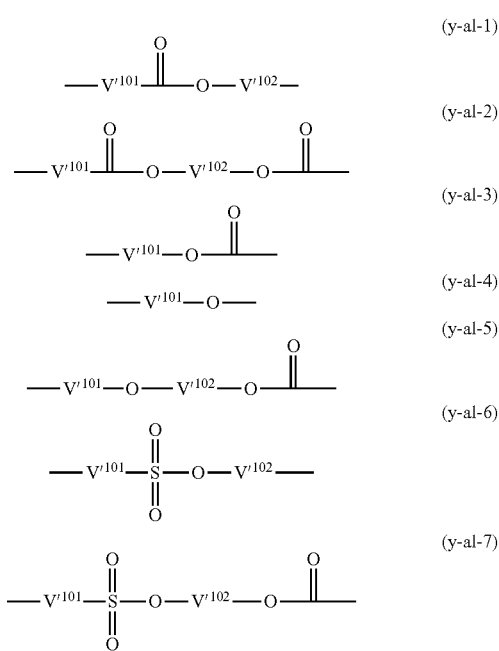

In the formulae, V$'^{101}$ represents a single bond or an alkylene group of 1 to 5 carbon atoms; V$'^{102}$ represents a divalent saturated hydrocarbon group of 1 to 30 carbon atoms.

The divalent saturated hydrocarbon group for V$'^{102}$ is preferably an alkylene group of 1 to 30 carbon atoms, more preferably an alkylene group of 1 to 10 carbon atoms, and still more preferably an alkylene group of 1 to 5 carbon atoms.

The alkylene group for V$'^{101}$ and V$'^{102}$ may be a linear alkylene group or a branched alkylene group, and a linear alkylene group is preferable.

Specific examples of the alkylene group for V$'^{101}$ and V$'^{102}$ include a methylene group [—CH$_2$—]; an alkylmethylene group, such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; an alkylethylene group, such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; an alkyltrimethylene group, such as —CH(CH$_3$)CH$_2$CH$_2$— and —CH$_2$CH(CH$_3$)CH$_2$—; a tetramethylene group [—CH$_2$CH$_2$CH$_2$CH$_2$—]; an alkyltetramethylene group, such as —CH(CH$_3$)CH$_2$CH$_2$CH$_2$—, —CH$_2$CH(CH$_3$)CH$_2$CH$_2$—; and a pentamethylene group [—CH$_2$CH$_2$CH$_2$CH$_2$CH$_2$—].

Further, part of methylene group within the alkylene group for V$'^{101}$ and V$'^{102}$ may be substituted with a divalent alicyclic group of 5 to 10 carbon atoms. The alicyclic group is preferably a divalent group in which one hydrogen atom has been removed from the alicyclic hydrocarbon group (monocyclic aliphatic hydrocarbon group or polycyclic aliphatic hydrocarbon group) for $Ra^{13}$ in the aforementioned formula (a1-r-1), and a cyclohexylene group, 1,5-adamantylene group or 2,6-adamantylene group is more preferable.

$Y^{101}$ is preferably a divalent linking group containing an ether bond or a divalent linking group containing an ester bond, and groups represented by the aforementioned formulas (y-a1-1) to (y-a1-5) are preferable.

In formula (b-1), $V^{101}$ represents a single bond, an alkylene group or a fluorinated alkylene group. The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In the formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As a specific example of the anion moiety for the component (b–1), in the case where $Y^{101}$ a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

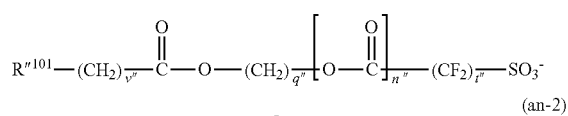

(an-1)

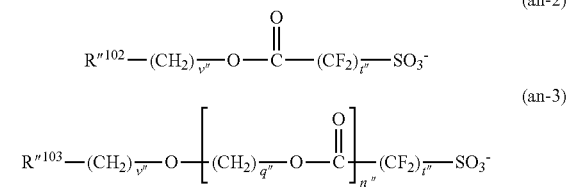

(an-2)

(an-3)

In the formulae, $R'''^{101}$ represents an aliphatic cyclic group which may have a substituent, a group represented by any one of the aforementioned formulas (r-hr-1) to (r-hr-6) or a chain-like alkyl group which may have a substituent; $R'''^{102}$ represents an alicyclic group which may have a substituent, a lactone-containing cyclic group represented by any one of the aforementioned formulae (a2-r-1) to (a2-r-7), an —SO₂-containing cyclic group represented by any one of the aforementioned formulae (a5-r-1) to (a5-r-4), or a group represented by any one of the aforementioned formulae (a0-r-1) to (a0-r-7); $R'''^{103}$ represents an aromatic cyclic group which may have a substituent, an alicyclic group which may have a substituent or a chain-like alkenyl group which may have a substituent; v" represents an integer of 0 to 3; each q" independently represents an integer of 1 to 20; t" represents an integer of 1 to 3; and n" represents 0 or 1.

As the aliphatic cyclic group for $R'''^{101}$, $R'''^{102}$ and $R'''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$.

As the chain-like alkyl group for $R'''^{101}$ which may have a substituent, the same groups as those described above for $R^{101}$ are preferable. As the chain-like alkenyl group for $R'''^{103}$ which may have a substituent, the same groups as those described above for $R^{101}$ are preferable.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved.

The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

$L^{103}$ to $L^{105}$ each independently represents a single bond, —CO— or —SO₂—.

{Cation Moiety}

In the formulae (b-1), (b-2) and (b-3), m represents an integer of 1 or more, $M'^{m+}$ represents an onium cation having a valency of m, preferably a sulfonium cation or an iodonium cation, and most preferably an organic cation represented by any one of the following formulae (ca-1) to (ca-4).

(ca-1)

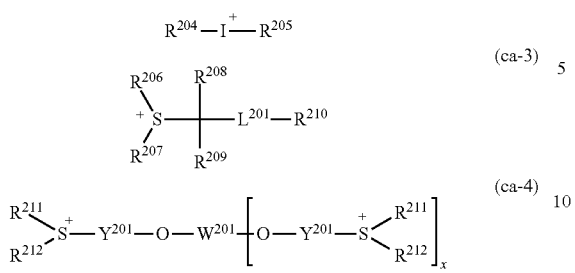

(ca-2)

(ca-3)

(ca-4)

In the formulae, $R^{201}$ to $R^{207}$, $R^{211}$ and $R^{212}$ independently represents an aryl group, an alkyl group or an alkenyl group, provided that mutual bond may be formed via a sulfur atom between two of $R^{201}$ to $R^{203}$ between $R^{206}$ and $R^{207}$, or between $R^{211}$ and $R^{212}$ to form a ring; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent, or an —SO$_2$-containing cyclic group which may have a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group (carbonyl group is a group formed by substituting a hydrogen atom bonded to a carbon atom constituting an aryl group with an oxygen atom, or a group substituting an methylene group (—CH$_2$—) constituting an alkyl group or an alkenyl group), a cyano group, an amino group, an aryl group, and groups represented by formulae (ca-r-1) to (ca-r-7) shown below.

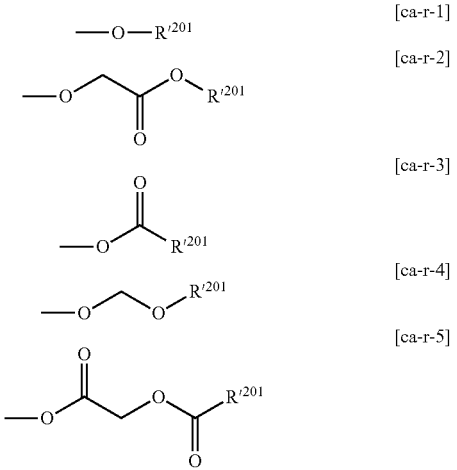

[ca-r-1]
[ca-r-2]
[ca-r-3]
[ca-r-4]
[ca-r-5]

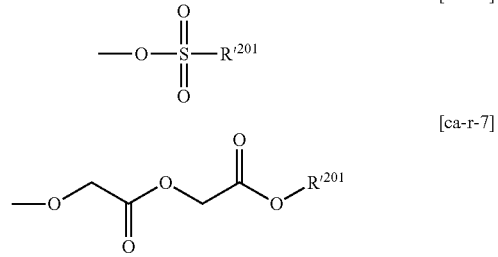

[ca-r-6]

[ca-r-7]

In the formulae, each $R'^{201}$ independently represents a hydrogen atom, a cyclic group which may have a substituent, a chain-like alkyl group which may have a substituent, or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R^{101}$ in the aforementioned formula (b-1) can be mentioned. As the cyclic group which may have a substituent and the chain-like alkyl group which may have a substituent, the same groups as those described above for the acid dissociable group represented by the aforementioned formula (a1-r-2) can be also mentioned.

When a ring is formed by mutual bond via a sulfur atom between two of $R^{201}$ to $R^{203}$, between $R^{206}$ and $R^{207}$, or between $R^{211}$ and $R^{212}$, such a ring may be bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms). The formed ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an —SO$_2$-containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

The —SO$_2$-containing cyclic group for $R^{210}$ which may have a substituent is the same as defined for the aforementioned "—SO$_2$-containing polycyclic group" or the aforementioned "—SO2-containing monocyclic group", of which the "—SO2-containing polycyclic group" is preferable, and the group represented by the aforementioned general formula (a5-r-1) is more preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in the aforementioned formula (b-1).

Examples of the alkylene group and alkenylene group for $Y^{201}$ include groups in which one hydrogen atom has been removed from the chain-like alkyl group or the chain-like alkenyl group given as an example of $R^{101}$ in the aforementioned formula (b-1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups (which may have a substituent) as those described above for $Ya^0$ in the general formula (a0-1) can be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by formulae (ca-1-1) to (ca-1-67) shown below.

(ca-1-1)

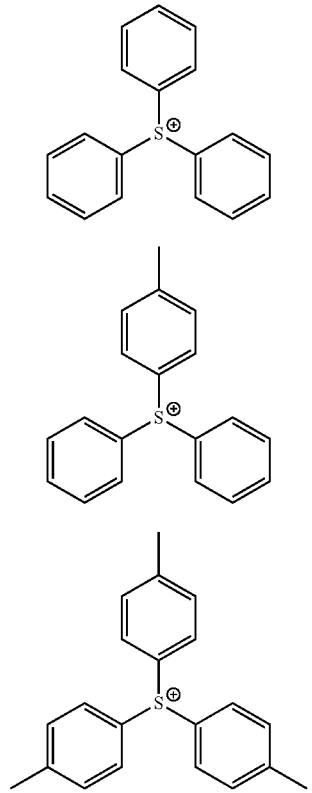

(ca-1-2)

(ca-1-3)

(ca-1-4)

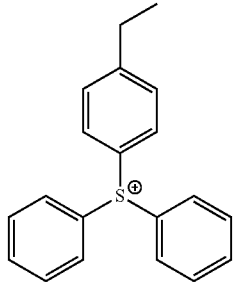

(ca-1-5)

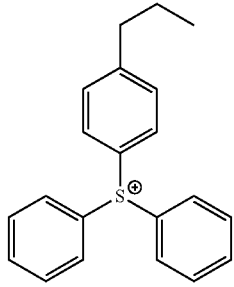

(ca-1-6)

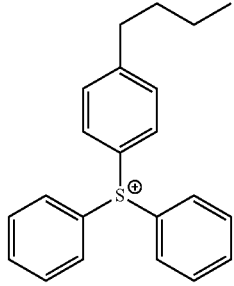

(ca-1-7)

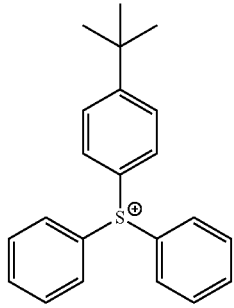

(ca-1-8)

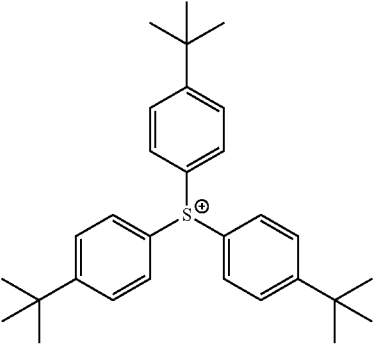

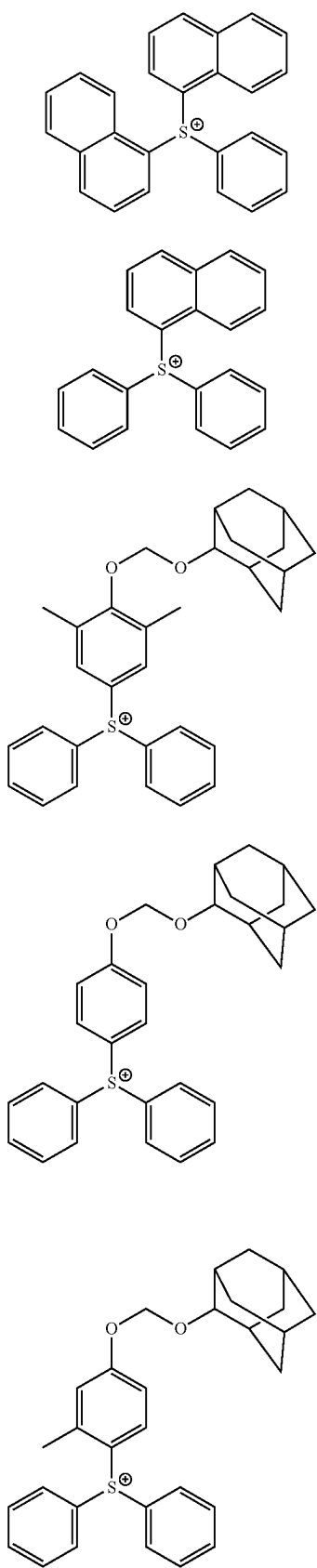
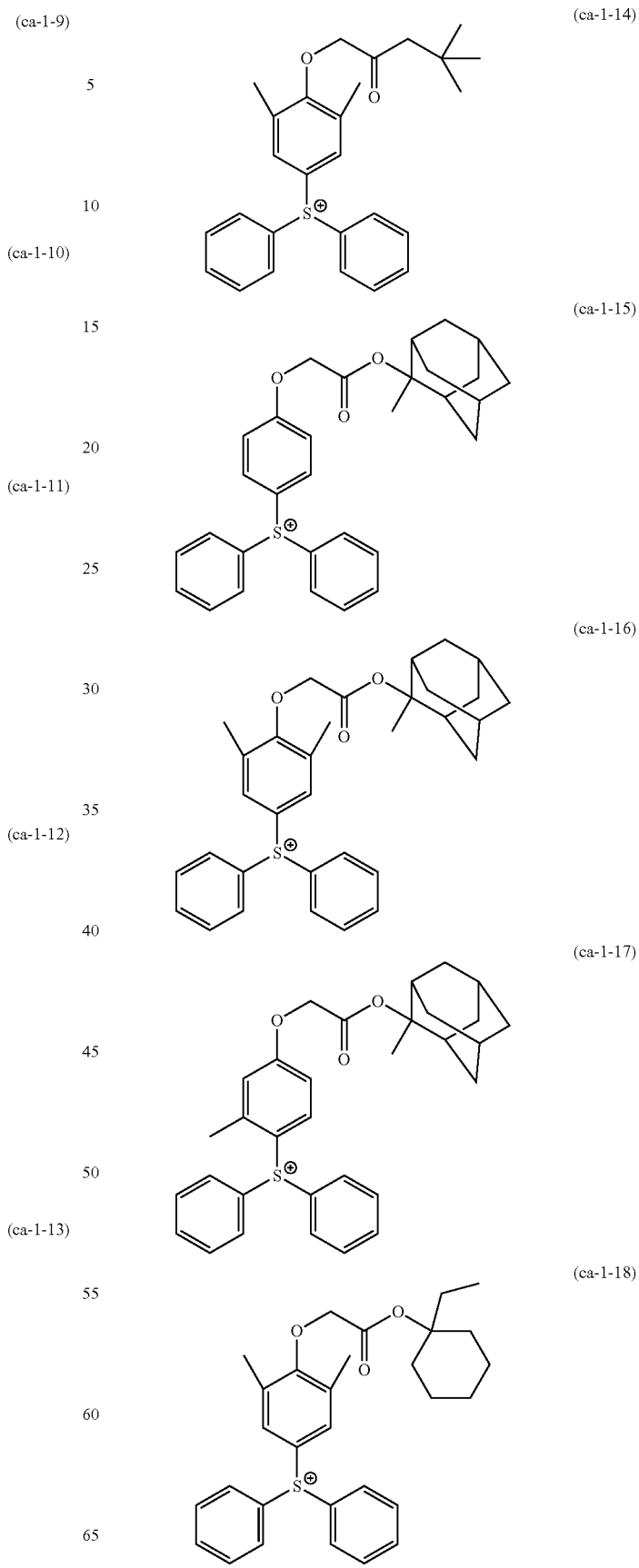

(ca-1-19)
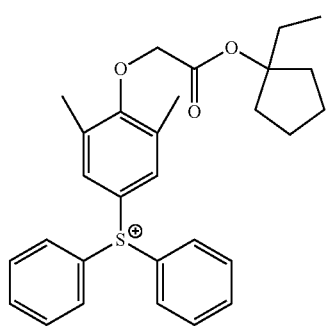
(ca-1-20)
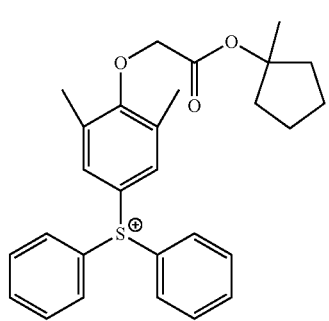
(ca-1-21)
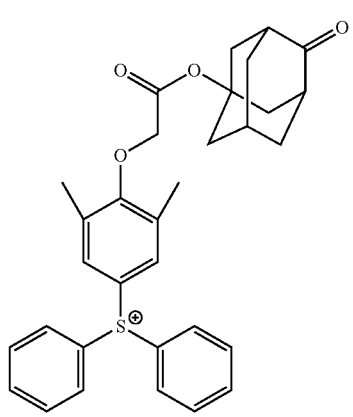
(ca-1-22)
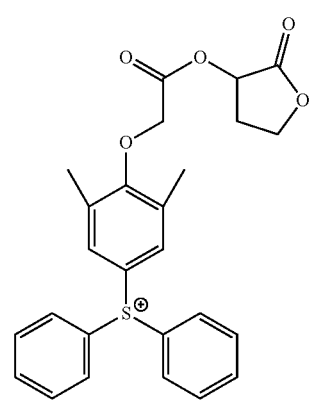
(ca-1-23)
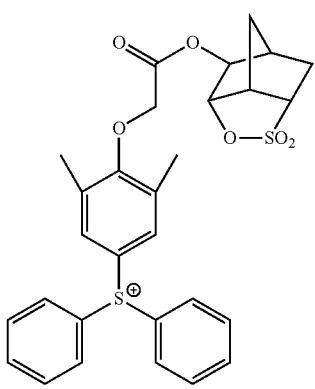
(ca-1-24)
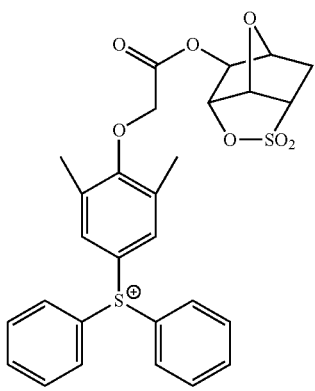
(ca-1-25)
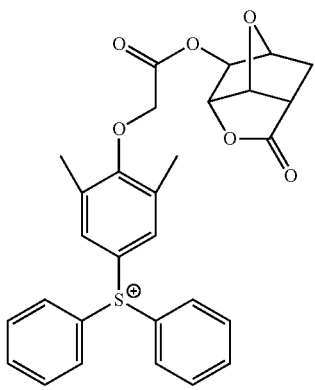
(ca-1-26)
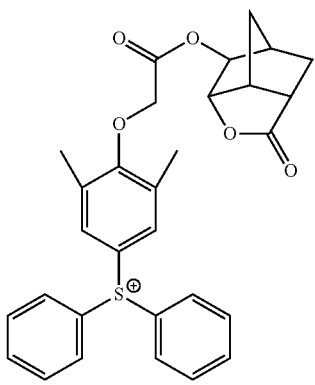

(ca-1-27) 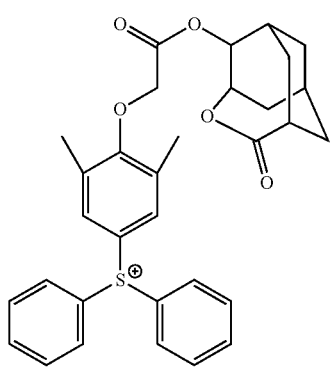
(ca-1-28) 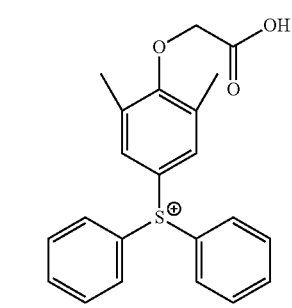
(ca-1-29) 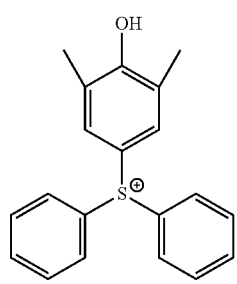
(ca-1-30) 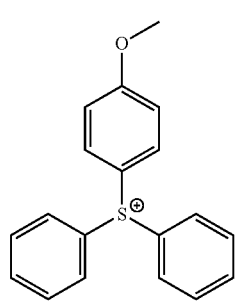
(ca-1-31) 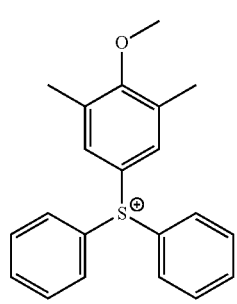
(ca-1-32) 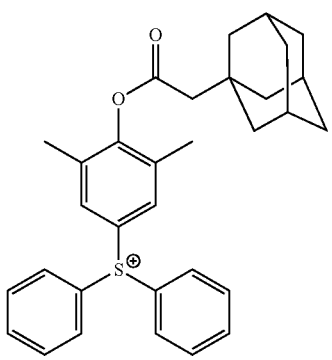
(ca-1-33) 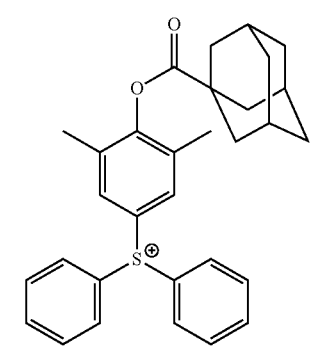
(ca-1-34) 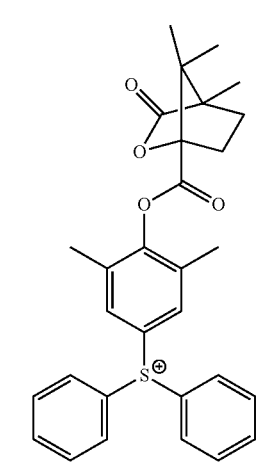
(ca-1-35) 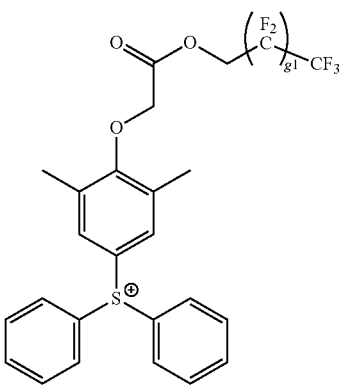

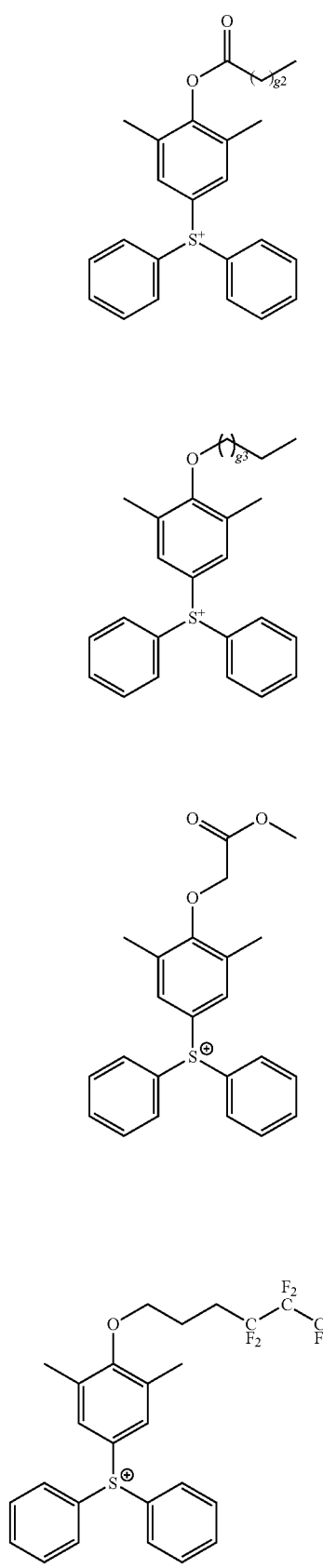
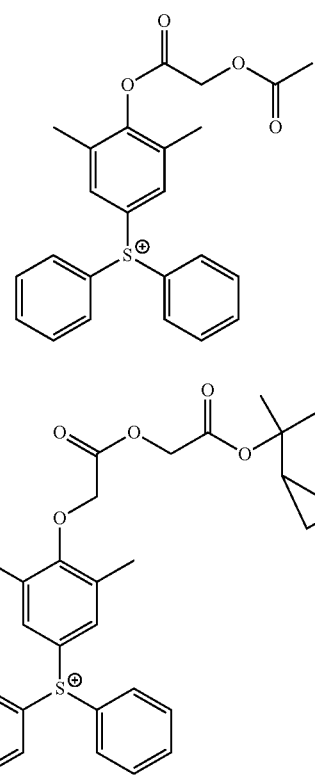
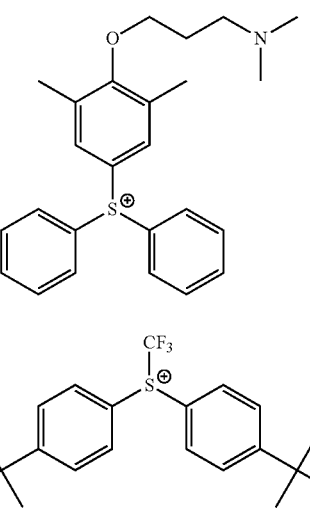
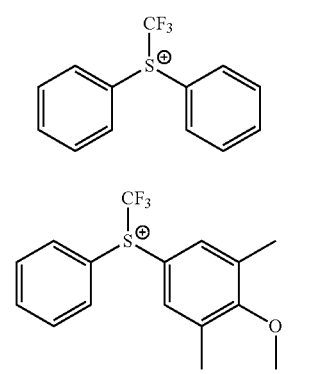

-continued
(ca-1-46) 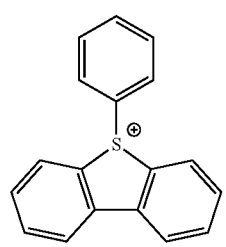
(ca-1-47)
(ca-1-48)
(ca-1-49) 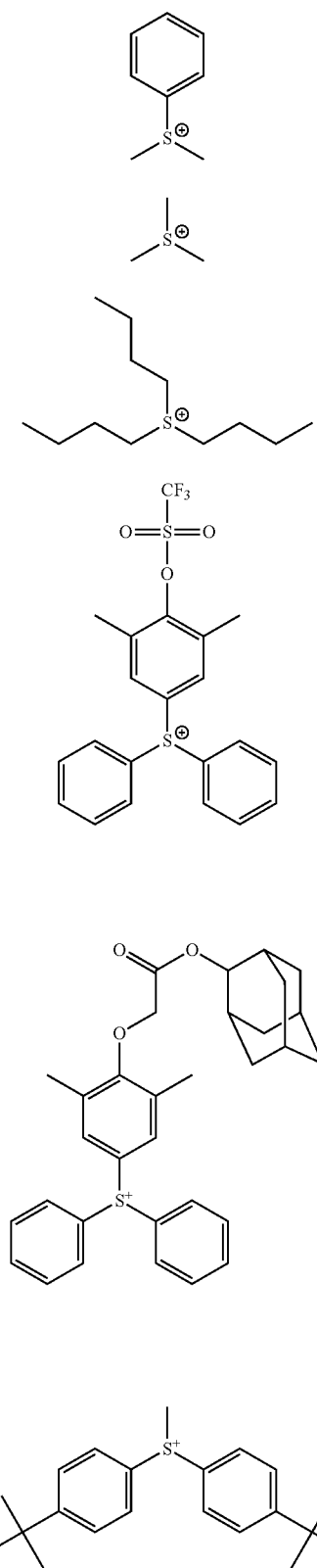
(ca-1-50)
(ca-1-51) 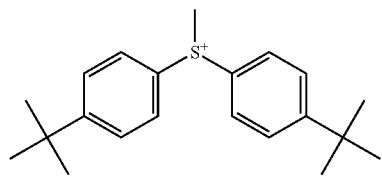
(ca-1-52) 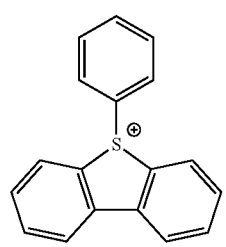
(ca-1-53) 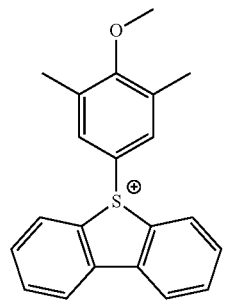
(ca-1-54) 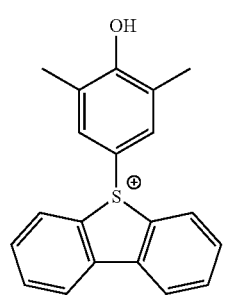
(ca-1-55) 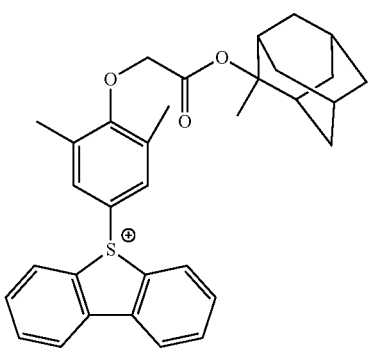
(ca-1-56) 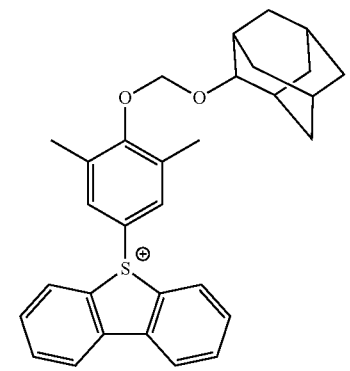
In the formulae, g1, g2 and g3 represent recurring numbers, wherein g1 is an integer of 1 to 5, g2 is an integer of 0 to 20, and g3 is an integer of 0 to 20.

(ca-1-57)
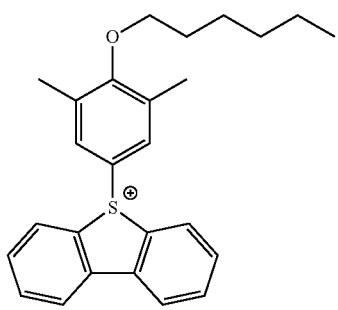
(ca-1-58)
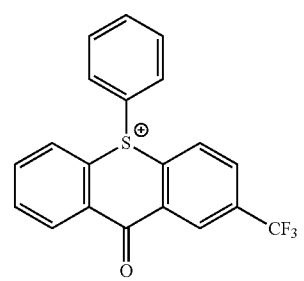
(ca-1-59)
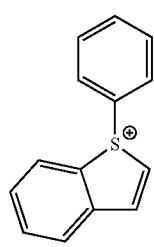
(ca-1-60)
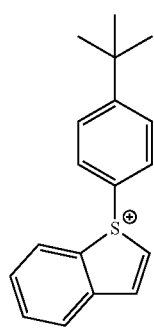
(ca-1-61)
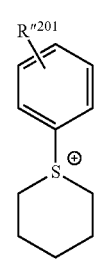
(ca-1-62)
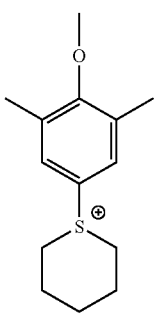
(ca-1-63)
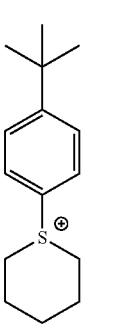
(ca-1-64)
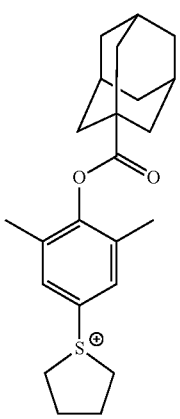
(ca-1-65)
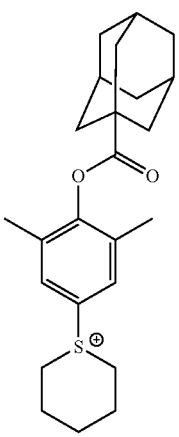

(ca-1-66)

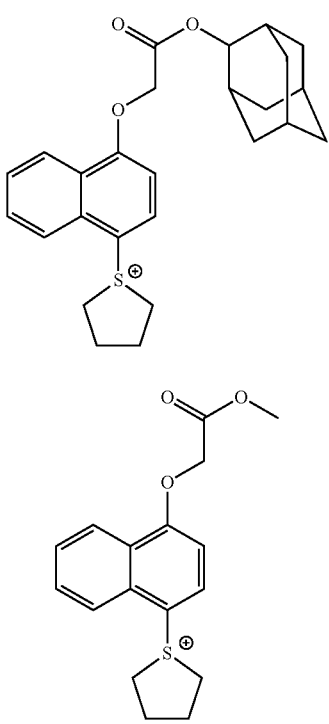

(ca-1-67)

(ca-3-4)

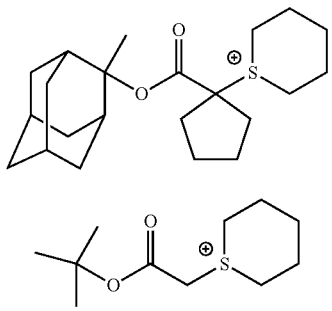

(ca-3-5)

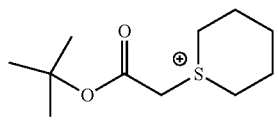

(ca-3-6)

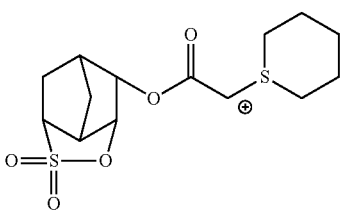

Specific examples of preferable cations represented by formula (ca-4) include cations represented by formulae (ca-4-1) and (ca-4-2) shown below.

(ca-4-1)

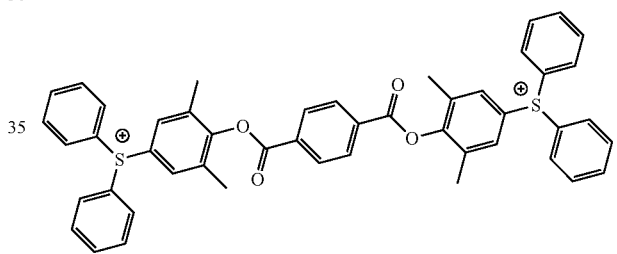

In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by the formula (ca-2) include a diphenyliodonium cation and a bis(4-tert-butylphenyl)iodonium cation.

Specific examples of preferable cations represented by formula (ca-3) include cations represented by formulae (ca-3-1) to (ca-3-6) shown below.

(ca-4-2)

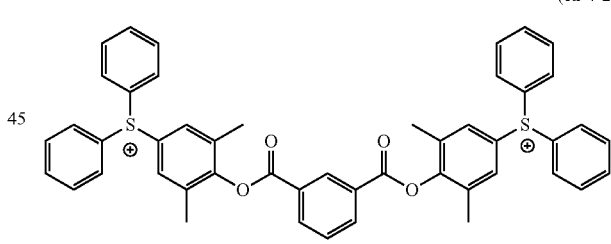

(ca-3-1)

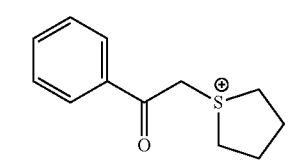

(ca-3-2)

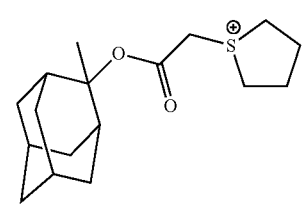

(ca-3-3)

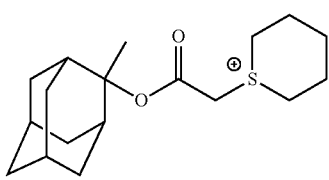

Among the above examples, as the cation moiety $[(M'^{m+})_{l/m}]$, a cation represented by general formula (ca-1) is preferable, and a cation represented by any one of formulae (ca-1-1) to (ca-1-67) is more preferable.

As the component (B), one type of these acid generators may be used alone, or two or more types may be used in combination.

When the resist composition contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight.

When the amount of the component (B) is within the above-mentioned range, formation of a resist pattern can be satisfactorily performed. Further, by virtue of the above-mentioned range, when each of the components is dissolved in an organic solvent, a homogeneous solution may be more reliably obtained and the storage stability of the resist composition becomes satisfactory.

[Component (D): Acid Diffusion Control Agent]

The resist composition of the present embodiment may include an acid diffusion control agent component (hereafter, frequently referred to as "component (D)"), in addition to the component (A), or in addition to the component (A) and the component (B).

The component (D) functions as an acid diffusion control agent, i.e., a quencher which traps the acid generated in the resist composition upon exposure. The component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

Component (D1)

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions of the resist film, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

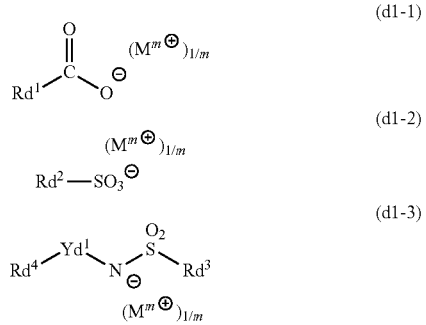

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; m represents an integer of 1 or more; and each $M^{m+}$ independently represents an organic cation having a valency of m.

{Component (d1-1)}

Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

Among these, as the group for $Rd^1$, an aromatic hydrocarbon group which may have a substituent, an aliphatic cyclic group which may have a substituent and a chain-like alkyl group which may have a substituent are preferable. Examples of the substituent for these groups include a hydroxyl group, an oxo group, an alkyl group, an aryl group, a fluorine atom, a fluorinated alkyl group, a lactone-containing cyclic group represented by any one of the aforementioned formulae (a2-r-1) to (a2-r-7), an ether bond, an ester bond, and a combination thereof. In the case where an ether bond or an ester bond is included as the substituent, the substituent may be bonded via an alkylene group, and a linking group represented by any one of the aforementioned formulae (y-a1-1) to (y-a1-5) is preferable as the substituent.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is particularly desirable.

Specific examples of preferable anion moieties for the component (d1-1) are shown below.

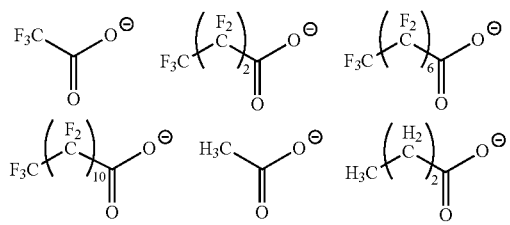

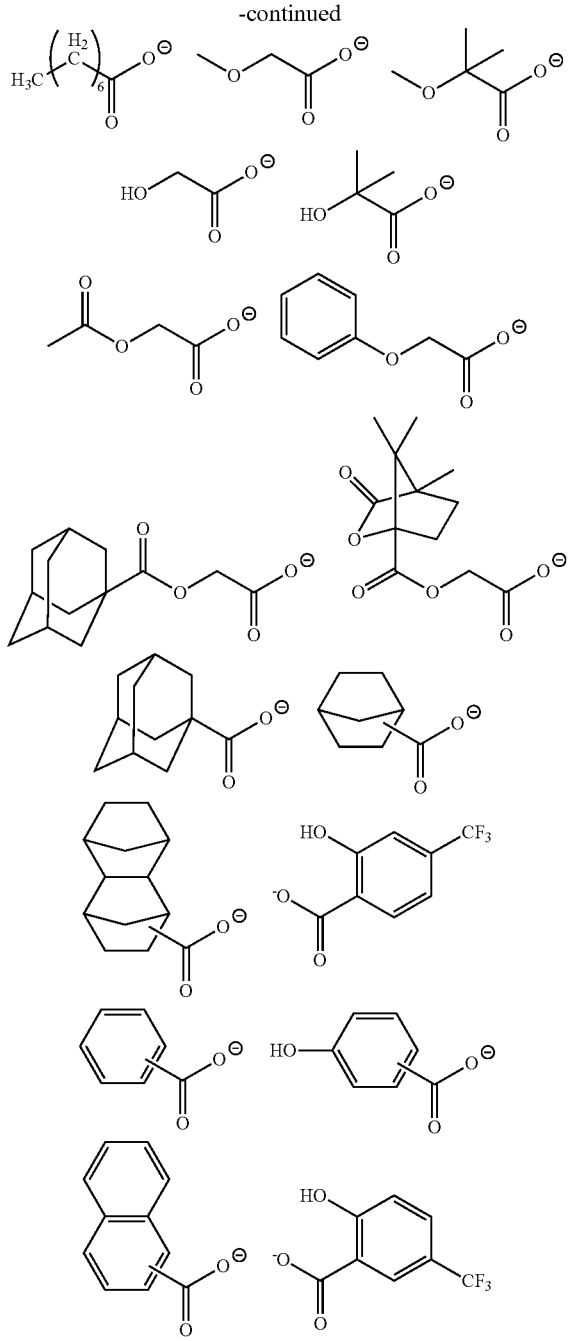

{Component (d1-2)}

Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

However, the carbon atom adjacent to the sulfur atom within $Rd^2$ group has no fluorine atom bonded thereto (i.e., the carbon atom adjacent to the sulfur atom within $Rd^2$ group is not substituted with fluorine). As a result, the anion of the component (d1-2) becomes an appropriately weak acid anion, thereby improving the quenching ability of the component (D).

As $Rd^2$, a chain-like alkyl group which may have a substituent or an aliphatic cyclic group which may have a substituent is preferable. The chain-like alkyl group preferably has 1 to 10 carbon atoms, and more preferably 3 to 10 carbon atoms. As the aliphatic cyclic group, a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic cyclic group, chain-like alkyl group) for Rd' in the formula (d1-1) can be mentioned.

Specific examples of preferable anion moieties for the component (d1-2) are shown below.

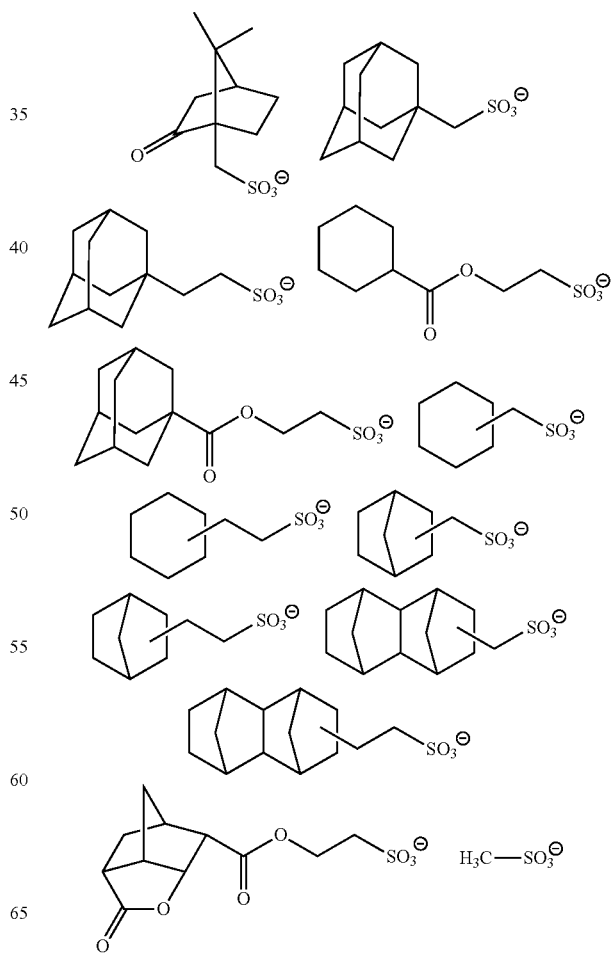

Cation Moiety

In formula (d1-1), $M^{m+}$ represents an organic cation having a valency of m.

As the organic cation for $M^{m+}$, for example, the same cation moieties as those represented by the aforementioned formulae (ca-1) to (ca-4) are preferable, cation moieties represented by the aforementioned general formulae (ca-1) is preferable, and cation moieties represented by the aforementioned formulae (ca-1-1) to (ca-1-67) are still more preferable.

As the component (d1-1), one type of compound may be used, or two or more types of compounds may be used in combination.

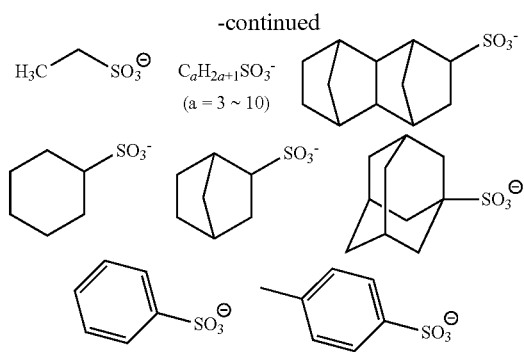

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}

Anion Moiety

In the formula (d1-3), $Rd^3$ represents a cyclic group which may have a substituent, a chain-like alkyl group which may have a substituent or a chain-like alkenyl group which may have a substituent, and is the same groups as those defined above for $R^{101}$ in the aforementioned formula (b-1), and a cyclic group containing a fluorine atom, a chain-like alkyl group or a chain-like alkenyl group is preferable. Among these, a fluorinated alkyl group is preferable, and more preferably the same fluorinated alkyl groups as those described above for $Rd^1$.

In the formula (d1-3), $Rd^4$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxyl group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for $R^{101}$ in the aforementioned formula (b-1) can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ in the aforementioned formula (b-1) can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. The divalent linking groups are the same as defined for the divalent hydrocarbon group which may have a substituent and the divalent linking group containing a hetero atom explained above as the divalent linking group for $Ya^0$ in the aforementioned formula (a0-1).

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

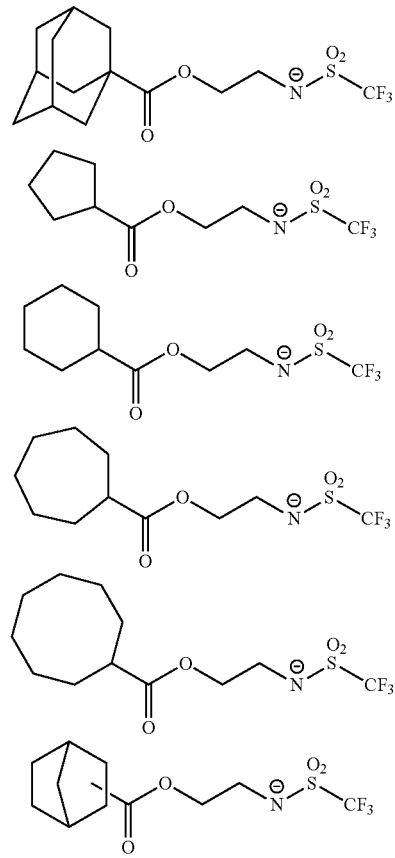

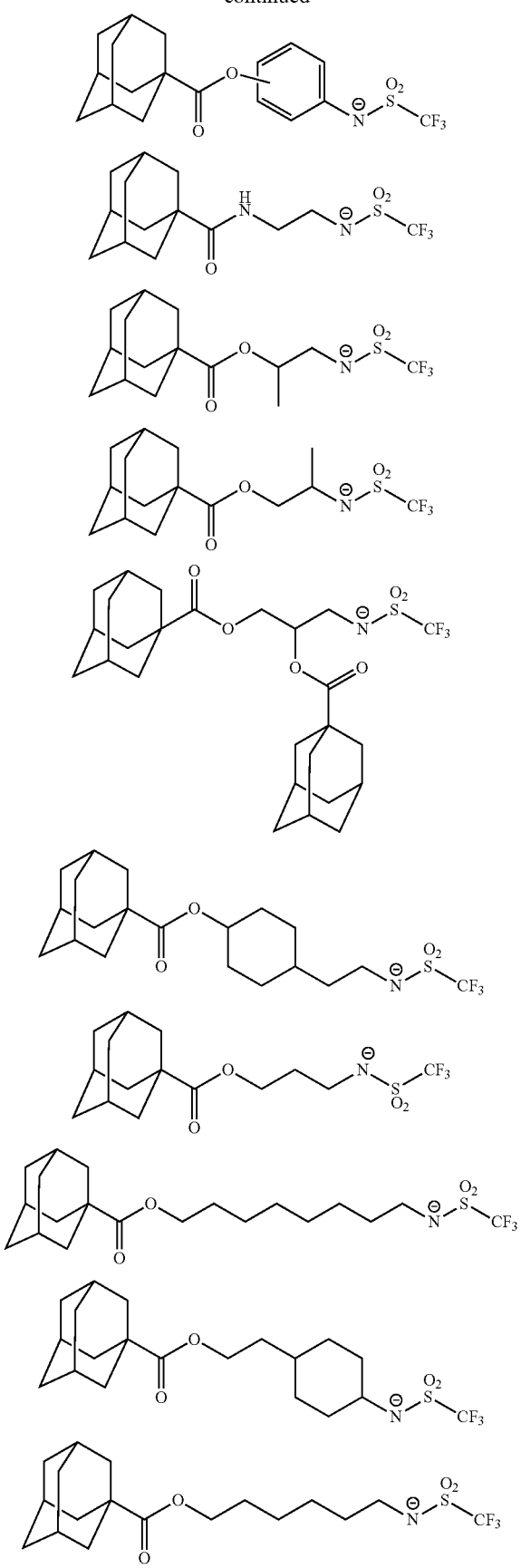
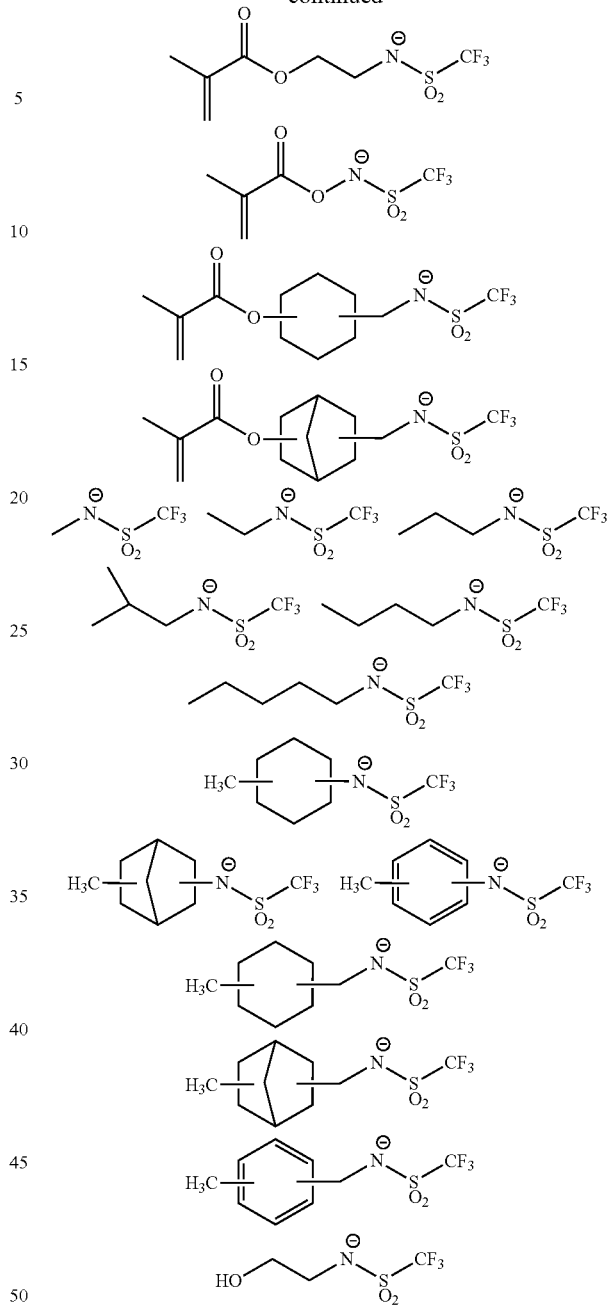

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

When the resist composition contains the component (D1), the amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be more reliably obtained. On the other hand, when the amount of the component (D1) is no more than the upper limit of the above-mentioned range, sensitivity can be maintained at a satisfactory level, and through-put becomes excellent.

Production Method of Component (D1):

The production methods of the components (d1-1) and (d1-2) are not particularly limited, and the components (d1-1) and (d1-2) can be produced by conventional methods.

Further, the production method of the component (d1-3) is not particularly limited, and the component (d1-3) can be produced in the same manner as disclosed in US2012-0149916.

Component (D2)

The acid diffusion control component may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine is preferable, and a secondary aliphatic amine or tertiary aliphatic amine is more preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy) ethyl}amine, tris{2-(2-methoxyethoxymethoxy) ethyl}amine, tris{2-(1-methoxyethoxy)ethyl}amine, tris{2-(1-ethoxyethoxy)ethyl}amine, tris{2-(1-ethoxypropoxy) ethyl}amine, tris[2-[2-(2-hydroxyethoxy)ethoxy]ethyl] amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D2), one type of compound may be used alone, or two or more types may be used in combination.

When the resist composition contains the component (D2), the amount of the component (D2) is typically used in an amount within a range from 0.01 to 5 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

[Component (E): At Least One Compound Selected from the Group Consisting of Organic Carboxylic Acids, and Phosphorus Oxo Acids and Derivatives Thereof]

Furthermore, in the resist composition of the present embodiment, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

When the resist composition contains the component (E), the amount of the component (E) is typically used in an amount within a range from 0.01 to 5 parts by weight, relative to 100 parts by weight of the component (A).

[Component (F): Fluorine Additive]

The resist composition of the present embodiment may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of the structural unit (f1) and the aforementioned structural unit (a1); and a copolymer of the structural unit (f1), a structural unit derived from acrylic acid or methacrylic acid and the aforementioned structural unit (a1) are preferable. As the structural unit (a1) to be copolymerized with the structural unit (f1), a structural unit derived from 1-ethyl-1-cyclooctyl(meth)acrylate is preferable.

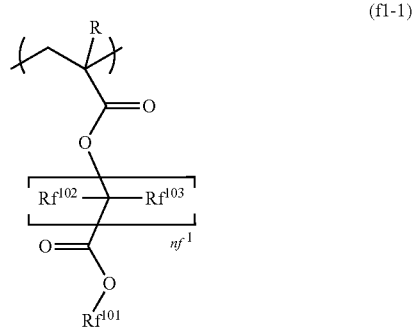

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In the formula (f1-1), R bonded to the carbon atom on the α-position is the same as defined above. As R, a hydrogen atom or a methyl group is preferable.

In the formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable.
Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these examples, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In the formula (f1-1), $nf^1$ represents an integer of 1 to 5, preferably an integer of 1 to 3, and more preferably 1 or 2.

In the formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, —CH$_2$—CF$_3$, —CH$_2$—CF$_2$—CF$_3$, —CH(CF$_3$)$_2$, —CH$_2$—CH$_2$—CF$_3$, and —CH$_2$—CH$_2$—CF$_2$—CF$_2$—CF$_2$—CF$_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

When the resist composition contains the component (F), the component (F) is used in an amount within a range from 0.5 to 10 parts by weight, relative to 100 parts by weight of the component (A).

If desired, other miscible additives can also be added to the resist composition of the present embodiment. Examples of such miscible additives include additive resins for improving the performance of the resist film, dissolution inhibitors, plasticizers, stabilizers, colorants, halation prevention agents, and dyes.

[Component (S): Organic Solvent]

The resist composition of the present embodiment can be prepared by dissolving the resist materials for the resist composition in an organic solvent (hereafter, frequently referred to as "component (S)").

The component (S) may be any organic solvent which can dissolve the respective components to give a homogeneous solution, and any organic solvent can be appropriately selected from those which have been conventionally known as solvents for a chemically amplified resist composition.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkyl ether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

The component (S) can be used individually, or in combination as a mixed solvent.

Among these, PGMEA, PGME, γ-butyrolactone, EL and cyclohexanone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate. In general, the component (S) is used in an amount such that the solid content of the resist composition becomes within the range from 1 to 20% by weight, and preferably from 2 to 15% by weight.

The aforementioned resist composition of the present invention includes, as a base resin, a polymeric compound (A1) having, on a side chain thereof, a structural unit (a0) which has a "polycyclic group $Ra_0$ having a bridged ring polycyclic skeleton or a condensed ring polycyclic skeleton, which has in its skeleton —C(=O)O— or —SO$_2$—, and at least one substituent selected from the group consisting of an alkyl group, an alkoxy group, a halogen atom and a halogenated alkyl group", and a structural unit (a2m) containing a lactone-containing polycyclic group, a —SO$_2$-containing polycyclic group or a carbonate-containing polycyclic group.

By using such a structural unit (a0), in the formation of a resist pattern during the developing, the difference in solubility to the developing solution between the exposed regions and the unexposed regions becomes remarkable, and hence, it becomes easy to sufficiently increase the dissolution contrast between the exposed portions and the unexposed portions. On the other hand, conventionally, there was a tendency that the glass translation temperature (Tg) of the base resin decreases relatively. In the present invention, by introducing the structural units (a0) and (a2m) in combination into the base resin, the lowering of Tg is suppressed and the ability of controlling of acid diffusion during the formation of a resist pattern can be improved.

That is, the resist composition of the present invention is advantageous not only in that the aforementioned effect due to the use of the structural unit (a0) can be obtained, but also in that, due to the synergic effect of the combination of the structural units (a0) and (a2m), the resolution is improved and the pattern collapse can be prevented, thereby enabling the reproduction of patterns of more minute dimensions. In addition, the lithography properties are improved, and a resist pattern may be formed with an excellent shape.

<<Method of Forming a Resist Pattern>>

The method of forming a resist pattern according to the second aspect of the present invention includes: forming a resist film on a substrate using a resist composition according to the first aspect of the present invention; exposing the resist film; and developing the exposed resist film to form a resist pattern.

The method for forming a resist pattern according to the present embodiment can be performed, for example, as follows.

Firstly, a resist composition of the first aspect is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Subsequently, the resist film is selectively exposed, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern.

Then, baking treatment (post exposure baking (PEB)) is conducted on the exposed resist film under temperature conditions of 80 to 150° C. for 40 to 120 seconds, and preferably 60 to 90 seconds.

Next, the resist film which has been subjected to the baking treatment (PEB) is subjected to a developing treatment. The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing.

In this manner, a positive-tone resist pattern or a negative-tone resist pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The method of forming a resist pattern according to the present embodiment is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable.

Examples of these perfluoroalkyl compounds include perfluoroalkylether compounds and perfluoroalkylamine compounds. One example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A1) (prior to exposure). Specific examples of the organic solvent include polar solvents such as ketone solvents, ester solvents, alcohol solvents, nitrile solvents, amide solvents and ether solvents, and hydrocarbon solvents.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxyl group within the structure thereof, and an "alcoholic hydroxyl group" refers to a hydroxyl group bonded to a carbon atom of an aliphatic hydrocarbon group. A nitrile solvent is an organic solvent containing a nitrile group in the structure thereof. An amide solvent is an organic solvent containing an amide group within the structure thereof. An ether solvent is an organic solvent containing C—O—C within the structure thereof Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

Among these examples, as the organic solvent contained in the organic developing solution, a polar solvent is preferable, and ketone solvents, ester solvents and nitrile solvents are preferable. Specific examples of each solvent are shown below.

Examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenyl acetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone).

As a ketone solvent, methyl amyl ketone (2-heptanone) is preferable.

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

As an ester solvent, butyl acetate is preferable.

Examples of nitrile solvents include acetonitrile, propionitrile, valeronitrile, butyronitrile and the like.

If desired, the organic developing solution may have a conventional additive blended. Examples of the additive include surfactants. The surfactant is not particularly limited, and for example, an ionic or non-ionic fluorine and/or silicon surfactant can be used.
As the surfactant, a non-ionic surfactant is preferable, and a fluorine surfactant or a silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing treatment in the case of a solvent developing process, any of the aforementioned organic solvents contained in the organic developing solution can be used which hardly dissolves the resist pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

The alcohol solvent used for the rinse liquid is preferably a monohydric alcohol of 6 to 8 carbon atoms, and the monohydric alcohol may be linear, branched or cyclic.

Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1 hexanol and 2-hexanol are more preferable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

<<Polymeric Compound>>

The polymeric compound of the third aspect of the present invention comprises a structural unit (a0) represented by general formula (a0-1) shown below and a polycyclic group-containing structural unit (a2m) other than the structural unit (a0), the structural unit (a2m) containing a lactone-containing polycyclic group, a —SO$_2$-containing polycyclic group or a carbonate-containing polycyclic group:

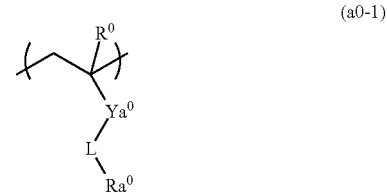

(a0-1)

wherein R$^0$ represents a hydrocarbon group of 1 to 6 carbon atoms which may have a substituent, or a hydrogen atom; Ya$^0$ represents a single bond or a divalent linking group; L represents an ester bond; and Ra$^0$ represents a polycyclic group having a bridged ring polycyclic skeleton or a condensed ring polycyclic skeleton, which has in its skeleton —C(=O)O— or —SO$_2$—, and at least one substituent selected from the group consisting of an alkyl group, an alkoxy group, a halogen atom and a halogenated alkyl group.

In the polymeric compound of the present invention, it is preferred that Ra$^0$ in the general formula (a0-1) is at least one polycyclic group selected from the group consisting of a polycyclic group represented by general formula (a0-r-1)

shown below, a polycyclic group represented by general formula (a0-r-2) shown below, a polycyclic group represented by general formula (a0-r-3) shown below, a polycyclic group represented by general formula (a0-r-4) shown below, a polycyclic group represented by general formula (a0-r-5) shown below, a polycyclic group represented by general formula (a0-r-6), and a polycyclic group represented by general formula (a0-r-7) shown below:

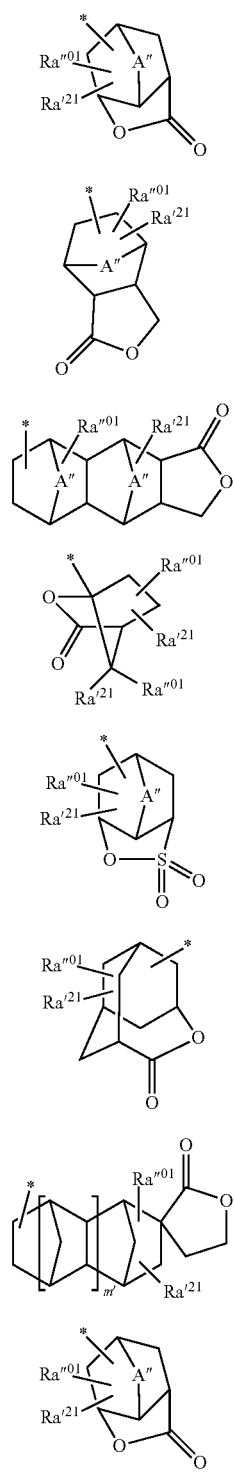

(a0-r-1)
(a0-r-2)
(a0-r-3)
(a0-r-4)
(a0-r-5)
(a0-r-6)
(a0-r-7)
(a0-r-1)

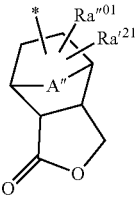 (a0-r-2)

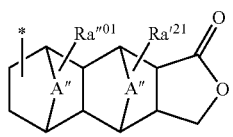 (a0-r-3)

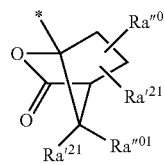 (a0-r-4)

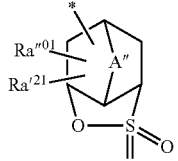 (a0-r-5)

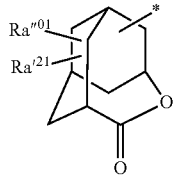 (a0-r-6)

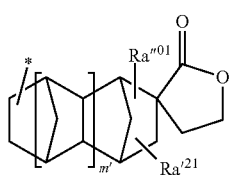 (a0-r-7)

wherein each $Ra''^{01}$ independently represents an alkyl group, an alkoxy group, a halogen atom and a halogenated alkyl group; each $Ra'^{21}$ independently represents a hydrogen atom, an alkyl group, an alkoxy group, a halogen atom, a halogenated alkyl group, a hydroxyl group, —$COOR_0''$, —$OC(=O)R_0''$, a hydroxyalkyl group or a cyano group; $R_0''$ represents a hydrogen atom, an alkyl group, a lactone-containing cyclic group, a carbonate-containing cyclic group or a —$SO_2$-containing cyclic group; each A" independently represents an oxygen atom, a sulfur atom, or an alkylene group of 1 to 5 carbon atoms with or without an oxygen atom or a sulfur atom; m' represents 0 or 1; and * each represents a valence bond.

In the present invention, it is preferable that the polymeric compound further include a structural unit (a1) containing an acid decomposable group which exhibits increased polarity by the action of acid, in addition to the aforementioned structural units (a0) and (a2m).

The polymeric compound according to the present embodiment is the same as defined for the component (A1) (polymeric compound including a structural unit (a0) and a structural unit (a2m)) described above in relation to the resist composition of the first aspect, and the kind of each structural unit, the amount of each structural unit and the like are the same as defined above for the component (A1).

The polymeric compounds according to the third aspect is obtainable, for example, by dissolving the monomers corresponding with each of the structural units in a polymerization solvent, followed by addition of a radical polymerization initiator such as azobisisobutyronitrile (AIBN) or dimethyl azobisisobutylate (e.g., V-601). Furthermore, in the polymeric compound, by using a chain transfer agent such as HS—CH$_2$—CH$_2$—CH$_2$—C(CF$_3$)$_2$—OH, —C(CF$_3$)$_2$—OH group can be introduced at the terminals of the polymeric compound. Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The polymeric compound of the present embodiment is a novel compound useful as a base resin of a resist composition, and may be preferably blended with a resist composition as a base component (component (A1)) having a film-forming ability and exhibiting a changed solubility in a developing solution by the action of acid.

EXAMPLES

As follows is a description of examples of the present invention, although the scope of the present invention is by no way limited by these examples.

In the following examples, a compound represented by a chemical formula (1) is designated as "compound (1)", and the same applies for compounds represented by other chemical formulae.

<Production of Polymeric Compound>

Example 1

In a separable flask equipped with a thermometer, a reflux tube and a nitrogen feeding pipe, 27.90 g of a mixture of propylene glycol monomethyl ether acetate (PM) and methyl ethyl ketone (MEK) (PM/MEK weight ratio=50/50) was added, and heated to 80° C., to thereby obtain a mixed solvent.

Separately from the above, 15.00 g (58.07 mmol) of a compound (2m1), 13.67 g (49.44 mmol) of a compound (1cm1), 17.43 g (44.18 mmol) of a compound (1s1), 7.20 g (30.46 mmol) of a compound (31), 9.31 g (30.00 mmol) of a compound (O1) were dissolved into 78.91 g of the mixed solvent of PM/MEK (weight ratio=50/50), into which was dissolved 4.152 g (18.03 mmol) of dimethyl azobisisobutylate (e.g., V-601) as a polymerization initiator, to thereby obtain a monomer mixture solution.

The resultant was dropwise added to the aforementioned mixed solvent heated to 80° C. in a nitrogen atmosphere over 4 hours. The resulting reaction solution was heated while stirring for 2 hours, and then cooled to room temperature.

The obtained polymerization reaction liquid was dropwise added to an excess amount of a heptane/ethyl acetate mixture to precipitate a polymer. Thereafter, the precipitated white powder was separated, followed by washing with an excess amount of a heptane/ethyl acetate mixture and drying, so as to obtain 37.9 g of a polymeric compound (A1-1) as an objective compound (yield: 72.1%).

With respect to the polymeric compound (A1-1), the weight average molecular weight (Mw) and the dispersity (Mw/Mn) were determined in terms of the polystyrene equivalent value as measured by gel permeation chromatography (GPC). As a result, it was found that the weight average molecular weight was 91,000, and the dispersity was 1.68. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n/o/p=30.2/20.1/19.3/15.2/15.2.

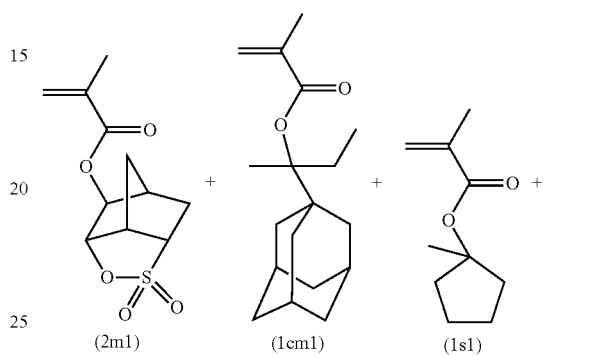

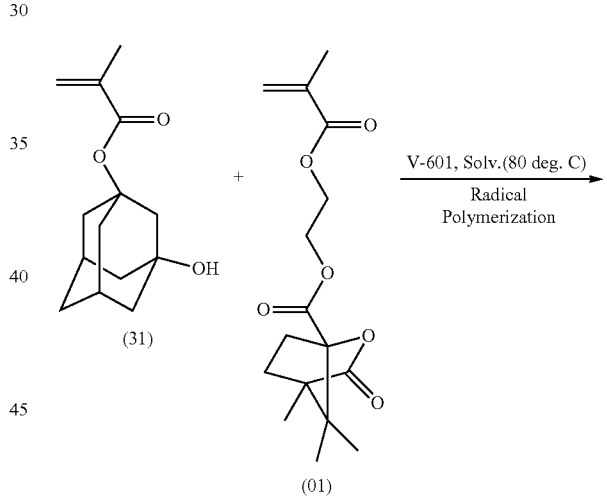

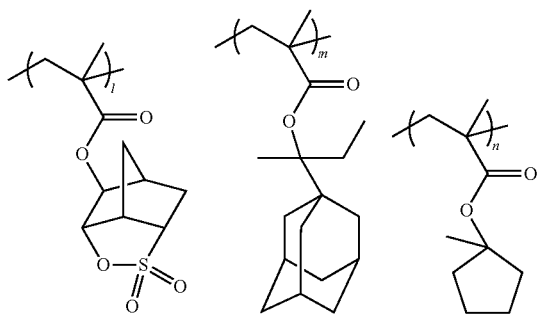

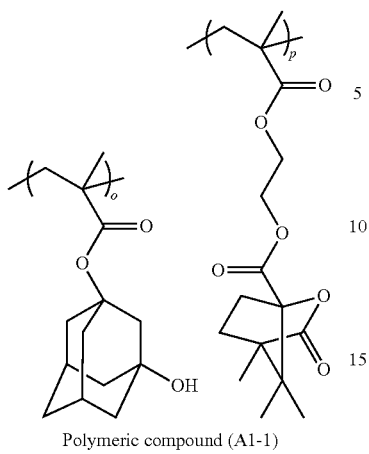

Polymeric compound (A1-1)

Examples 2 to 17, Comparative Examples 1 to 6

Polymeric compounds (A1-1) to (A1-17) and (A2-1) to (A2-6) were produced in the same manner as in Example 1, except that the following monomers corresponding to the structural units constituting each polymeric compound were used with a predetermined molar ratio.

With respect to the obtained polymeric compounds (A1-1) to (A1-17) and (A2-1) to (A2-6), the compositional ratio (the molar ratio of the respective structural units in the polymeric compounds) as determined by $^{13}$C-NMR, and the weight average molecular weight (Mw) and the molecular weight dispersity (Mw/Mn) determined in terms of the polystyrene equivalent value as measured by GPC are shown in Table 1.

(2m1)
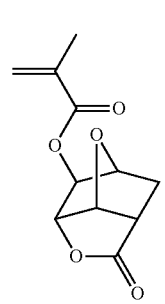

(2m2)
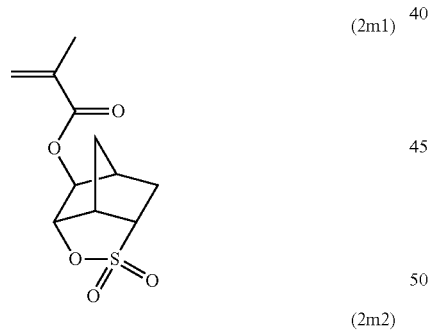

(2m3)
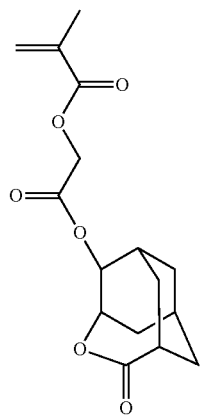

(2m4)
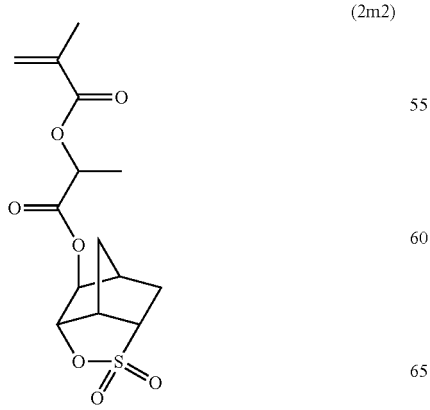

(2m5)
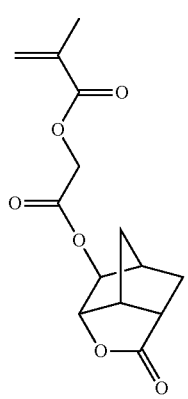

(2m6)
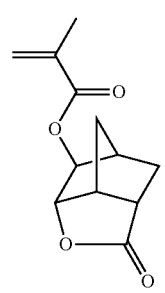

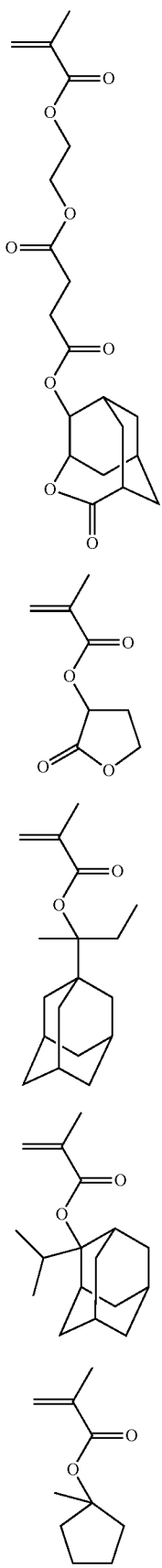
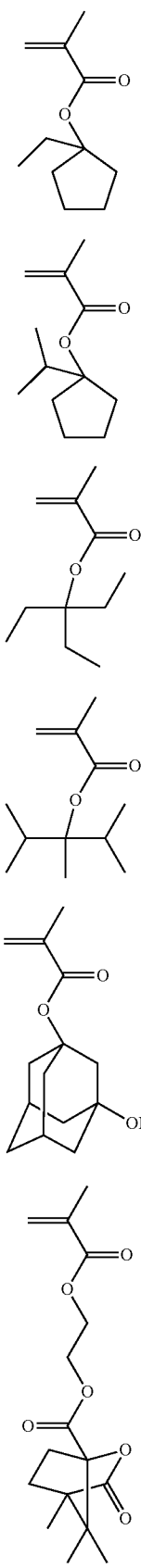

TABLE 1

| | Polymeric compound | Copolymer composition rate (ratio of structural units (molar ratio)) | Mw | Mw/Mn |
|---|---|---|---|---|
| Ex. 1 | A1-1 | (2m1)/(1cm1)/(1s1)/(31)/(01) = 30.2/20.1/19.3/15.2/15.2 | 9100 | 1.68 |
| Ex. 2 | A1-2 | (2m2)/(1cm1)/(1c1)/(31)/(01) = 19.8/20.2/20.3/19.3/20.4 | 9700 | 1.72 |
| Ex. 3 | A1-3 | (2m3)/(1m1)/(1s2)/(31)/(01) = 31.5/18.9/19.0/14.9/15.7 | 10600 | 1.82 |
| Ex. 4 | A1-4 | (2m4)/(1cm1)/(1c2)/(31)/(01) = 29.5/20.6/20.5/14.2/15.2 | 8700 | 1.66 |
| Ex. 5 | A1-5 | (2s1)/(2m1)/(1cm1)/(1c1)/(31)/(01) = 18.6/9.4/20.3/22.2/15.0/14.5 | 10200 | 1.64 |
| Ex. 6 | A1-6 | (2m4)/(1m1)/(1s3)/(31)/(01) = 31.5/18.9/19.0/14.9/15.7 | 10600 | 1.82 |
| Ex. 7 | A1-7 | (2s1)/(2m3)/(1cm1)/(1s2)/(31)/(01) = 19.1/10.3/20.6/20.2/9.6/20.2 | 10000 | 1.76 |
| Ex. 8 | A1-8 | (2s1)/(2m3)/(2m2)/(1cm1)/(1c2)/(01) = 21.1/10.3/20.6/19.2/18.9/9.9 | 10100 | 1.60 |
| Ex. 9 | A1-9 | (2s1)/(2m5)/(1m1)/(1s1)/(31)/(01) = 20.0/10.5/19.8/19.6/14.9/15.2 | 10100 | 1.77 |
| Ex. 10 | A1-10 | (2m4)/(1cm1)/(1c2)/(31)/(01) = 20.1/20.2/21.2/19.4/19.1 | 8900 | 1.62 |
| Ex. 11 | A1-11 | (2s1)/(2m6)/(1cm1)/(1s2)/(31)/(01) = 21.2/10.3/20.1/18.5/10.4/19.5 | 10300 | 1.61 |
| Ex. 12 | A1-12 | (2s1)/(2m4)/(1m1)/(1s1)/(31)/(01) = 19.7/10.7/19.2/20.0/20.1/10.3 | 10500 | 1.78 |
| Ex. 13 | A1-13 | (2s1)/(2m5)/(1m1)/(1c1)/(31)/(01) = 20.7/10.8/19.4/18.1/15.3/15.7 | 9300 | 1.71 |
| Ex. 14 | A1-14 | (2m3)/(1c2)/(1c1)/(31)/(01) = 30.3/19.5/19.4/15.3/15.5 | 9900 | 1.65 |
| Ex. 15 | A1-15 | (2m6)/(2m2)/(1s1)/(1s3)/(31)/(01) = 19.8/9.7/20.1/20.3/15.0/15.1 | 10200 | 1.76 |
| Ex. 16 | A1-16 | (2m7)/(1cm1)/(1m1)/(31)/(01) = 30.8/19.6/19.8/14.2/15.6 | 9700 | 1.81 |
| Ex. 17 | A1-17 | (2m1)/(1c1)/(1s2)/(31)/(01) = 29.8/19.1/20.3/15.4/15.4 | 9500 | 1.69 |
| Comp. Ex. 1 | A2-1 | (2s1)/(1cm1)/(1s3)/(31)/(01) = 19.8/20.0/20.4/20.1/19.7 | 9600 | 1.70 |
| Comp. Ex. 2 | A2-2 | (2s1)/(1cm1)/(1s2)/(31)/(01) = 29.7/20.0/21.5/13.8/15.0 | 10000 | 1.64 |
| Comp. Ex. 3 | A2-3 | (2s1)/(1m1)/(1s1)/(31)/(01) = 28.8/17.8/21.1/15.5/16.8 | 10400 | 1.68 |
| Comp. Ex. 4 | A2-4 | (2s1)/(2m4)/(2m6)/(1cm1)/(1c1)/(31) = 30.0/9.1/11.1/10.5/29.8/9.5 | 9000 | 1.69 |
| Comp. Ex. 5 | A2-5 | (2s1)/(2m4)/(2m1)/(1cm1)/(1c2)/(31) = 29.2/9.8/9.5/9.2/32.9/9.4 | 8900 | 1.65 |
| Comp. Ex. 6 | A2-6 | (2s1)/(2m5)/(2m2)/(1cm1)/(1s3)/(31) = 30.5/9.5/11.3/9.5/29.6/9.6 | 8500 | 1.85 |

<Production of Resist Composition>

Examples 18 to 34, Comparative Examples 7 to 12

The components shown in Tables 2 and 3 were mixed together and dissolved to obtain each resist composition.

TABLE 2

| | Component (A) | Component (B) | | Component (D) | Component (E) | Component (F) | Component (S) | | | |
|---|---|---|---|---|---|---|---|---|---|---|
| Ex. 18 | (A)-1 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 19 | (A)-2 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 20 | (A)-3 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 21 | (A)-4 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 22 | (A)-5 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 23 | (A)-6 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 24 | (A)-7 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 25 | (A)-8 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 26 | (A)-9 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 27 | (A)-10 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 28 | (A)-11 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 29 | (A)-12 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 30 | (A)-13 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |

TABLE 2-continued

|  | Component (A) | Component (B) | | Component (D) | Component (E) | Component (F) | Component (S) | | | |
|---|---|---|---|---|---|---|---|---|---|---|
| Ex. 31 | (A)-14 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 32 | (A)-15 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 33 | (A)-16 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Ex. 34 | (A)-17 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |

TABLE 3

|  | Component (A) | Component (B) | | Component (D) | Component (E) | Component (F) | Component (S) | | | |
|---|---|---|---|---|---|---|---|---|---|---|
| Comp. Ex. 7 | (A)-18 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Comp. Ex. 8 | (A)-19 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Comp. Ex. 9 | (A)-20 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Comp. Ex. 10 | (A)-21 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Comp. Ex. 11 | (A)-22 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |
| Comp. Ex. 12 | (A)-23 [100] | (B)-1 [4.7] | (B)-2 [7.0] | (D)-1 [2.5] | (E)-1 [0.1] | (F)-1 [1.5] | (S)-1 [100] | (S)-2 [1290] | (S)-3 [860] | (S)-4 [710] |

In Tables 2 and 3, the reference characters indicate the following. The values in brackets [ ] indicate the amount (in terms of parts by weight) of the component added. (A)-1 to (A)-17: the aforementioned polymeric compounds A1-1 to A1-17

(A)-18 to (A)-23: the aforementioned polymeric compounds A2-1 to A2-6

(B)-1: an acid generator consisting of a compound represented by chemical formula (B)-1 shown below (B)-2: an acid generator consisting of a compound represented by chemical formula (B)-2 shown below (D)-1: an acid diffusion control agent of a compound represented by chemical formula (D)-1 below (E)-1: salicylic acid (F)-1: a fluorine-containing polymeric compound represented by chemical formula (F)-1 below. The weight average molecular weight (Mw) and the dispersity (Mw/Mn) in terms of the polystyrene equivalent value measured by gel permeation chromatography (GPC) were 23,100 and 1.78, respectively. The composition of the copolymer (molar ratio of the respective structural units within the structural formula) as determined by $^{13}$C-NMR was l/m=77/23.

(S)-1: γ-butyrolactone (S)-2: propyleneglycol monomethyletheracetate (S)-3: propylene glycol monomethyl ether (S)-4: cyclohexanone

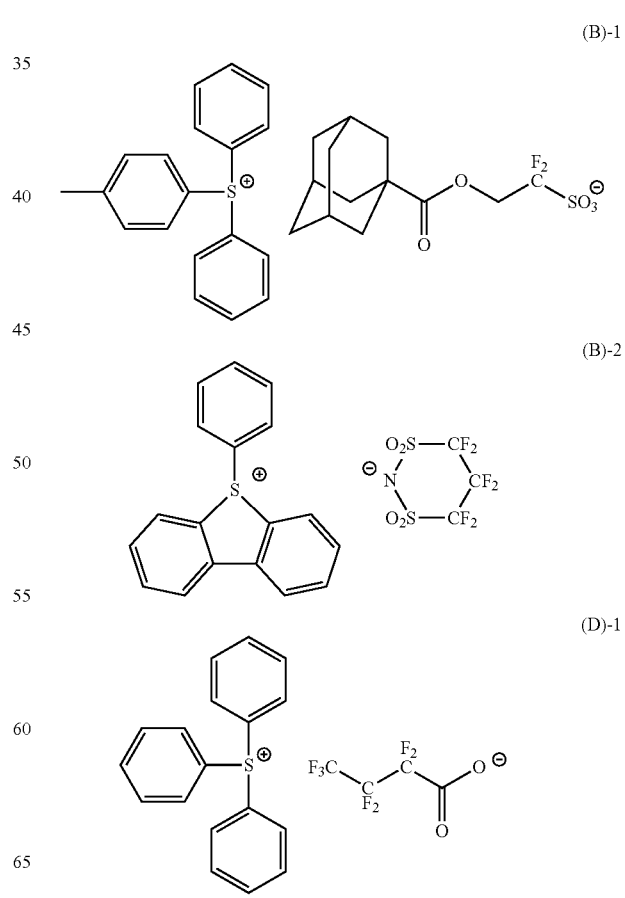

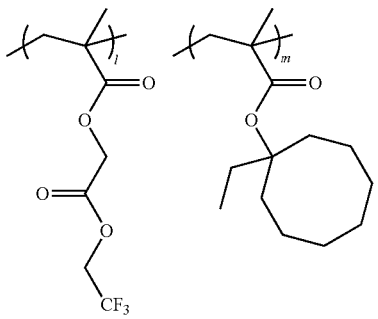

(F)-1

<Formation of Resist Pattern>

On a 12-inch silicon wafer, an organic anti-reflection film with a film thickness of 150 nm was formed. Then, on the organic anti-reflection film, an inorganic anti-reflection film with a film thickness of 35 nm was laminated.

The resist composition of each of the examples was then applied onto the inorganic anti-reflection film using a spinner, and was then prebaked (PAB) and dried on a hotplate at 110° C. for 60 seconds, thus forming a resist film having a film thickness of 100 nm.

Subsequently, the resist film was selectively irradiated with an ArF excimer laser (193 nm) through a photomask (6% half tone), using an immersion lithography ArF exposure apparatus NSR-S609B (manufactured by Nikon Corporation; NA (numerical aperture)=1.07; Annular 0.97/0.78 with Y-Polarization; immersion medium: water). Then, a PES treatment was conducted at a bake temperature (° C.) indicated in Table 4 for 60 seconds.

Next, a solvent development was conducted at 23° C. for 13 seconds using butyl acetate, followed by drying by shaking.

As a result, in each of the examples, a contact hole pattern in which holes having a diameter of 55 nm were equally spaced (pitch: 110 nm) was formed (hereafter, this contact hole pattern is referred to as "CH pattern").

[Evaluation of Optimum Exposure Dose (Eop)]

The optimum exposure dose Eop (mJ/cm$^2$) with which an CH pattern having a target size (hole diameter of 55 nm and pitch of 110 nm) was formed in the "Formation of resist pattern" was determined. The results are indicated under "Eop (mJ/c$^2$)" in Table 4.

[Evaluation of Mask Error Factor (MEEF)]

With the aforementioned optimum exposure dose Eop (mJ/cm$^2$), a CH pattern was formed in the same manner as in <Formation of resist pattern> except that a photomask having a different target size was used. With respect to the target size of the photomask, the hole diameter was varied by 1 nm within the range of 55 nm±5 nm while maintaining the pitch at 110 nm.

The hole diameters (nm) of the formed eleven CH patterns are plotted on the ordinate, and the hole diameters (nm) of the target size are plotted on the abscissa. The gradient of the plotted line was calculated as "MEEF". The results are shown in Table 4.

A MEEF value closer to 1 indicates that a resist pattern faithful to the mask pattern was formed.

[Evaluation of in-plane Uniformity (CDU) of Pattern Size]

With respect to each CH pattern obtained above, 100 holes in the CH pattern were observed from the upper side thereof using a measuring scanning electron microscope (SEM) (product name: S-9380, manufactured by Hitachi High-Technologies Corporation; acceleration voltage: 300V), and the hole diameter (nm) of each hole was measured. From the results, the value of 3 times the standard deviation a (i.e., 3σ) was determined. The results are indicated under "CDU (nm)" in Table 4.

The smaller the thus determined 3σ value is, the higher the level of the dimension uniformity (CD uniformity) of the plurality of holes formed in the resist film.

[Evaluation of Minimum Dimension]

When a resist pattern was formed while varying the optimum exposure dose Eop (mJ/cm$^2$) and the focus, the minimum dimension of the resolved resist pattern was determined using a scanning electron microscope (product name: S-9380, manufactured by Hitachi High-Technologies Corporation; acceleration voltage: 300V). The results are indicated under "MinHole (nm)" in Table 4.

[Evaluation of Dissolution Rate in Developing Solution]

The resist composition of each of the examples was spin-coated (number of revolution: 1,500 rpm) to an 8-inch silicon wafer, and was then baked and dried on a hotplate at 110° C. for 60 seconds, thus forming a resist film having a film thickness of 100 nm.

Next, a solvent development was conducted at 23° C. for 30 seconds using butyl acetate, followed by drying by shaking.

Then, the film thicknesses before and after the solvent developing were measured by Nanospec (manufactured by Nanometrics Incorporated) to thereby determine the dissolution rate of the resist film in the developing solution (organic developing solution), wherein the dissolution rate is a decrease in the film thickness per unit time (unit: nm/s). The results are shown in Table 4.

TABLE 4

| | PEB (° C.) | Eop (mJ/cm$^2$) | MEEF | CDU (nm) | Min Hole (nm) | Dissolution Rate (nm/s) |
|---|---|---|---|---|---|---|
| Ex. 18 | 80 | 23 | 5.21 | 6.23 | 38.4 | 121.7 |
| Ex. 19 | 90 | 24 | 5.34 | 6.25 | 38.2 | 133.7 |
| Ex. 20 | 90 | 25 | 4.50 | 6.82 | 39.8 | 120.2 |
| Ex. 21 | 85 | 25 | 4.29 | 5.91 | 37.2 | 139.4 |
| Ex. 22 | 90 | 26 | 4.90 | 6.43 | 40.4 | 131.7 |
| Ex. 23 | 90 | 24 | 4.55 | 6.03 | 38.9 | 116.0 |
| Ex. 24 | 85 | 24 | 5.31 | 6.73 | 41.9 | 125.4 |
| Ex. 25 | 80 | 17 | 4.93 | 6.95 | 39.2 | 118.8 |
| Ex. 26 | 85 | 22 | 5.21 | 6.18 | 39.6 | 110.6 |
| Ex. 27 | 85 | 30 | 4.48 | 6.11 | 37.6 | 138.0 |
| Ex. 28 | 90 | 23 | 5.07 | 6.15 | 41.1 | 121.1 |
| Ex. 29 | 90 | 25 | 4.82 | 6.22 | 40.5 | 114.5 |
| Ex. 30 | 95 | 22 | 5.30 | 6.95 | 40.7 | 133.2 |
| Ex. 31 | 80 | 23 | 5.32 | 6.01 | 39.9 | 140.1 |
| Ex. 32 | 85 | 27 | 4.56 | 6.22 | 40.3 | 124.6 |
| Ex. 33 | 90 | 25 | 4.33 | 6.40 | 41.2 | 121.1 |
| Ex. 34 | 85 | 21 | 5.03 | 6.05 | 38.6 | 128.8 |
| Comp. Ex. 7 | 80 | 47 | 7.74 | 6.89 | 41.1 | 118.5 |
| Comp. Ex. 8 | 85 | 25 | 8.06 | 6.95 | 42.9 | 112.4 |
| Comp. Ex. 9 | 90 | 22 | 7.67 | 6.26 | 43.8 | 111.3 |
| Comp. Ex. 10 | 85 | 26 | 7.51 | 6.88 | 43.5 | 46.7 |
| Comp. Ex. 11 | 80 | 21 | 6.71 | 8.09 | 46.8 | 45.6 |
| Comp. Ex. 12 | 80 | 24 | 6.47 | 8.26 | 48.7 | 31.9 |

From the results shown in Table 4, it was confirmed that the resist patterns formed using the resist compositions of Examples 18 to 34 exhibited excellent lithography properties, and the shape of the patterns was excellent, as compared to the resist patterns formed using the resist compositions of Comparative Examples 7 to 12 which are out of the scope of the present invention.

While preferred embodiments of the invention have been described and illustrated above, it should be understood that

What is claimed is:

1. A resist composition which generates acid upon exposure and exhibits changed solubility in a developing solution under action of acid, comprising:

a base component (A) which exhibits changed solubility in a developing solution under action of acid, an acid-generator component (B), and an acid diffusion control agent component (D) which traps the acid generated in the resist composition upon exposure, the base component (A) comprising a polymeric compound (A1) comprising a structural unit (a0) represented by general formula (a0-1), formula (a0-1-1), or formula (a0-1-2) shown below:

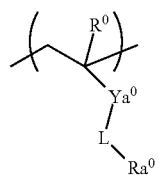

(a0-1)

wherein $R^0$ represents a hydrocarbon group of 1 to 6 carbon atoms which may have a substituent, or a hydrogen atom; $Ya^0$ represents a single bond or a divalent linking group; L represents an ester bond; and $Ra^0$ represents a polycyclic group represented by general formula (a0-r-4):

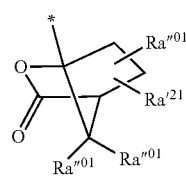

(a0-r-4)

wherein each $Ra''^{01}$ independently represents an alkyl group, an alkoxy group, a halogen atom and a halogenated alkyl group; $Ra'^{21}$ represents a hydrogen atom, an alkyl group, an alkoxy group, a halogen atom, a halogenated alkyl group, a hydroxyl group, $-COOR_0''$, $-OC(=O)R_0''$, a hydroxyalkyl group or a cyano group; $R_0''$ represents a hydrogen atom, an alkyl group, a lactone-containing cyclic group, a carbonate-containing cyclic group or a $-SO_2$-containing cyclic group; and * represents a valence bond,

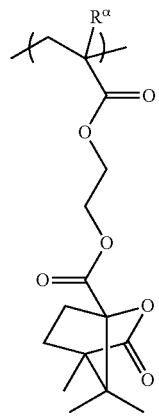

(a0-1-1)

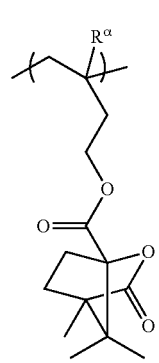

(a0-1-2)

wherein $R^\alpha$ represents a hydrogen atom, a methyl group or a trifluoromethyl group, a structural unit (a1) containing an acid decomposable group that exhibits increased polarity by the action of acid, a polycyclic group-containing structural unit (a2m) other than the structural unit (a0), wherein the structural unit (a2m) is represented by general formula (a2-1) shown below:

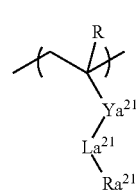

(a2-1)

wherein R represents a hydrogen atom, an alkyl group of 1 to 5 carbon atoms or a halogenated alkyl group of 1 to 5 carbon atoms; $Ya^{21}$ represents a single bond or a divalent linking group;

$La^{21}$ represents $-O-$, $-COO-$ or $-OCO-$, provided that, when $La^{21}$ represents $-O-$, $Ya^{21}$ does not represents $-CO-$; $Ra^{21}$ represents a lactone-containing polycyclic group represented by formula (a2-r-1) or (a2-r-5) shown below, (a2-r-1)

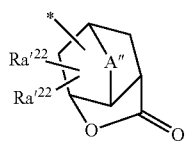

(a2-r-5)

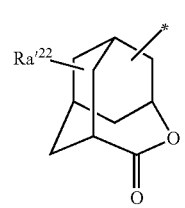

wherein each $Ra'^{22}$ independently represents a hydrogen atom, an alkyl group, an alkoxy group, a halogen atom, a halogenated alkyl group, a hydroxyl group, —COOR$_1$", —OC(=O)R$_1$", a hydroxyalkyl group or a cyano group; R$_1$" represents a hydrogen atom, an alkyl group, a lactone-containing cyclic group, a carbonate-containing cyclic group or a —SO$_2$-containing cyclic group; each A" independently represents an oxygen atom, a sulfur atom, or an alkylene group of 1 to 5 carbon atoms with or without an oxygen atom or a sulfur atom; and m' represents 0 or 1, or an —SO$_2$-containing polycyclic group represented by formula (a5-r-1) or (a5-r-2) shown below:

(a5-r-1)

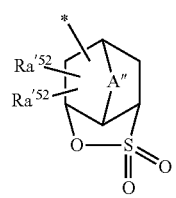

(a5-r-2)

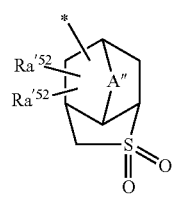

wherein each $Ra'^{52}$ independently represents a hydrogen atom, an alkyl group, an alkoxy group, a halogen atom, a halogenated alkyl group, a hydroxyl group, —COOR$_2$", —OC(=O)R$_2$", a hydroxyalkyl group or a cyano group; R$_2$" represents a hydrogen atom, an alkyl group, a lactone-containing cyclic group, a carbonate-containing cyclic group or a —SO$_2$-containing cyclic group; A" represents an oxygen atom, a sulfur atom, or an alkylene group of 1 to 5 carbon atoms with or without an oxygen atom or a sulfur atom, and a structural unit (a3) containing a polar group-containing aliphatic hydrocarbon group, wherein the amounts of the structural unit (a0), structural unit (a1), structural unit (a2m) and structural unit (a3) based on the combined total of all structural units constituting the component (A1) is 5 to 30 mol %, 30 to 50 mol %, 5 to 40 mol % and 3 to 30 mol %, respectively.

2. The resist composition according to claim 1, wherein $Ya^0$ is —C(=O)—O—$Y^{21}$—, wherein $Y^{21}$ represents a unsubstituted or substituted divalent hydrocarbon group.

3. A method of forming a resist pattern, comprising: forming a resist film on a substrate using a resist composition of claim 1; conducting exposure of said resist film; and developing said resist film to form a resist pattern.

4. A polymeric compound, comprising a structural unit (a0) represented by general formula (a0-1), formula (a0-1-1), or formula (a0-1-2) shown below (a0-1)

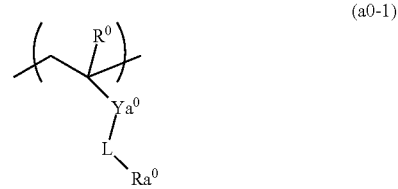

wherein $R^0$ represents a hydrocarbon group of 1 to 6 carbon atoms which may have a substituent, or a hydrogen atom; $Ya^0$ represents a single bond or a divalent linking group; L represents an ester bond; and $Ra^0$ represents a polycyclic group represented by general formula (a0-r-4):

(a0-r-4)

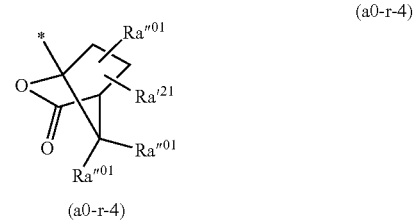

(a0-r-4)

wherein each $Ra''^{01}$ independently represents an alkyl group, an alkoxy group, a halogen atom and a halogenated alkyl group; $Ra'^{21}$ represents a hydrogen atom, an alkyl group, an alkoxy group, a halogen atom, a halogenated alkyl group, a hydroxyl group, —COOR$_0$", —OC(=O)R$_0$", a hydroxyalkyl group or a cyano group; R$_0$" represents a hydrogen atom, an alkyl group, a lactone-containing cyclic group, a carbonate-containing cyclic group or a —SO$_2$-containing cyclic group; and * represents a valence bond, (a0-1-1)

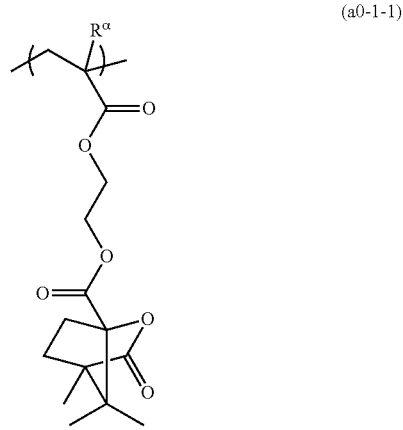

(a0-1-2)

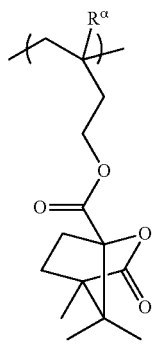

wherein $R^\alpha$ represents a hydrogen atom, a methyl group or a trifluoromethyl group, a structural unit (a1) containing an acid decomposable group that exhibits increased polarity by the action of acid, a polycyclic group-containing structural unit (a2m) other than the structural unit (a0), wherein the structural unit (a2m) is represented by general formula (a2-1) shown below:

(a2-1)

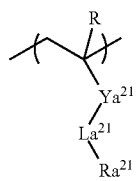

wherein R represents a hydrogen atom, an alkyl group of 1 to 5 carbon atoms or a halogenated alkyl group of 1 to 5 carbon atoms; $Ya^{21}$ represents a single bond or a divalent linking group; $La^{21}$ represents —O—, —COO— or —OCO—, provided that, when $La^{21}$ represents —O—, $Ya^{21}$ does not represents —CO—; $Ra^{21}$ represents a lactone-containing polycyclic group represented by formula (a2-r-1) or (a2-r-5) shown below, (a2-r-1)

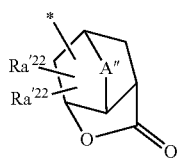

(a2-r-5)

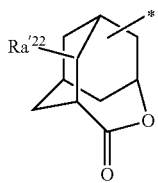

wherein each $Ra'^{22}$ independently represents a hydrogen atom, an alkyl group, an alkoxy group, a halogen atom, a halogenated alkyl group, a hydroxyl group, —$COOR_1''$, —$OC(=O)R_1''$, a hydroxyalkyl group or a cyano group; $R_1''$ represents a hydrogen atom, an alkyl group, a lactone-containing cyclic group, a carbonate-containing cyclic group or a —$SO_2$-containing cyclic group; each A″ independently represents an oxygen atom, a sulfur atom, or an alkylene group of 1 to 5 carbon atoms with or without an oxygen atom or a sulfur atom; and m′ represents 0 or 1, or an —$SO_2$-containing polycyclic group represented by formula (a5-r-1) or (a5-r-2) shown below:

(a5-r-1)

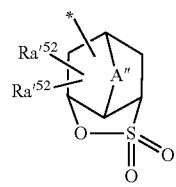

(a5-r-2)

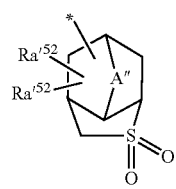

wherein each $Ra'^{52}$ independently represents a hydrogen atom, an alkyl group, an alkoxy group, a halogen atom, a halogenated alkyl group, a hydroxyl group, —$COOR_2''$, —$OC(=O)R_2''$, a hydroxyalkyl group or a cyano group; $R_2''$ represents a hydrogen atom, an alkyl group, a lactone-containing cyclic group, a carbonate-containing cyclic group or a —$SO_2$-containing cyclic group; A″ represents an oxygen atom, a sulfur atom, or an alkylene group of 1 to 5 carbon atoms with or without an oxygen atom or a sulfur atom, and a structural unit (a3) containing a polar group-containing aliphatic hydrocarbon group, wherein the amounts of the structural unit (a0), structural unit (a1), structural unit (a2m) and structural unit (a3) based on the combined total of all structural units constituting the component (A1) is 5 to 30 mol %, 30 to 50 mol %, 5 to 40 mol % and 3 to 30 mol %, respectively.

5. The polymeric compound according to claim 4, wherein $Ya^0$ is —C(=O)—O—$Y^{21}$—, wherein $Y^{21}$ represents a unsubstituted or substituted divalent hydrocarbon group.

* * * * *